United States Patent
Gadh et al.

(10) Patent No.: US 6,629,065 B1
(45) Date of Patent: Sep. 30, 2003

(54) METHODS AND APPARATA FOR RAPID COMPUTER-AIDED DESIGN OF OBJECTS IN VIRTUAL REALITY AND OTHER ENVIRONMENTS

(75) Inventors: Rajit Gadh, Madison, WI (US); Tushar H. Dani, Ypsilanti, MI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/409,569

(22) Filed: Sep. 30, 1999

Related U.S. Application Data

(60) Provisional application No. 60/102,537, filed on Sep. 30, 1998.

(51) Int. Cl.$^7$ .............................................. G06E 17/50
(52) U.S. Cl. ........................... 703/1; 345/420; 345/664; 345/679
(58) Field of Search ............................. 703/1; 345/420, 345/664, 679

(56) References Cited

U.S. PATENT DOCUMENTS

| | | | |
|---|---|---|---|
| 5,177,689 A | | 1/1993 | Kinasi et al. |
| 5,504,854 A | | 4/1996 | Yamashita |
| 5,659,493 A | | 8/1997 | Kindena et al. |
| 5,742,291 A | | 4/1998 | Palm |
| 5,758,122 A | | 5/1998 | Corda et al. |
| 5,923,573 A | * | 7/1999 | Hatanaka .................... 364/378 |
| RE36,602 E | * | 3/2000 | Sebastian et al. ............. 700/97 |

OTHER PUBLICATIONS

Danial T. Banach, Mechanical Desktop 2.0, International Thompson, Copyright 1998, pp. 82–107 and 214–257.*
Danial T. Banach, Mechanical Desktop 2.0, International Thompson, Copyright 1998.*
"Solid Modeling" by Vadim Shapiro, Technical Report SAL 2001–2, Oct. 2001.*
AutoCAD and its applications Advanced Release 14, by Terence M. Shumaker et al., Autodesk Press, ISBN: 1–56637–414–6, May, 1998, pp. 219, 220, and 514.*
Mechanical Desktop 2.0 Applying Designer and Assembly Modules, by Daniel T. Banach, Autodesk Press, ISBN: 0–7668–0068–7, Jun. 1998, pp. xv, 3, 8, 186, and 224.*

(List continued on next page.)

*Primary Examiner*—Kevin J. Teska
*Assistant Examiner*—Ed Garcia-Otero
(74) *Attorney, Agent, or Firm*—Craig A. Fieschko, Esq.; DeWitt Ross & Stevens S.C.

(57) ABSTRACT

Apparata and methods for rapid design of objects/shapes in Computer-Aided Design (CAD) tools and in Virtual Reality (VR) environments are described. The underlying geometric representation of the objects within the design tool is optimized so that design activities such as modeling, editing, rendering, etc. can be processed extremely rapidly, thereby enhancing the response time of the design tool. The representation is preferably provided in two parts, which may be referred to as a "design intent model" and a "shape model". The design intent model is a higher-level representation wherein elements are arranged in hierarchical parent-child relationships which record the elements' assembly sequence. The shape model is a lower-level representation storing more detailed information about the elements and their relationships. During editing of the design, the user acts on the design intent model, and the design intent model is mapped to the shape design model so that it is updated to reflect the changes therein. The design intent model is in many cases sufficient by itself to allow basic editing of the model and rendering of the edited model, but where editing operations grow sufficiently complex that the design intent model lacks sufficient information to allow the operation to be performed, the shape model can be relied upon for the information necessary to complete the operation.

15 Claims, 42 Drawing Sheets

OTHER PUBLICATIONS

Trika and Banerjee and Kashyap, "Virtual Reality Interface for Feature Based Computer Aided Design Systems", 1997.

T.H. Dani and R. Gadh, "Virtual Reality: A New Tool for the Mechanical Engineer," *Mechanical Engineers Handbook,* Myer Kutz, (Ed.), John Wiley & Sons, 1997.

G. Wyvill, T.L. Kunii, "A functional model for constructve solid geometry", *The Visual Computer,* v. 1, 1985, pp. 3–14.

J.B. Allan, B. Wyvill, I.H. Witten, "A Methodology for Direct Manipulation of Polygon Meshes," New Advances in Computer Graphics: *Proceedings of CD International '89,* pp. 451–469.

R.A. Bolt, "Put That There: Voice and gesture at the graphics interface," *Computer Graphics,* vol. 14, No. 2, pp. 262, 1980.

C.C. Chu, T.H. Dani and R. Gadh, "Multimodal interface for a Virtual Reality Based CAD System", *Proc. 1997 IEEE Intl. Conf. on Robotics & Automation,* vol. 2, pp. 1329–1334.

T.H. Dani, R. Gadh, "Creation of Concept Shape Designs via a Virtual Reality Interface," *CAD Journal,* Elsevier Publications, 29(7), 1997.

D. Dietz, "Real Engineering in a Virtual World," *Mechanical iEngineering Magazine,* vol. 117, No. 7, Jul., 1995, pp. 78–85.

M. Fa, T. Fernando; and Dew, P.M. 1993. "Interactive Constraint–based Solid Modeling using Allowable Motion", *Proc. of the 2$^{nd}$ Symposium on Solid Modeling and Applications,* 242–252.

M. Figueiredo, K. Bohm, J. Teixeira, "Advanced Interaction Techniques in virtual Environments," *Computers and Graphics,* v. 17, No. 6, pp. 655–661, 1991.

E. Herranz, R.A. Bolt, "Two–Handed Gesture In Multi–Modal Natural Dialogue", *Proceedings of the ACM Symposium on User Interface Software Technology,* Nov. 15–18, 1992, pp. 7–14.

P.M. Hubbard, "Approximating Polyhedra with Spheres for Time–Critical Collision Detection," *ACM Transactions on Graphics,* v. 15, No. 3, Jul. 1996, pp. 179–201.

D.L. Jenkins, R.R. Martin, the importance of free–hand sketching in conceptual design: Automatic Sketch input,: *Process of the 1993 ASME Design Technical Conference,* Albuquerque, NM, Sep. 19–22, 1993, pp. 115–128.

K. Lee, D.C. Gossard, "A hierarchical data structure for representing assemblies: part 1," *CAD Journal,* v. 17, No. 1, Jan./Feb. 1985.

J. Liang, "JDCAD: A Highly Interactive 3D Modeling System," *Computer Graphics,* v. 18, No. 4, 1994, pp. 499–506.

D.P. Mapes, J.M. Mosehll, "A two–handed Inerface for Object Manipulation in a Virtual Environment," *Presence,* vol. 4, No. 4, Fall 1995, pp. 403–416.

A.G. Requicha, "Representation for Rigid Solids: Theory Methods & Systems,", *Computer Survey,* v12, No. 4, Dec. 1990, pp 438–464.

E. Sachs, A. Roberts, D. Stoops, "3–Draw: A Tool for Designing 3D Shapes," *IEEE Computer Graphics & Applications,* vol. 11, No. 11, pp. 18–26, 1991.

A. Stork, M. Maidhof, "Efficient and Precise Solid Modeling using a 3D Input Device," *Proc. of the Fourth Symposium on Solid Modeling & Applications,* Atlanta, GA, May 14–16, 1997, pp. 181–194.

Y.A. Tijerno, K. Mochizuiki, F. Kishino, "Interactive 3–D Computer Graphics Driven Through Verbal Instructions: Previous and Current Activities at ATR," *Computer & Graphics,* vol. 18, No. 5, pp. 621–631, 1994.

D. Weimer, S.K. Ganapathy, "A Synthetic Visual Environment with Hand Gesture and Voice Input," *Proceedings of the ACM Conference on Computer Human Interfaces,* May 1989, pp. 235–240.

P.R. Wilson, M.J. Pratt, "A taxonomy of features for solid modeling," *Geometric Modeling for CAD Applications,* M.J. Wozny, H.W. McLaughlin, J.L. Encarnacao (Eds.), Elsevier Science Publishers, 1988, pp. 125–137.

T. Yoshimura, Y. Nakamura, M. Suguira, "3D Direct Manipulation Interface: development of Zashiki–Warashi System," *Computers & Graphics,* vol. 18, No. 2, pp. 201–207, 1992.

P. Zhigeng, Z. Mingmin, Z. Wenting, S. Jiaoying, "Time–Critical Computing in Virtual Environments," *Proc. of the 4$^{th}$ International Conference on Computer–Aided Design and Computer Graphics,* Oct. 23–25, 1995, Wuhan, China, pp. 712–717.

* cited by examiner

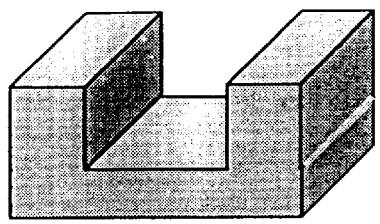
Desired shape
FIG. 17
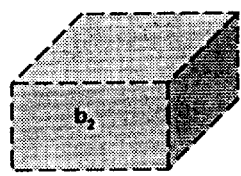
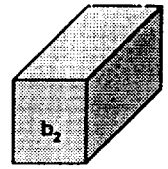
Negative addition of $b_2$
Positive addition of $b_2$ and $b_3$
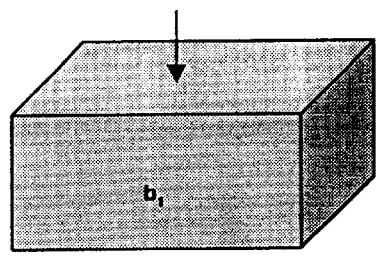
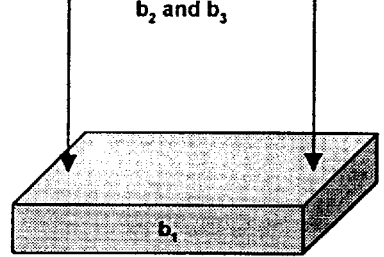
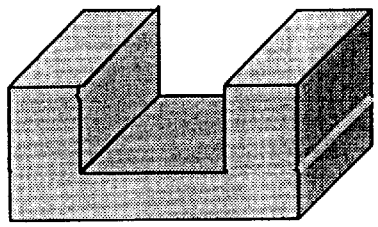
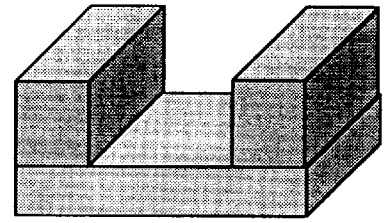
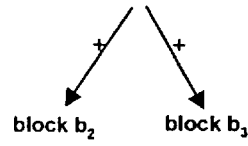
FIG. 18
FIG. 19

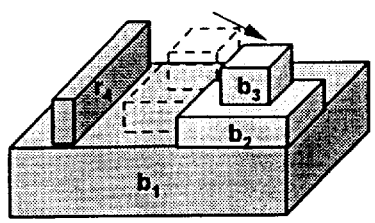 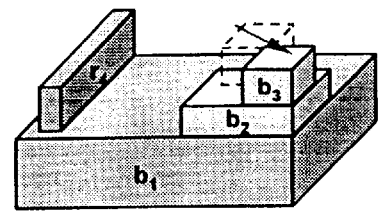
FIG. 24A          FIG. 24B
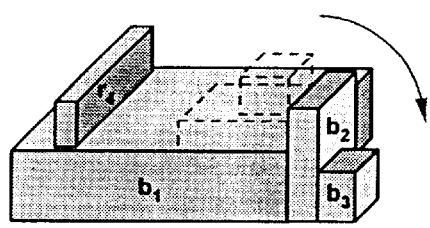 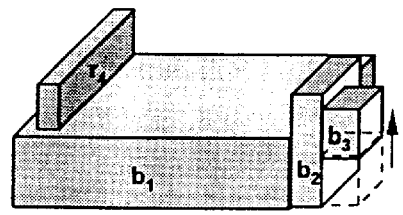
FIG. 24C          FIG. 24D

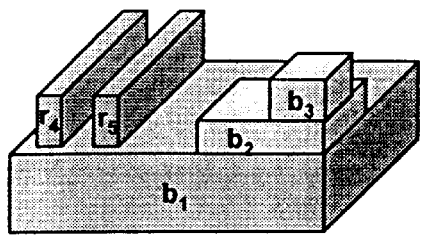
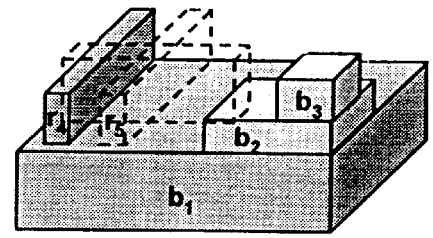
FIG. 26A  FIG. 26B
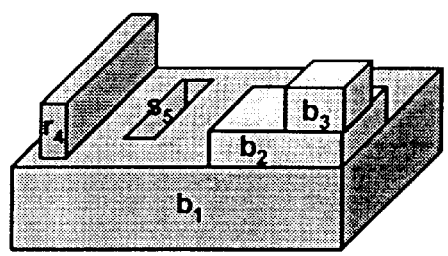
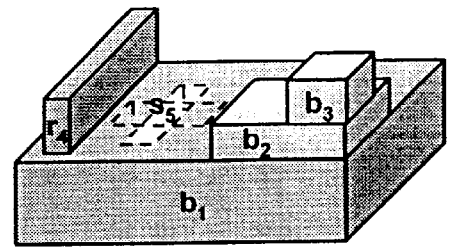
FIG. 26C  FIG. 26D

FIG. 40A        FIG. 40B

FIG. 40C        FIG. 40D a rapid "CAD sketch" of the object. In this case, while the designer wishes to take a fast, freewheeling approach to setting forth his or her design concepts, the CAD system's requirements for specificity demand that the designer slow down and provide explicit instructions for all aspects of the object being designed. This informational and time burden increases with the complexity of the CAD system and its human/CAD interface; for example, while modern graphical user interfaces make design of geometric models acceptably rapid in many 2D CAD systems, the ab initio design of objects in 3D CAD systems is still time-consuming and frustrating. The burden grows particularly acute for 3D CAD systems where the human/CAD interface is complex—for example, in Virtual Reality (VR) interfaces wherein the designer works within a Virtual Environment (VE)—owing to the increased processing requirements of such systems.

METHODS AND APPARATA FOR RAPID COMPUTER-AIDED DESIGN OF OBJECTS IN VIRTUAL REALITY AND OTHER ENVIRONMENTS

CROSS-REFERENCE TO RELATED APPLICATIONS

This application claims priority under 35 USC §119(e) to U.S. Provisional Application No. 60/102,537 filed Sep. 30, 1998, the entirety of which is incorporated by reference herein.

STATEMENT REGARDING FEDERALLY FUNDED RESEARCH

This invention was made with United States government support awarded by the following agencies:

National Science Foundation Grant No.: DMI 9501760
National Science Foundation Grant No.: DMI 9622665
The United States has certain rights in this invention.

FIELD OF THE INVENTION

This invention relates generally to the early conceptual design of objects using computer-aided design (CAD) systems. More particularly, the invention relates to CAD systems, and methods usable in CAD systems, which allow extremely rapid creation of "rough" or conceptual geometric models of objects without having to precisely describe the specific dimensions, locations, and other characteristics of their geometric subcomponents. The invention further relates to CAD systems, and methods usable in CAD systems, which allow creation and editing of geometric models in such a manner that the created/edited model is output very rapidly after the designer's input is provided (i.e., the final model is produced almost instantaneously after input), so as to enhance the ability to interactively create and edit designs.

BACKGROUND OF THE INVENTION

The ability to design (i.e., create, edit, visualize, and/or manipulate) two- and three-dimensional models of objects is a fundamental activity in diverse fields such as engineering, architecture, etc. From an engineering perspective, this process is especially important during the conceptual design stage of an object when the final geometric details of the object are unknown. See, e.g., D. L. Jenkins, R. R. Martin, "The Importance of Free-Hand Sketching in Conceptual Design: Automatic Sketch Input," *Proc. of the* 1993 *ASME Design Technical Conference*, Albuquerque, N.Mex., Sep. 19–22, 1993, pp. 115–128. Typical solutions include making use of two-dimensional (2D) sketches to visualize concepts under discussion, or using a Computer-Aided Design (CAD) system to create a prototypical geometric model. Regarding 2D sketching, this suffers from the drawback that it does not readily allow editing and manipulation of the model (the model must be redrawn), and additionally visualization of the 2D-modeled object in three dimensions is difficult. As for CAD, it is a very useful tool, but it is complex and frequently requires detailed user input in order to generate a desired geometric model. For example, when generating a geometric model in conventional CAD systems, significant details must be provided to the CAD system, such as the specific shapes, dimensions, and locations of the geometric subcomponents of the model. Clearly, when working on a final model of an object, the need to enter this degree of detail might be expected if the designer is to obtain the desired amount of precision in the completed model. However, in the early stages of design where the parameters of the object being designed are conceptual and indefinite rather than certain, this need for high human/CAD system interaction is stifling and greatly hinders creativity in the design process. This is especially true where the immediate goal of the designer is to merely capture the rough shape of an object in the CAD system—in essence, to make As a result of the above-noted problems, researchers have attempted to devise methods and apparata which simplify the input process to CAD systems so that a user is not constrained by complex input processes, and is freer to input conceptual designs in a more rapid fashion. As an example, U.S. Pat. No. 5,504,854 to Yamashita illustrates an "Apparatus and Method for Inputting Cell Shape and Position and Inter-Cell Calculation." This invention creates a series of meta-functions that allow an operator to specify specific shapes and shading using an input device, such as a keyboard or a mouse. When shapes are to be copied or moved, these meta-functions are invoked, thereby reducing the user's burden in specifying the details associated with the shapes to be moved.

To U.S. Pat. No. 5,742,291 to Palm was issued for a "Method and Apparatus for Creation of Three-Dimensional Wire Frames." This invention addresses rapid creation of representations of three dimensional objects using generically-shaped wire frames which belong to classes of objects. These generic wire frames can then be modified to correspond to a specific shape desired by a user. This avoids the user's need to create individual shapes for subsequent manipulation.

U.S. Pat. No. 5,758,122, to Corda et al. was issued for an "Immersive Visual Programming System." While this invention is directed to the field of software programming/development, it is nevertheless of interest because it allows the user to select from a set of prefabricated virtual components, thus saving the user the time and effort of creating individual components.

U.S. Pat. No. 5,177,689 to Kinasi et al. was issued for a "CAD/CAM Apparatus for Enhancing Operator Entry of Machining Attributes and Geometric Shapes." This invention relates to the use of simplified forms of input to create numerical control data for machining shapes so that the designer does not need to learn complicated data entry instructions.

U.S. Pat. No. 5,659,493 was issued to Kindena et al. for a "Virtual Machining Techniques for Modifying Computer Models of Parts." This invention represents three-dimensional objects by a high density data point model. A virtual tool is provided to the user, who manipulates the tool on the surface of the displayed object to modify its shape. Thus, the object can be modified without having to input specific equations or data points associated with the desired modifications.

The above inventions generally use standard man-machine interfaces (e.g., mouse, keyboard, 2D video monitor output) to create designs. However, in more recent years, there has been greater interest in the use of more natural forms of input (such as hand motion input or voice command input), and in Virtual Environments (VE) wherein the user is "immersed" in a 3D design environment, owing to the tremendous potential advantages offered by their use. See, e.g., D. Dietz, "Real Engineering in a Virtual World," *Mechanical Engineering Magazine*, vol. 117, no.7, July, 1995, pp. 78–85; T. H. Dani and R. Gadh, "Virtual Reality: A New Tool for the Mechanical Engineer," *Mechanical Engineers Handbook*, Myer Kutz, (Ed.), John Wiley & Sons, 1997. As an example, various research projects conducted by the inventors named in this document have investigated inputting shapes into a computer system in a physically intuitive way, using voice, hand motions, and gestures in fashions similar to the way in which one person would communicate with another. By use of position gloves and the like, a CAD system could allow a user to "grab" a design and manipulate it as if holding it in his or her hand, thus providing a more natural and intuitive interaction with the objects that are being designed. This increases design speed and reduces the need to learn complex operating instructions prior to initiating the design process.

Other prior research has also been performed on "natural" forms of user input such as voice commands and hand gestures. See, e.g., D. Weimer, S. K. Ganapathy, "A Synthetic Visual Environment with Hand Gesture and Voice Input", *Proceedings of the ACM Conference on Computer Human Interfaces*, May 1989, pp. 235–240; R. A. Bolt, "Put That There: Voice and Gesture at the Graphics Interface," *Computer Graphics*, vol. 14, no. 2, pp. 262, 1980. Herranz et al. have developed an interface that utilize two-handed, glove-based input coupled with voice and gaze information to determine the user's intent for different tasks (see, e.g., E. Herranz, R. A. Bolt, "Two-Handed Gesture In Multi-Modal Natural Dialogue", *Proceedings of the ACM Symposium on User Interface Software Technology*, Nov. 15–18, 1992, pp. 7–14). Another system that focuses mainly on hand gestures for interaction is the PolyShop environment (D. P. Mapes, J. M. Moshell, "A Two-handed Interface for Object Manipulation in a Virtual Environment," *Presence*, vol. 4, no. 4, Fall 1995, pp. 403–416). It allows usage of both hands for various tasks in a VE. Other research has focused on voice and gesture based systems for selection of entities in a geographical map based on spatial relationships; for example, "select the house beside that road," etc. (Y. A. Tijerno, K. Mochizuiki, F. Kishino, "Interactive 3-D Computer Graphics Driven Through Verbal Instructions: Previous and Current Activities at ATR," *Computer & Graphics*, vol. 18, no.5, pp.621–631, 1994.) With the exception of the research reported by Weimer et al., the foregoing systems were not specifically intended for CAD, but are reported here for completeness.

Other research has addressed input devices suitable for use in VE environments. As an example, VE pointers/wands have been developed which allow users to point towards displayed objects to select or otherwise manipulate them. Notable among these are the "BeamCursor" (see, e.g., T. Yoshimura, Y. Nakamura, M. Sugiura, "3D Direct Manipulation Interface: Development of Zashiki-Warashu System," *Computers & Graphics*, vol. 18, no. 2, pp. 201–207, 1992) and the "LaserGun" (see, e.g., J. Liang, "JDCAD: A Highly Interactive 3D Modeling System," *Computer Graphics*, v. 18, no. 4, 1994, pp. 499–506).

Other research has extended beyond modes of user input and has specifically addressed the use of VE in CAD systems. Some researchers have approached the use of VE in CAD systems by creating models using conventional CAD systems and then "importing" the models (after an appropriate translation process) into a VE for display. This approach faces several difficulties:

(1) The model must still be first defined in a CAD system using precise shapes, dimensions, locations, etc. (which, as noted above, are typically not well-defined at the concept stage). Thus, the aforementioned difficulties with specificity of input and time burdens are still present.

(2) During the process of translation, topological relationships between entities in the model may be lost. As a consequence, editing the model requires a return to the CAD environment so that the desired changes can be made, and the model must then be "re-imported" into the VE for verification.

Examples of such approaches for visualization are the Interactive Visualizer developed at the Graphics, Visualization & Usability Center of the Georgia Institute of Technology (Atlanta, Ga., USA, WWW URL http://www. cc. gatech. edu/gvu/virtual/index_main. html, and the VENUS prototyping project being developed at CERN, the European Center for Nuclear Research (details available at WWW URL: http://sgvenus. cern. ch/VENUS/vr_project. html).

A more useful application of Virtual Environments (VE) that goes beyond these "visualization only" systems is the interactive design of shapes in a VE. Such a system gives the engineer a better design tool that is especially useful during the conceptual design stage. As an example, the aforementioned research by Weimer et al. describes a CAD interface using a VPL DataGlove™ (for capturing hand gestures) and spoken commands (with a vocabulary of about 40 phrases) for creating CAD models. Modeling tools are provided for both free-form shape design and parametric shape design (i.e., design using predefined shape features). The parametric design tools allow object/feature selection and manipulation, an additionally incorporate geometric constraints for object placement. The free-form design tools allow "sculpting" of surfaces that are represented as uniform b-splines and which can be reshaped by perturbing the control points.

Another system is 3-Draw which allows the design of wire-frame like sketches of 3D free-form curve-based geometry (see, e.g., E. Sachs, A. Roberts, D. Stoops, "3-Draw: A Tool for Designing 3D Shapes," *IEEE Computer Graphics & Applications*, Vol. 11, no. 11, pp. 18–26, 1991). In this system, the designer uses a pair of 6DOF (six degree-of-freedom) tracking devices (one in each hand). One hand is used to hold the object being sketched, and the other hand holds a stylus which serves as the 3D sketching tool. Curves are represented by first-degree cardinal splines interpolated from points in space obtained via the Polhemus™ tracker. The developers of this system also describe user interaction methods for curve selection, creation and editing. Design tools for curve-shaping included methods based on constrained curve manipulation and methods based on direct manipulation of control points.

While the previous two CAD systems were primarily directed towards creating free-form surface and curve geometry respectively, a system specifically oriented towards the design of engineering components is the aforementioned

*JDCAD* system of Liang (for which a citation was provided earlier). This system aims to provide an intuitive, easy-to-use modeling environment for early stage design. Its researchers describe interaction techniques for navigation, object selection and editing based on 3D menus and icons which are selected via a 6DOF device. The modeling operations are based on creation of primitives via 3D rubber-banding techniques and the use of CSG (Constructive Solid Geometry) operations to create more complex geometry. Region-based reshaping, which involves changing primitive dimensions via "handles" situated thereon, is used for editing. Rotational and translational constraints combined with a 3D snapping feature act as design aids during model creation.

Trika, Banedee and Kashyap ("Virtual Reality Interfaces for Feature-Based Computer-Aided Design Systems", Computer-Aided Design, vol. 29, no. 8, 1997, pp. 565–574) investigated use of a wand interface (a three dimensional mouse) and a speech input system to simplify the input of design features. This research addressed the issue of the complexity of feature-based and constraint-based design within CAD systems. Feature-based design starts with simple shapes which are then modified by attaching features, such as holes, slots, etc. to modify the simple shapes into the one desired. Constraint-based design involves specifying existing features and the relationship of those features to one another.

Fa et al. propose an approach to 3D design using 3D input devices such as Spaceball™ and Dataglove™ input devices (see, e.g., M. Fa, T. Fernando, and Dew, P. M., "Interactive Constraint-based Solid Modeling using Allowable Motion", *Proc. of the 2$^{nd}$ Symposium on Solid Modeling and Applications*, 1993, pp.242–252). Although the proposed system is not strictly a VR-CAD environment, the system integrates so-called direct manipulation techniques with a constraint-based assembly design environment. Constraints are automatically recognized based on user interaction with the 3D devices and are used to control the allowable motion of the individual components in a design assembly. A CSG (Constructive Solid Geometry) graph structure is used to store the design, and each component therein is represented by its boundary representation.

The foregoing systems illustrate that current approaches for VR-based CAD have essentially been based on adapting existing CAD user interfaces within VEs. While this approach has the advantage of being straightforward, it (1) does not exploit the complete potential of VEs, and (2) does not adequately address the development of design tools and representations appropriate for the VR environment. A careful analysis of the differences between conventional CAD and VR-CAD systems shows that their requirements are quite different. In large part, this arises from the differences between their user interfaces, and therefore it is helpful to briefly review these interfaces in greater detail.

Most conventional CAD systems are utilize Windows-Icons-Menu-Pointer (WIMP)-based interfaces to an underlying geometric modeler (FIG. 1). In their most typical form, these are text- and mouse-based interfaces, although in some cases 6DOF input devices such as a Spaceballf and dials may also be used. The designer uses these devices to manipulate designs via design editing tools, e.g., by "sketching" on 2D planes, creating extrusions, etc. These devices are integrated within the CAD environment via an "event driven" approach whereby the designer performs a certain action, and the system responds by performing the necessary computations and displaying the results on the graphical monitor. Although it is desirable that the geometric modeler compute the results and display the image as fast as possible, i.e., with minimum delay, the lack of real-time response is not critical in most conventional CAD applications.

However, while the lack of real-time response is not critical in a conventional CAD system, such response is of great importance in a VR-CAD system. Quite simply, if the design does not respond to the user's inputs almost immediately upon their occurrence, the interface is no longer a "true" VE environment: it does not simulate real-world actions and experiences, and since the motion, voice, etc. no longer have a logical/intuitive link to their outputs, they can be more hindering than helpful. Other differences between CAD and VR-CAD systems center on the multimodality, immersivity, and interactivity of a VE-based application (see, e.g., N. I. Durlach, and A. S. Mavor (Eds), "Part I: Basic Concepts and Terminology," *Virtual Reality: Scientific and Technological Challenges*, National Academy Press, Washington D.C., 1995). Each of these concepts will now be briefly discussed.

Multimodality involves providing more than one way for the designer to interact with the model, for example, allowing the user to select, grasp and move entities by both keyboard text input and motion input via a motion sensor. Given that such multiple modalities are available to the designer in a VR-CAD system, it is important to provide design-editing tools that optimize these capabilities both individually and collectively (i.e., both taken alone and when interacting) for shape design.

Immersion is the ability of a VE to impart the designer with the feeling of "presence" in the environment being simulated. An implicit assumption is that the better the immersion (the more natural the behavior of the VE), the more productive the designer would be in accomplishing design objectives. Exemplary immersion methods include providing stereoscopic (3D) images and integrating other feedback methods (such as auditory feedback) in the VR-CAD environment.

Interactivity is primarily involved with the aforementioned need for real-time response; as noted, a key difference between CAD and VR-CAD systems is that interactivity assumes great importance in a VR-based system. In the context of a VE, two measures for interactivity are (1) the frame-rate, and (2) the delay. (See, e.g., N. I. Durlach and A. S. Mavor (Eds), "Part II: Computer Hardware & Software for the Generation of a VE," *Virtual Reality: Scientific and Technological Challenges*, National Academy Press, Washington D.C., 1995). The frame-rate refers to the number of graphical scene updates per second, whereas the delay is the lag perceived by the designer between performing a certain action in the VE and perceiving a response on the graphical display. A minimum rate of 10 frames/second is considered acceptable for a VE application, and a 0.1 second delay is identified as being the maximum allowable in a VE. (See, e.g., P. Zhigeng, Z. Mingmin, Z. Wenting, S. Jiaoying, "Time-Critical Computing in Virtual Environments," *Proc. of the 4$^{th}$ International Conference on Computer-Aided Design and Computer Graphics*, Oct. 23–25, 1995, Wuhan, China, pp. 712–717.) Both the frame-rate and delay can have significant impact on the interactivity, and hence the effectiveness, of a VE system. The aim in any VE system is to minimize the delay and maximize the frame-rate; however, this requires significant computational resources that remain largely unavailable today.

In large part, difficulties with interactivity arise from the various computations that must be performed in a VR-CAD application, such as intersection detection, rendering, and modeling. Intersection detection is required to detect interference of the user's hand with a virtual object, or collision between two virtual objects, and is important when performing selection of objects and then manipulation/editing. Additionally, intersection detection is used to provide feedback to the user to indicate that contact has been made with an object, as by visual feedback (highlighting) or auditory feedback.

Rendering involves creation of the display of the VE, including any geometry created by the designer, as well as a graphical representation of the user in the VE (e.g., a display of the designer's hand). Current research in rendering has focused on achieving acceptable performance by trading off the accuracy of the various software algorithms used (whether they be for intersection detection, rendering, or modeling) for speed. An example of speeding up graphical rendering by reducing the level of detail of images displayed is given in Zhigeng et al. (P. Zhigeng, Z. Mingmin, Z. Wenting, S. Jiaoying, "Time-Critical Computing in Virtual Environments," *Proc. of the 4th International Conference on Computer-Aided Design and Computer Graphics*, Oct. 23–25, 1995, Wuhan, China, pp. 712–717). Another example is provided by Hubbard, wherein objects in the VE are modeled as spheres for approximate collision detection (P. M. Hubbard, "Approximating Polyhedra with Spheres for Time-Critical Collision Detection," *ACM Transactions on Graphics*, v. 15, no. 3, Jul. 1996, pp. 179–201). Representing the underlying complex polyhedral geometry of the objects by such spheres enables intersection detection to be completed in a computationally efficient manner.

Modeling relates to the way in which the geometric model is represented and processed within the VR-CAD application. While significant research has been reported on intersection detection and rendering methods for VE applications, modeling has not been researched as extensively. Since the modeling techniques used will have a significant effect on the performance of a VR-CAD system, it will be helpful to briefly review preexisting research on modeling.

Most basic geometric modeling operations in CAD systems utilize a Constructive Solid Geometry (CSG) approach, wherein objects are modeled by primitive geometric elements combined via basic geometric operations such as union, intersection, and negation operations. Since some of these operations are computationally burdensome, some prior researchers have reported attempts to enhance speed by use of specialized or modified operations. As an example, Requicha describes a "restricted CSG" approach in which the only allowable operation is a "glue" operator that can be applied to solids with disjoint interiors. (See, e.g., A. G. Requicha, "Representation for Rigid Solids: Theory Methods & Systems", Computer Survey, v12, no.4, Dec. 1990, pp 438–464.) Wyvill and Samet describe an octree-based representation (a "DAG-CSG Tree") in which objects are modeled in geometric space as a combination (via addition and subtraction) of previously defined primitive objects; in conceptual space, a Directed Acyclic Graph (DAG) is used to represent the solids, with the primitives at the nodes represented by octree data structures. (See, e.g., G. Wyvill, T. L. Kunii, "A Functional Model for Constructive Solid Geometry", *The Visual Computer*, v. 1, 1985, pp. 3–14.; H. Samet, "Chapter 5: Volume Data, 5.5 Constructive Solid Geometry", In The Design and Analysis of Spatial Data Structures, Addison Wesley Publishing Company Inc. 1990.) The DAG results in a tree with nodes that contain a flag indicating whether the primitive was added or subtracted, and matrices describe the relative spatial location and shape of the node. General background information regarding DAGs can be found in, e.g., A. V. Aho, J. E. Hopcroft and J. D. Ullman, *Data Structures and Algorithms*, Addison Wesley Publishing Company, 1I 1983.

Tree and graph-based structures in conceptual space have been used for assembly modeling wherein the nodes of the graph represent individual parts in the assembly and the arcs of the graph represent affine transformations and other information about the mating parts. The Virtual Link concept proposed by Lee et al. has each arc of an assembly graph store complete information about the type of attachment between the parts (rigid, constrained, etc.), as well as information about the mating surfaces of the parts. (See, e.g., K. Lee, D. C. Gossard, "A Hierarchical Data Structure for Representing Assemblies: Part 1," *CAD Journal*, v. 17, no. 1, January/February 1985.) The Relationship Graph proposed by Fa et al. (for which a citation was previously given) maintains geometric relationships between parts and assemblies that are represented as CSG (Constructive Solid Geometry) trees. The authors claim that this representation can be used for interactive design by use of 3D hand input devices, but it is unclear as to how the representation will achieve interactive performance suitable for a VE-based system unless a computer system with high processing speed is available.

Other researchers have more specifically addressed modeling methods suitable for VE applications. Virtual Reality Modeling Language (VRML) uses the Scene-Graph representation, which organizes objects into a graph hierarchy in which the leaves of the graphs are the triangular-faceted objects, and the nodes of the graphs are transformations or other such operations. The hierarchy facilitates grouping of objects and allows for optimization of some aspects of collision detection and Scene-Graphs are popular because they provide a representation suitable for real-time displays of predefined static 3D scenes. However, they are not suitable for a VE wherein the geometry may be constantly changing as the user interactively modifies it.

Otherwise, triangular faceted representations of geometric models are typically the representations of choice in VE applications because most current graphics libraries are optimized for them, and they can be accommodated in almost all shape modeling software. However, such a representation has several disadvantages. First, it requires a large amount of memory to store a model, since a model could potentially be composed of millions of triangles. Second, performing editing operations on polygonal models is complex (see, e.g., J. B. Allan, B. Wyvill, I. H. Witten, "A Methodology for Direct Manipulation of Polygon Meshes," New Advances in Computer Graphics: *Proceedings of CD International '89*, pp. 451–469). A typical approach to overcome these difficulties is to use a dual representation consisting of both a triangular faceted representation and a complete boundary model. This is the approach taken in the GIVEN (Gesture based Interaction in Virtual Environments) tool-kit (see, e.g., M. Figueiredo, K. Bohm, J. Teixeira, "Advanced Interaction Techniques in Virtual Environments," *Computers and Graphics*, v. 17, no. 6, pp. 655–661, 1991) and the ARCADE system (see, e.g., A. Stork, M. Maidhof, "Efficient and Precise Solid Modeling using a 3D Input Device," *Proc. of the Fourth Symposium on Solid Modeling & Applications*, Atlanta, Ga., May 14–16, 1997, pp. 181–194). These systems maintain interactive performance by having a "tight coupling" between the input and output handlers, although it is not clear as to how this is achieved. In addition, the authors point out that complex modeling operations necessitate calls to the ACIS™ solid modeler, with a consequent loss of interactivity.

Another possible approach is to simply use a conventional solid modeler for design representation in the VE just as a conventional CAD system does in the 2D environment). Unfortunately, while a solid modeler application can provide most of the required computational functionality for operations in a VR-CAD system (such as modeling, intersection detection, etc.), it is typically cannot be used in such applications because its slowness makes it unsuitable for the real-time requirements of VE-based systems. This conclusion is borne out by the well known $O(n^2)$ of basic solid modeler operations such as creation, editing and interrogation of shapes (where n is the number of topological entities, i.e., vertices, edges or faces in a given solid). Another factor influencing the performance of solid modelers is that they typically store a great deal of information in order to maintain consistency of the model (see, e.g., M. Mantyla, "An Introduction to Solid Modeling," Computer Science Press), which leads to a further reduction in performance.

As noted earlier, a typical solution to modeling issues in VE-based systems is to use a low-level representation of the model coupled to a more detailed representation of its geometry. As noted earlier, the GIVEN and ARCADE systems use a low-level triangular faceted representation in addition to a high-level complete boundary representation. However, as indicated by the authors of the ARCADE system, not all geometric modeling operations can be handled by the high-level representation and therefore a solid modeler is required—but this then results in the possible loss of interactive performance. Therefore, there is still a significant need for methods and apparata which address interactivity problems arising due to modeling issues, as well as the other problems noted above, if efficient and effective CAD systems are to be developed (in particular, effective VR-CAD systems).

SUMMARY OF THE INVENTION

The invention, which is defined by the claims set forth at the end of this document, relates to methods and apparata for high-speed computer-aided design of geometric models. As noted earlier, greater design speed (i.e., speed in updating and displaying of the design) generally results in greater interactivity for the user, an advantage which is particularly important if designing is to be performed in computationally burdensome virtual environments (VE). The invention will now be summarized by providing an overview of a preferred embodiment of the invention described in the Detailed Description portion of this document, the preferred embodiment being known as the Virtual Design Software Framework (VDSF).

In VDSF, increased speed is obtained by use of a dual representation of the user-created design, with each representation containing certain information which is useful for modeling the design. These representations may be referred to as the Design Intent Graph (referred to as D) and the Shape Modeling Graph (referred to as S), the term "graph" being used because the representations are best understood when provided in the form of a tree or Directed Acyclic Graph (as will be seen in the Detailed Description section elsewhere in this document). The representations are specially designed to decompose modeling tasks into activities that must be done in real-time and those that can be done asynchronously. Asynchronous performance of modeling tasks may be done in several ways. As a first example, certain modeling data can be pre-computed when features within the design are initially added or edited, and this pre-computed data can reduce the need for calculations later (as will be discussed later, for example, in relation to Geometry Links). As a second example, modeling tasks can be ordered on a spectrum of importance or probability, and those tasks which are more important/likely can be performed first, with less important/likely tasks being performed only if there is sufficient time. This is illustrated later, for example, in the discussion of Proximity Category 1 intersection checks (which are addressed immediately) versus Proximity Category 2 and 3 intersection checks (which are addressed afterwards during processor idle time, if performed at all). Further, in preferred versions of the invention, the representations are constructed so that when action is taken on certain portions of the design, modeling tasks related to that portion are performed locally, rather than over the entire design globally, so as to further decrease computational burden and increase modeling speed. Additionally, the representations are designed to minimize their dependence on conventional solid modeler calculations so that real-time response can be obtained even in computationally-burdensome virtual environments (VE), a result which is not possible if a conventional solid modeler is used.

In the dual representation, the Design Intent Graph D and the Shape Modeling Graph S contain somewhat different information. The focus of D is on storing the "design history," the sequence of design steps exercised by the user in creating the design. The focus of S is instead on storage of the features of the design with such detail that the design (and the results of editing the design) can be adequately modeled. However, D and S are "linked" insofar as an update of the design representation in D will generally result in a corresponding update in S.

D stores information such as (1) information about the features/elements the user chose for building the design (their shapes, whether they are solid/positive or void/negative elements, the location of element attachments, orthogonal bounding boxes, etc.); (2) the parent-child hierarchy of the elements within the design (a child element being one which is in immediate attachment with one or more prior parent elements); (3) any user-specified or system-specified design constraints on the elements or their relationships (e.g., two elements are to be spaced apart by some specified distance, etc.). While D does not contain sufficient information to fully support all modeling operations that might be performed on the design, it can support rudimentary operations such as constrained relocation (where relocation of an element also relocates that element's children, but does not affect the element's parent); alignment (where an element and its children may be relocated along an axis defined on the element's parent until a parent edge is reached); and simple boundary box-based intersection checks (where intersections between elements are determined by calculating distances between orthogonal boundary boxes surrounding elements within the design).

S is a more complete representation of the design geometry, and is sufficiently detailed to support almost all modeling operations save for a few which are sufficiently complex that they require the assistance of a solid modeler (for example, intersection determinations between boundary representations). S contains information regarding the elements the user chose to construct the design and the relations between these elements, and is most readily understood when presented as a Directed Acyclic Graph (as in FIG. 28, discussed in greater detail later). In such a graph, the elements are represented by nodes and relation information is primarily represented by links between the nodes. Node/element information includes information such as the shapes of the elements, including the faces, face edges, vertices, and characteristic parameters of the elements; information that can later be used to expedite modeling operations, such as the convex hulls of the elements (which can be used for rapid collision detection between elements, as discussed later); and pointers indicating the links applicable to the face of each component. The S representation in VDSF then uses several types of links, which may be summarized as follows.

The Attachment Link A is used where one element within the design is attached to another element. An attachment link may include information such as an identification of the mating/attachment faces between the elements, and the location of each element with respect to others (i.e., an attachment datum or transformation identifying how the attachment face of one element is positioned with respect to the attachment face on the other element). This information is primarily specified by a type of attachment link known it as a primary attachment link $A^P$. If an element is a void/negative element rather than a solid/positive element, a secondary attachment link $A^s$ is used in conjunction with the primary attachment link $A^P$ to indicate negativity. The attachment link A information, when used in conjunction with the node/element information, is sufficient to fully describe most designs and support their editing and rendering. As an example, if a child element is moved with respect to a parent element, the attachment link(s) between them are simply updated to reflect the new location of the child with respect to the parent. Any children of the child element will maintain their locations relative to the child element (unless their attachment links are also modified), and therefore changes in the design are localized about the child element. As another example, if a child element is resized with respect to a parent element, the child's node information is updated to reflect the new dimensions/configuration of the child, and the attachment link's location transformation between the child and the parent (and possibly between the child and any children of that child) may also be updated to reflect a change in relative location owing to the child's resizing. Again, changes in the design will be localized about the child unless other attachment links away from the child are altered. Thus, by representing attachments between elements by the attachment links, and by reflecting attachment changes by updating only the attachment links related to the element being edited, the representation of the design is only updated locally; it will not require a more extensive or "global" recalculation. This results in a significant decrease in computation time, allowing the design to be updated and rendered very rapidly so that greater interactivity can be attained.

Further links may then be used if even greater gains in interactivity are desired. The Proximity Link P can be used to expedite intersection (element collision) detection during editing activities by precomputing certain quantities useful in intersection detection, thereby reducing later computation time when intersection detection is required. The P links enable rapid intersection detection by storing all distances d between the convex hull of an element in question and the convex hulls of all other elements which are neither parents nor children of that element. These other non-parent/non-child elements are then ranked in order of increasing distance d (i.e., in order of proximity). When the element in question is later edited (e.g., moved), a convex hull intersection check is only performed between the element and some predetermined number of the most proximal non-parent/non-child elements, and the intersection checks are performed in order of rank. If a convex hull intersection is detected between elements, a "full" intersection check between the boundary representations of the elements can be performed with a call to a solid modeler. Thus, the time-consuming intersection check by the solid modeler is only performed in certain instances when prior tests—whose parameters are largely pre-computed in prior time steps—indicate that an intersection is likely. Additional time advantages are realized if the non-parent/non-child elements are further ranked into three categories:

Proximity Category 1: Elements which have the same parent as the element in question and which are attached to the same parent face as the element in question:

Proximity Category 2: Elements which have the same parent as the element in question but which are not attached to the same parent face as the element in question; and:

Proximity Category 3: Elements which do not have the same parent as the element in question.

In general, this categorization further classifies elements in order of their probability of intersection to the element in question, with intersections being most likely for Category 1 elements and least likely for Category 3 elements. By performing the aforementioned intersection detection test on elements within Category 1 first, and then proceeding to succeeding categories if no intersections are detected, further time savings are obtained because intersections are sought where they are most likely to occur.

If an intersection is detected, the designer can be asked to confirm or deny whether the intersection was intended before being allowed to make further design changes. In VDSF, many proximity links are categorized as "soft" because they allow the designer to permit intersection if he/she wishes to do so. It is also possible to provide "hard" proximity links which do not allow intersections, or which do not permit the elements subject to the proximity link to violate some predetermined proximity condition. As examples, hard proximity links can restrict elements to remain at some predefined distance, or require them to remain above or below some predefined distance. Such hard proximity links can be enforced by checking methods similar to, the aforementioned method of intersection checks, e.g., the distances d can be checked for compliance with predefined distance constraints.

Geometry links G may also be provided to attain further benefits in computational speed. Geometry links are used to store precalculated information regarding the features of elements, or regarding relationships between elements, so that this information is readily available for later use in editing operations. As one example, "parallel face" geometry links may exist between opposite parallel faces within an element so that certain later design activities requiring an opposite parallel face determination (e.g., the piercing of the element by a through-hole) are expedited. Similarly, "opposite face" geometry links may be formed between spaced parallel faces on different elements so that later design activities requiring an opposite parallel face determination (e.g., addition of a "bridge" element) are expedited.

Thus, it is seen that the foregoing design representation can allow several important benefits: (1) it can allow localization of the effect of editing operations (i.e., editing can occur on localized design elements rather than on the design globally); (2) proximity of design elements in the "conceptual space" of the representation can be translated to physical proximity of elements in geometric space to enable faster intersection determination between design elements; and (3) the geometry of design elements can be precomputed so as to avoid potentially expensive computations during editing. These benefits each provide significant computational time savings, which translates to higher interactivity in the design system.

BRIEF DESCRIPTION OF THE DRAWINGS

The invention will be better understood upon review of the following detailed description in conjunction with the accompanying drawings, which may be summarized as follows:

FIG. 17 illustrates a desired design.

FIG. 18 illustrates a first alternative for constructing the desired design of FIG. 17, with a corresponding Design Intent Graph D.

FIG. 19 illustrates a second alternative for constructing the desired design of FIG. 17, with a corresponding Design Intent Graph D.

FIGS. 24A–24D illustrate examples of location operations enabled by the Design Intent Graph D.

FIGS. 26A–26D illustrate examples of boundary box-based intersection checks enabled by the Design Intent Graph D.

FIGS. 40A–40E illustrate conversion of a soft proximity link $P^s$ to a secondary attachment link $A^s$ in a (partial) Shape Modeling Graph S in the event where element $c_7$ is elongated (Case I) or carried (Case II) until it pierces element $b_6$.

DETAILED DESCRIPTION OF PREFERRED FORMS OF THE INVENTION

As previously noted, the invention relates to methods and apparata for rapid design of objects in CAD environments. The invention will now be described in terms of an actual working embodiment which has been developed in the I-CARVE laboratory of the University of Wisconsin (Madison, Wis., USA), and which will be referred to as the Virtual Design Software Framework, or VDSF. While the following discussion of the VDSF will illustrate how to make and use the invention, it must be kept in mind that the VDSF is merely a preferred version of the invention, and the full scope of the invention is defined by the claims set forth at the end of this document.

The VDSF (Virtual Design Software Framework): Overview

Figure 1:
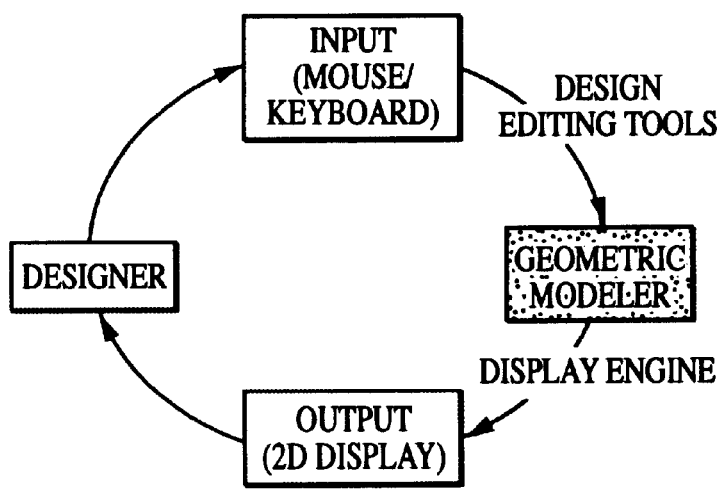
FIG. 1 illustrates a functional flow diagram for a prior art CAD system.
Figure 2:
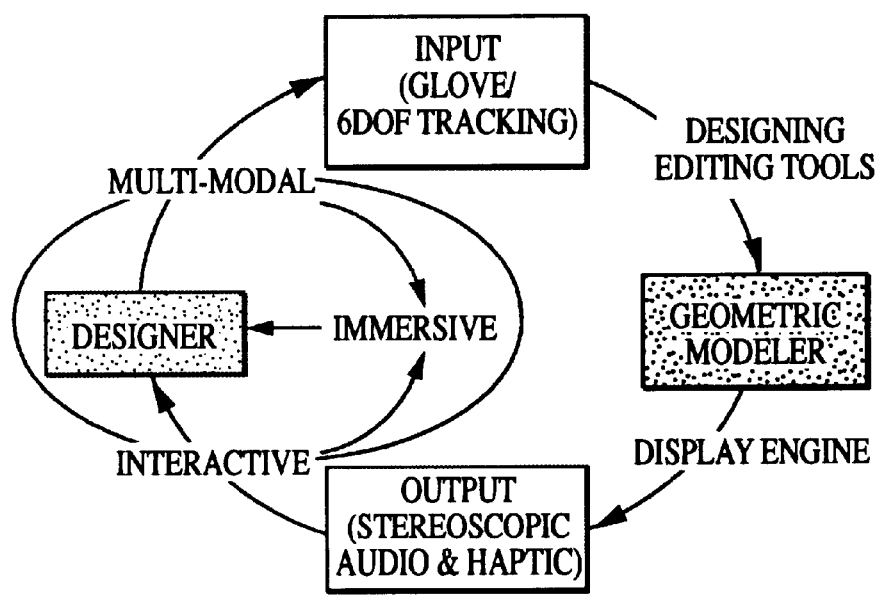
FIG. 2 illustrates a functional flow diagram for an exemplary VR-CAD (virtual reality CAD) system.
Figure 3:
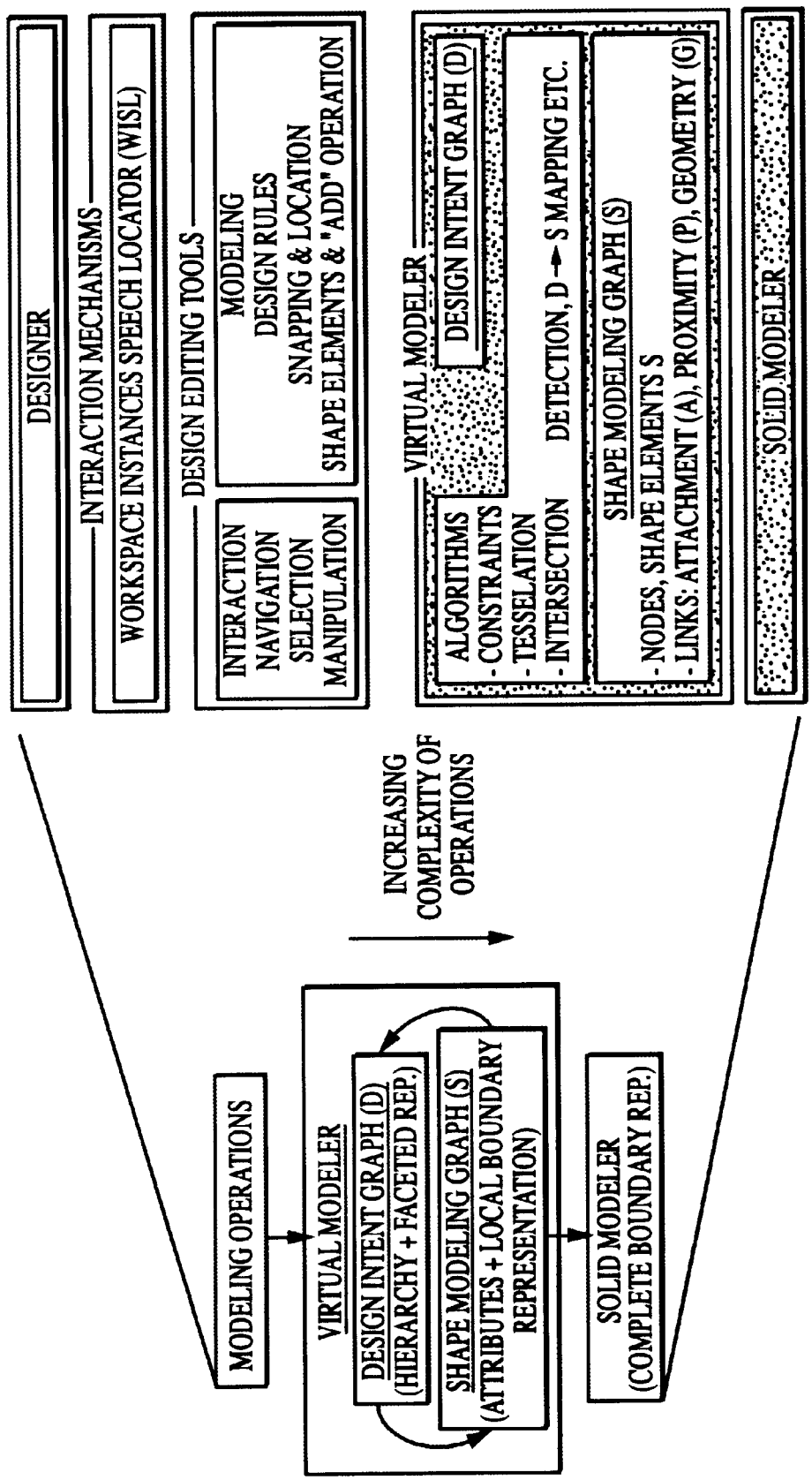
FIG. 3 conceptually illustrates the structure of the VDSF (Virtual Design Software Framework), a preferred embodiment of the present invention.

The VDSF allows a user to design (i.e., create, edit, visualize, and manipulate) objects, including extremely complex objects, very rapidly in a three-dimensional VE by use of motion (hand gesture) and voice input. The VDSF can be viewed in terms of several components or "layers" which are schematically illustrated in FIG. 3:

(1) An Interaction Mechanisms Layer (or User Interaction Layer), which allows the user/designer to interact with the VDSF via input/output devices (e.g., tracking devices and sound transducers for motion and voice input, and monitors and speakers for visual and sound output). A WISL (Workspace-Instances-Speech-Locator) paradigm is used to allow designer interaction with the VDSF, wherein designs are created in a 3D Workspace by Instancing simple shapes using Spoken commands and interactively Locating them in 3D space using hand input.

(2) A Design Editing Layer which allows the user to act on objects in the Virtual Modeler Layer (discussed below) via the Interaction Mechanisms Layer.

(3) A Virtual Modeler layer, which provides the underlying geometric representation of the design. This representation is provided in two parts:

(a) In a Design Intent Graph (D graph), which stores the faceted primitive elements that are combined to assemble a design, and additionally stores the hierarchy in which these elements were combined (i.e., the sequence of commands used to assemble the elements in the design). The Design Intent Graph D is the least detailed representation of the design contained within VDSF, but it allows high-speed modeling for a large number of designs (those utilizing only "positive" elements) and editing operations (such as relocation of elements, alignment of elements, etc.).

(b) In a Shape Modeling Graph (S graph), which provides a more detailed representation of the design than the Design Intent Graph D. The Shape Modeling Graph S describes a design in terms of the boundary representations of the basic shape elements making up the design (these boundary representations being obtained from the Solid Modeler Layer discussed below), and also in terms of links which contain information regarding the relationships between elements. The S graph provides high-speed modeling in certain cases when the D graph is insufficient, such as when designs include negative elements and when certain editing operations are required that cannot be accommodated in D (automatic dimensioning, etc.).

The unique dual-graph structure and methodology of the Virtual Modeler Layer allows exceptionally rapid design in a VE by allowing a designer to quickly and easily set forth his/her design intent, with certain nonessential modeling, intersection detection, and rendering steps occurring asynchronously so that the time-critical demands of a true VE environment can be met. As will be evident from the discussion presented later in this document, the Virtual Modeler Layer offers a significant advance in providing true interactivity in VE environments (though many of its advantages can be realized in conventional two-dimensional systems as well).

(4) A Solid Modeler Layer, wherein a solid modeler functions as a geometry engine capable of responding to queries from the S representation. The solid modeler supplies the S graph with local boundary representations (those of its elements), and can also be called upon to generate a global boundary representation of the entire design in instances where the S representation may prove insufficient for modeling.

Each of these layers will now be discussed in turn in greater detail.

The VDSF: Interaction Mechanisms Layer

As mentioned earlier, speech; and hand input are the primary modes of user interaction in VDSF. The WISL paradigm allows the designer to become part of a 3D VE workspace in which he/she creates instances of primitive shapes using spoken commands and specifies positions of these shapes using a motion controlled 3D locator. The VE workspace therefore replaces the "windows metaphor" commonly found in CAD systems, with speech input replacing "icons" and "menus", and the 3D locator playing a role analogous to a 2D mouse in a typical CAD system. This paradigm emulates the real world, in which a designer will often use a combination of spoken words and hand motion to indicate approximate sizes and shapes of products during the conceptual design stage.

Figure 4:
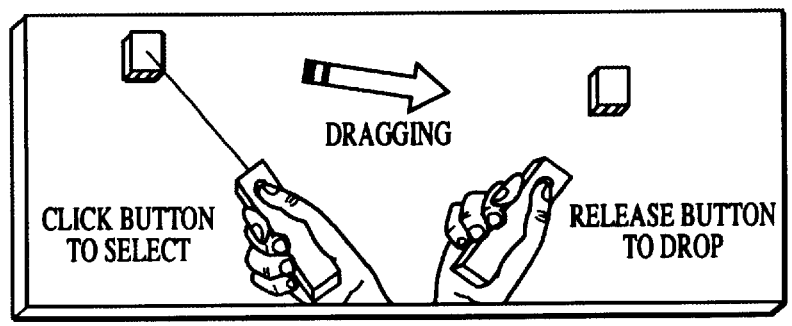
FIG. 4 illustrates the Virtual Locator, an input tool used in VDSF.
Figure 5A:
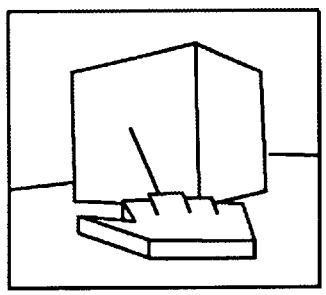
FIGS. 5A–5C illustrate a series of examples showing use of a Virtual Locator to select, add, and resize elements in a design.
Figure 5B:
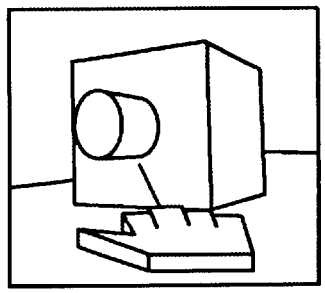
Figure 5C:
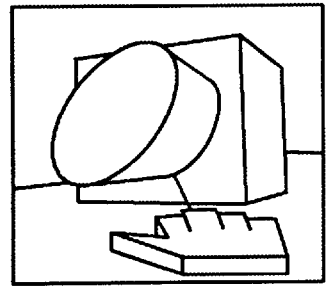

As opposed to several prior computer systems utilizing motion input, gestures having specialized, preassigned meanings are not used in VDSF since it was felt that such gestures are not necessarily the best way to communicate design intent. This is because using gestures would require training, which could hinder VDSF's use. Instead of gestures, hand motion input is used in intuitive fashion as a 3D locator that is used for positioning shapes created via voice commands. While several modes of hand motion input are possible (and are discussed in greater detail in other references, e.g., C. C. Chu, T. H. Dani and R. Gadh, "Multimodal interface for a Virtual Reality Based CAD System", *CAD Journal*, March, 1997), the preferred mode of hand motion input in VDSF is the Virtual Locator shape manipulation tool, an example of which is illustrated in FIG. 4. The Virtual Locator is a hand-held pointer with one or more buttons, and its real-world orientation is represented on a display as a line extending from a virtual hand (as illustrated in FIGS. 4A–4C, which are discussed at greater length below). By pointing the Virtual Locator and issuing commands via its button(s), voice input, or other forms of input, the Virtual Locator can be used for navigation or for object selection, editing and manipulation. As an example, the Virtual Locator allows navigation in the VE (i.e., it allows going to desired areas in the virtual workspace) by pointing to an object or area and then issuing a spoken "zoom-in" command. FIGS. 5A–5C then illustrate use of the Virtual Locator for editing purposes. FIG. 5A shows the Virtual Locator indicating a target face on an object on which some operation is to be performed. Once the face is chosen, the Virtual Locator is used to position other objects/primitives such as the cylinder, shown in FIG. 5B. The Virtual Locator can also be used to interactively modify the geometry of a selected primitive. FIG. 5C shows the locator being used to rescale the size of the previously added cylinder.

The VDSF: Design Editing Layer

The Design Editing Layer has two primary components: (1) an Interaction Component that allows navigation, selection and manipulation of the VE environment (which are subsidiary but useful tasks in the VE); and (2) a Modeling Component which allows modification of object geometry. Each of these components will now be described in greater detail.

(1) Interaction Component: The Interaction Component provides different methods of navigation in 3D space (getting to various locations in the VE workspace); selection of objects (for example, by pointing); and manipulation of those objects (for example, by grasping an object by hand and interactively rotating it). Since most designers are accustomed to 2D windows in a typical CAD environment, navigation can be difficult in a 3D VR-CAD system unless it is highly interactive. In VDSF, the Virtual Locator concept is used in conjunction with motion input and spoken commands to allow the designer to point to an object and then issue a spoken command, e.g., "zoom in" to get the desired zoomed-in view.

Object selection via motion input requires real-time 3D-intersection detection between the Virtual Locator and the objects in the VE. Once an object is selected, it can be manipulated by the designer to get a particular view. Here, manipulation refers to activities such as picking and placing an object, or grasping and rotating an object to get a desired view. It also requires appropriate geometric transformations so that the user is able to pick and place objects in a natural fashion. Visual output generation requires tessellation of geometric models into triangles or other forms needed by graphics libraries, and computation of a pair of images with parallax separation to enable a stereoscopic visual display. Additional geometric computations are necessary to provide auditory and/or haptic feedback. For example, haptic feedback (if provided) requires computation of surface properties so that the appropriate texture can be simulated in the haptic feedback devices.

(2) Modeling Component: VDSF's WISL interaction paradigm bases its design modeling tools upon use of speech commands and hand input. An alternate approach could have instead adapted existing geometric modeling tools in conventional WIMP (Windows-Icon-Menu-Pointer)-based CAD systems to the WISL paradigm. For example, modeling tools based on sketching extrusions and then adding geometric features to the resultant geometry could be provided with hand input (for use in sketching) and speech input (for used in adding instances of geometric features at specific locations). However, not all conventional modeling tools can be readily adapted for use in a VE using a WISL paradigm. For example, Constructive Solid Geometry (CSG)-based approaches wherein primitives are combined via union, subtraction and negation operations may be difficult for the user to specify via WISL as opposed to textual approaches (as in some CAD applications). Thus, modeling tools in existing CAD systems may not be appropriate for use with WISL and similar methods.

Figure 6:
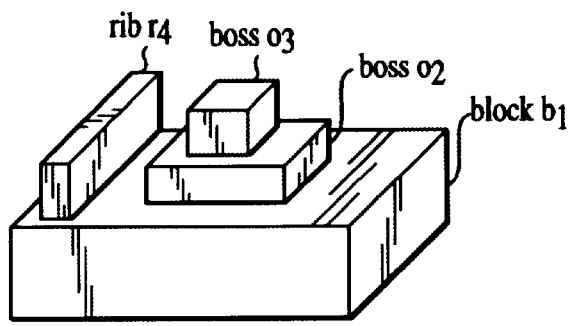
FIG. 6 illustrates a design created via a construction approach, wherein the component elements (all positive entities) are attached by an "Add On" operation to produce the overall model.

The current approach in the VDSF is based on a "construction" approach similar to CSG operations, which allow creation of complex shapes by aggregating prede-fined shape elements. However, VDSF's WISL paradigm leverages the benefits of speech and motion input interfaces to simplify editing, and does not rely on a direct translation of WIMP operations to WISL operations. VDSF's approach is best understood with initial reference to an example. Consider the compound block model in FIG. 6. To create this S model, the voice commands (indicated in quotes) and the hand input are as follows:

(1) Create an instance of a block ($b_1$) with default parameter values. In general, the designer inputs the default parameters using spoken commands; this approach is discussed further, e.g., in T. H. Dani, R. Gadh, "Creation of Concept Shape Designs via a Virtual Reality Interface," *CAD Journal*, Elsevier Publications, 29(7), 1997.

(2) Point to the appropriate location on the top face of $b_1$ using the Virtual Locator and "Add On Boss" ($o_2$) by voice input.

(3) Point to the appropriate location on the top face of $o_2$ and "Add On Boss" ($o_3$) by voice input.

(4) Point to the appropriate location on the top face of $b_1$ and "Add On Rib" ($r_4$) by voice input.

Figure 7:
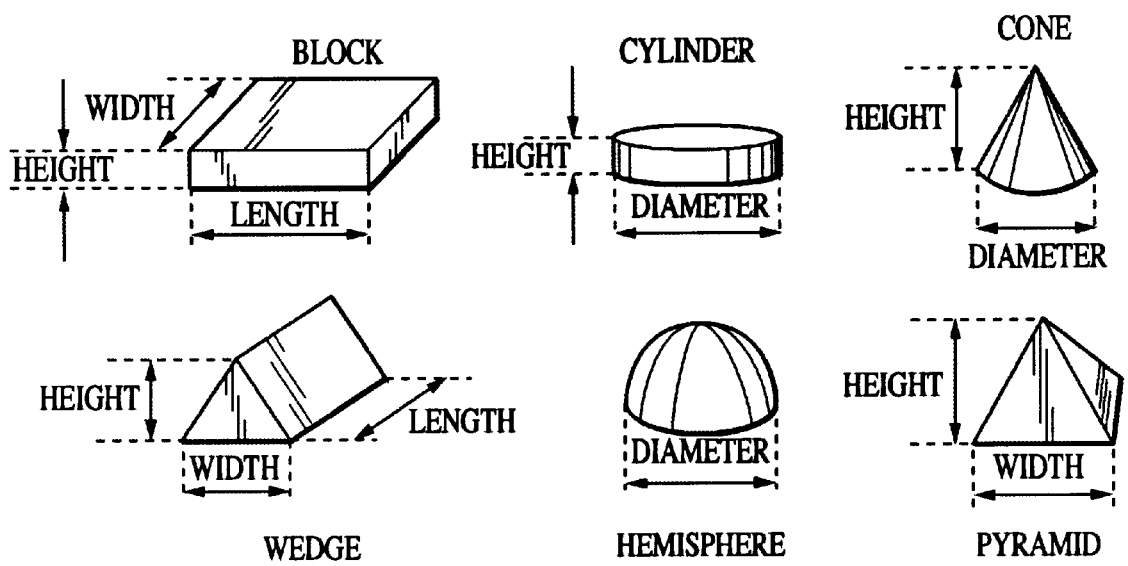
FIG. 7 illustrates various primitive shape elements available for use in VDSF.

Thus, simpler shape elements (some of which are shown in FIG. 7) are combined to create more complex shapes. The Virtual Locator is used to select a desired face of an element and to locate a further element to be added. The elements are typically created by a speech command. This approach has the advantage that it does not require 3D positioning of shape elements before "Adding On" one element to another, an approach which could be tedious. The representation in the Virtual Modeler Layer (to be discussed in greater detail elsewhere in this document) allows such a construction and supports the requirements of the WISL interface.

Figure 8:
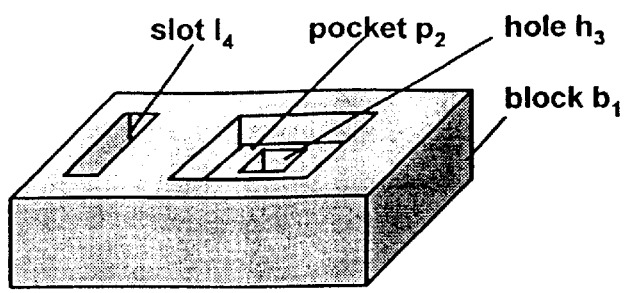
FIG. 8 illustrates a design analogous to that of FIG. 6, but wherein several elements are provided as negative entities rather than positive entities (i.e., the elements are subtracted rather than added).

The primitive shape elements in FIG. 7 reflect the commonly occurring geometric features in mechanical engineering components (see, e.g., P. R. Wilson, M. J. Pratt, "A Taxonomy of Features for Solid Modeling," *Geometric Modeling for CAD Applications*, M. J. Wozny, H. W. McLaughlin, J. L. Encarnacao (Eds.), Elsevier Science Publishers, 1988, pp. 125–137). Each shape element ($s_i$, where i represents the $i^{th}$ shape element in an object) within an object in VDSF denotes the presence or absence of material. For example, rectangular blocks (with appropriate parameter values), when created as negative entities, may be used to "Add On" rectangular slots, pockets and holes to an object (as shown in FIG. 8, wherein the "basic" object to which the slots, pockets and holes are added is itself a "positive" rectangular primitive). The library of shape elements shown in FIG. 7 can be extended as desired to include other possible primitives having different shapes. Each primitive is modeled as a collection of surfaces with vertex, edge and face adjacency.

Figure 9A:
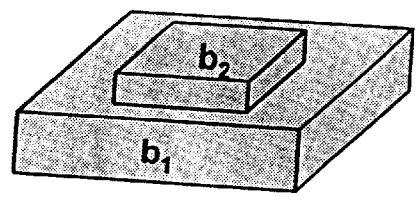
FIGS. 9A–9C illustrate valid and invalid "Add On" operations in VDSF for assembly of designs.
Figure 9B:
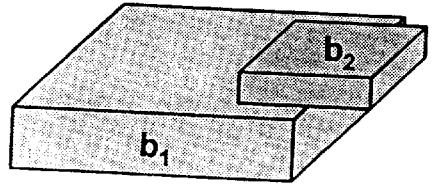

"Adding On" $s_i$ to $s_j$ requires that $s_i$ and $s_j$ share a pair of mating faces (which are either partially or fully overlapping). As a consequence, geometric configurations of the type shown in FIG. 9A and FIG. 9B are acceptable, but the configuration in FIG. 9C where an edge of block $b_2$ touches the face of block $b_1$ is disallowed since it results in the creation of a non-manifold model.

Figure 10A:
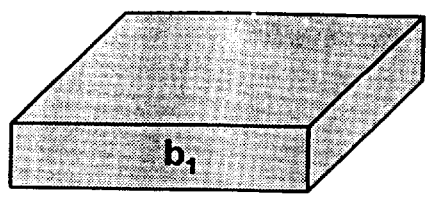
FIGS. 10A–10C illustrate a 3D "rubber-banding" operation for element creation and sizing.
Figure 10B:
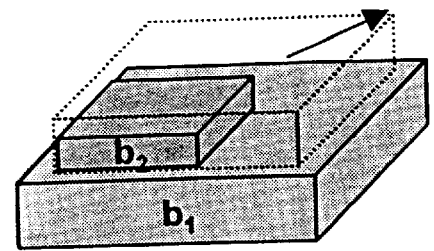
Figure 10C:
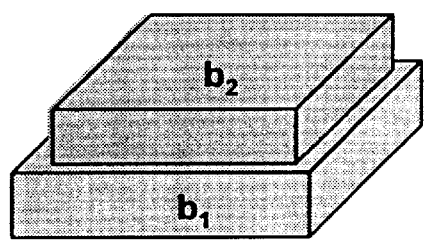

Other modeling operations in VDSF allow modification of preexisting geometry, and these include transformations such as translations, rotations and scaling. In addition, 3D rubber-banding (which behaves like the 3D equivalent of 2D rubber-banding techniques allowing interactive sizing of objects) allows interactive creation of shapes via hand input. This includes (1) creation of free-standing shape elements, i.e., shapes not attached to any other shape elements, and (2) in-place addition of shape elements to an existing element (as shown in FIGS. 10A–10C). In both cases, hand input is used to interactively size the element until the desired size is reached. This approach allows rapid creation of shape elements by specification of approximate dimensions via hand input. Alternatively, as previously noted, exact dimensions can be specified via the voice-input mechanism.

Figure 11:
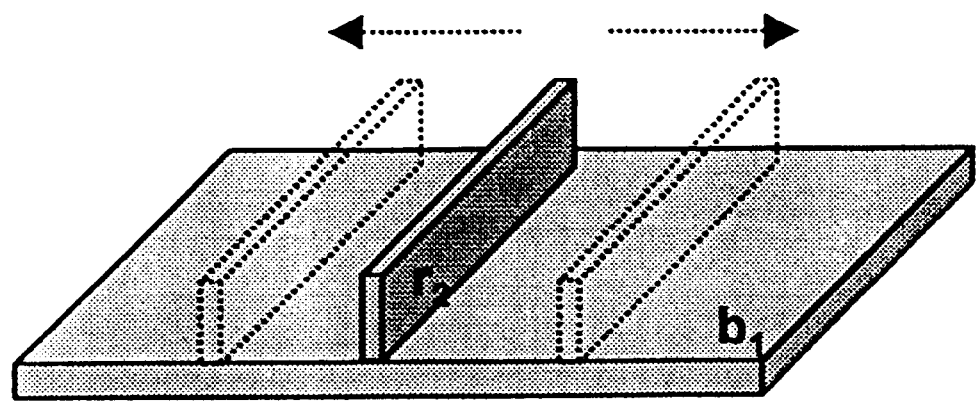
FIG. 11 illustrates an example of constrained location editing, wherein editing is limited so that one element may be moved with respect to a second element but cannot be moved outside of the boundaries of the attachment face on the second element.
Figure 12:
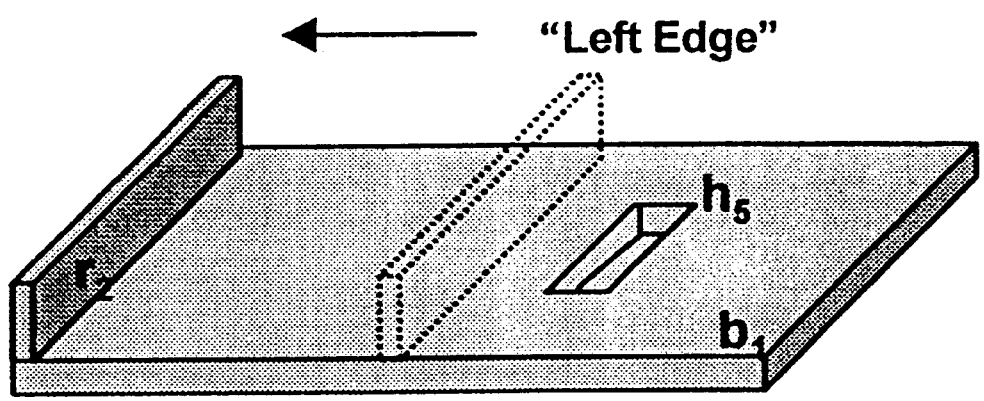
FIG. 12 illustrates an example of viewpoint dependent editing, wherein input specifying that an element be moved to the right or left side of a second element is executed in accordance with the right and left sides of the elements as they are displayed to the user.
Figure 13:
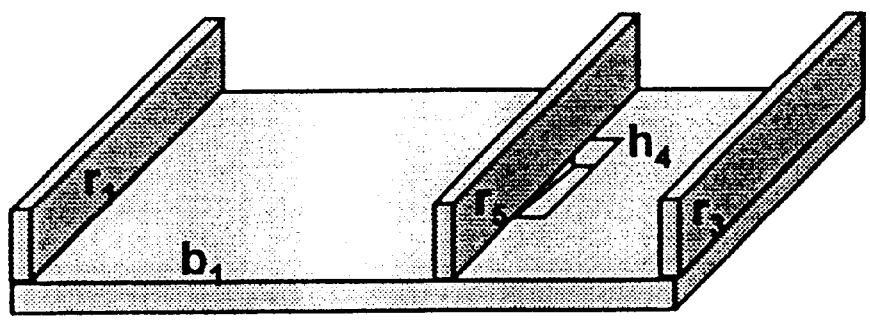
FIG. 13 illustrates an example of a violation of an implicit constraint (design rule) provided in VDSF (non-obstruction of holes).

Given that exact location and editing of shapes in three dimensions is difficult, the Design Editing Layer provides various types of constraints (design rules) that allow simplification of interactive placement and shape modification. Design constraints may be grouped into two categories:

(1) Implicit constraints, i.e., those design rules that are automatically generated by the system or are default constraints. One exemplary such constraint in VDSF is that once $s_i$ is added to $s_j$, $s_i$ is constrained to lie on $s_j$ even as it is interactively edited. Such editing is shown in FIG. 11, where $r_2$ is added to $b_1$ and afterwards may be moved in either direction. During this re-location, $r_2$ continues to lie on the surface of $b_1$ in accordance with the aforementioned constraint. Another type of implicit constraint is a viewpoint-dependent location constraint which allows rapid alignment of $s_i$ with respect to $s_j$ ($i \neq j$). An example of such a viewpoint dependent location constraint is illustrated in FIG. 12, where a designer issues a command for $r_1$ to move to the "Left Edge," and the system responds by relocating the rib to the left edge taking into account the viewpoint of the designer. Another implicit constraint, non-obstruction of predefined negative elements, is illustrated in FIG. 13, where the designer is not allowed to move rib $r_5$ to obstruct hole (negative element) $h_4$. Automatic geometric constraints such as this one could be relaxed, but are preferably provided to allow simplified editing operations.

Figure 14:
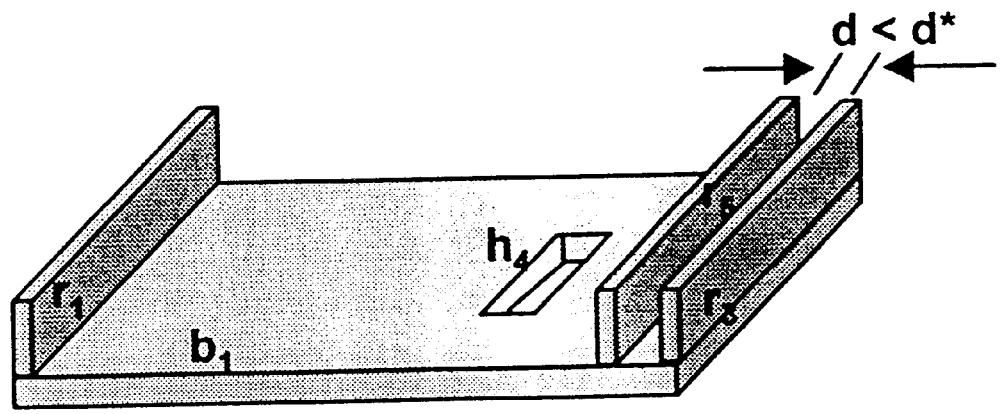
FIG. 14 illustrates an example of a violation of an explicit constraint (design rule) provided in VDSF (distance between elements does not meet user-specified standard).

(2) Explicit constraints, i.e., those design rules that are explicitly specified by the designer. FIG. 14 illustrates an explicit constraint violation: "Ribs to maintain a minimum distance of d*", where the distance d* between the two ribs created by the designer becomes less than that allowable by a constraint specified by the designer owing to design/manufacturing/assembly requirements. Unlike implicit constraints, which are built into the Design Editing Layer, explicit constraints can be redefined by the designer.

The VDSF: Virtual Modeler Layer

The Virtual Modeler Layer provides VDSF's underlying geometric representation of objects, the data within it is organized in such a manner that it may be represented as a dual graph consisting of a Design Intent Graph (D) and a Shape Modeling Graph (S). The dual graph representation assists in accomplishing two goals:

(1) To capture the designer's design intent, including collection of the designer's modeling steps used to create a design and recording the specified design constraints so that this information can be used in future design activities. This is primarily done within D. It must be noted that the notion of "design intent" in D refers to the intended/desired geometric relations between the model's features rather than the actual functional intent of the design, i.e., D is related to capturing the history of how the shape was created rather than to the design theory and end operation of the model.

(2) To provide a geometric representation for modeling and graphical rendering of created models within the time-critical requirements of the CAD system (in particular, in VR-CAD systems wherein design occurs within a VE); in other words, to allow modeling to occur with "true interactivity." This is done by using the less detailed D representation to perform certain basic modeling chores, and then relying on the more detailed S representation when the complexity of the modeling step at hand is such that the D representation cannot adequately perform it. However, even the S representation—which relies on the solid modeler for a portion of its operation—is optimized in such a fashion that it achieves much faster performance than a solid modeler.

Note that while D and S are distinct, they are related insofar as each shape element in D is "mapped" or "coupled" to one or more entities in S. The two separate design representations of D and S are used because D is not well suited for certain types of design steps and their graphical display. While the structure of D makes it possible to use it for the display of relatively simple design geometries (such as designs composed of positive shape elements combined with "Add On" operations), it cannot be used for display of shapes containing negative entities, and additionally it cannot fully accommodate more advanced modeling functions (e.g., resizing of shape element geometries). In these cases, S must be used since it is capable of representing shapes containing both positive and negative entities, and it can handle more advanced modeling operations because it contains a more detailed representation of the design. S uses a hierarchical graph structure that represents a design in terms of disjoint basic shape elements (the geometry) connected via various links (the topology). These links include attachment, proximity and geometry links which not only store the relationships between the elements but also enable faster computations in S (as will be explained later), thereby providing interactivity advantages. Each of the Design Intent Graph (D) and Shape Modeling Graph (S) will now be discussed in greater detail in turn.

The VDSF Virtual Modeler Layer: The Design Intent Graph D

The Design Intent Graph D directly reflects the sequence in which the designer creates the design of the geometric model, and captures the design history based on the steps taken by the designer to create the shape. The D graph provides a high-level representation of the design which allows many common modeling functions (i.e., common shape element creation and editing functions) to be performed without requiring queries to the solid modeler. As a result, modeling functions that can be accomplished with sole reference to D can be executed extremely rapidly.

Figure 15A:
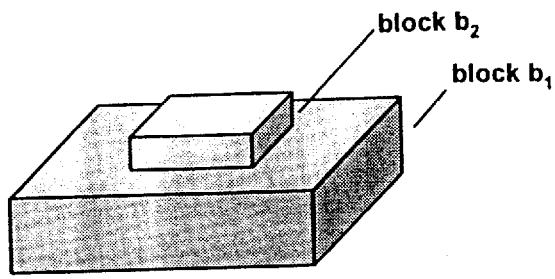
FIGS. 15A–15C illustrate progressive steps in the creation of a Design Intent Graph D corresponding to the illustrated design.
Figure 15B:
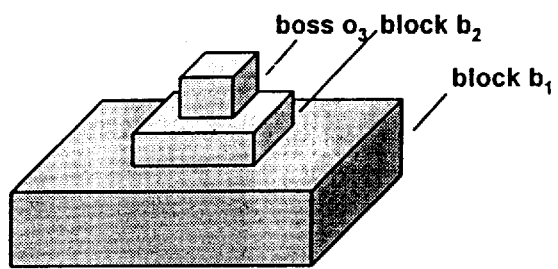
Figure 15C:
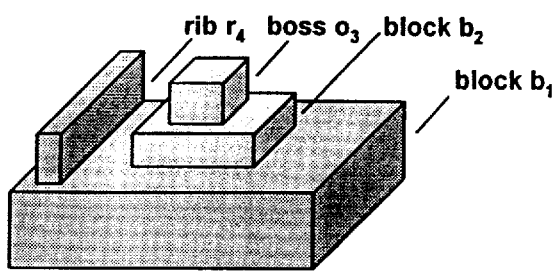
Figure 16A:
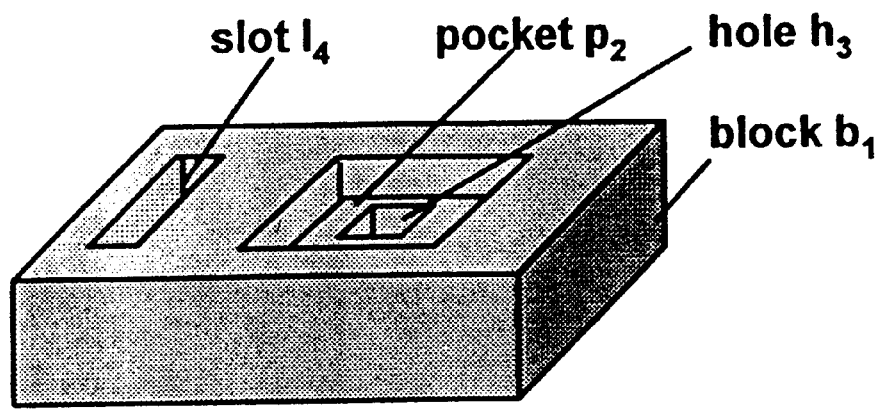
FIGS. 16A and 16B illustrate a design and Design Intent Graph D analogous to that of FIG. 15C, but wherein several elements are provided as negative entities rather than positive entities (i.e., the elements are subtracted rather than added).
Figure 16B:
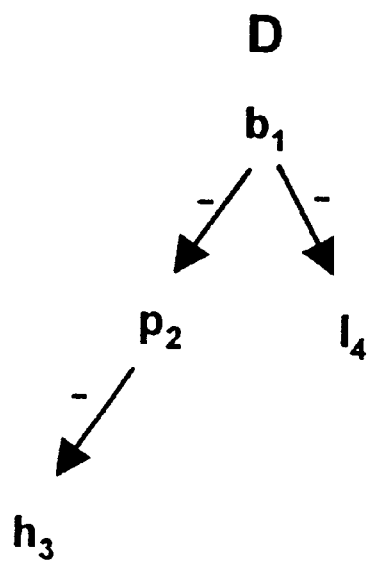

During the design process in VDSF, the designer specifies the geometry of the design in terms of the shape elements described earlier. For example, if the designer wishes to specify a design feature such as a rib, this is geometrically equivalent to a positive rectangular block element with a width considerably less than its length. Similarly, a slot is a negative instance of a rectangular block element with appropriate dimensions. The designer's specification of various shape elements $F_i$ results in D—a directed graph—wherein the elements $F_i$ appear as nodes of the graph. A directed link on the graph D from element $F_j$ to $F_i$ ($F_j \rightarrow F_i$) indicates that the designer has added $F_i$ to $F_j$ (thus $F_i$ is a "child" of "parent" $F_j$). To illustrate by example, FIGS. 15A–15C show the successive steps in the creation of an example design and the resulting Design Intent Graph D at each step. FIG. 15A illustrates the addition of block $b_2$ on $b_1$; followed by boss $o_3$ on $b_2$ (FIG. 15B); and finally rib $r_4$ on $b_1$ (FIG. 15C). FIG. 16A then illustrates a design containing the "negative" counterparts of the elements $b_1, b_2, o_3, r_4$ of FIG. 15C, added to a rectangular block element in the same order as in FIG. 15C. Its corresponding D is shown in FIG. 16B. Note that while D for the design in FIG. 15C is structurally similar to that of FIG. 16B, the geometry of the two designs is significantly different.

It is seen that the resulting Design Intent Graph D is a data structure commonly referred to as a tree or Directed Acyclic Graph (DAG). As a result, D will generally have the following properties:

(1) For a large variety of cases, such as the ones in FIGS. 15 and 16, D assumes a simple tree structure. Advantageously, typical search algorithms within a tree structure have complexity O(log n), where n is the number of nodes in the tree. For some special cases, D might have a non-tree structure containing one or more cycles (i.e., a true DAG), as will be discussed later.

(2) Two designs with the same geometry may have distinct D's depending upon how they are constructed, as illustrated in FIGS. 18 and 19. The desired design of FIG. 17 may be constructed in the fashion of FIG. 18, wherein a slot (a negative block element of suitable dimensions) is added to an existing larger block. Alternatively, it may be constructed as in FIG. 19, wherein two blocks of a smaller size are added to an existing block to create the same shape. The different design steps for each case are reflected by the D's shown in the respective figures. While the two final shapes are identical, the intent of the designer in each case is different, and therefore D is different.

(3) Similarly, two designs having different geometry can have similar D's. An example was noted above regarding FIG. 16, wherein several elements in the design are the negative versions of the elements of FIG. 15. The D for the design of FIG. 16 was seen to be very similar to that of FIG. 15.

These examples illustrate that the construction approach for constructing D, and the design history implicit in the construction, will have an impact on future methods of editing designs. For example, if the model in FIG. 17 is constructed as shown in FIG. 18, future editing operations will involve changing the dimensions of the slot $b_2$. For FIG. 19, editing the width of the "slot" created by the two blocks $b_1$ and $b_2$ will require modifying the dimensions of either $b_1$ and/or $b_2$.

Figure 20A:
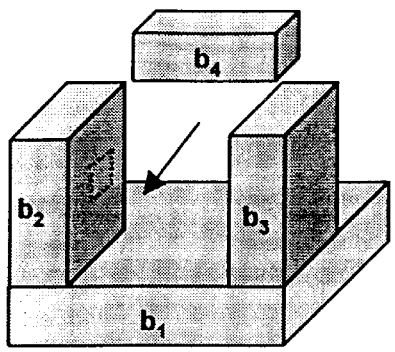
FIGS. 20A and 20B illustrate addition of a bridge element (an element spanning at least two other elements but not being attached to a face common with these elements), resulting in the Design Intent Graph D being a Directed Acyclic Graph (DAG) rather than a tree.
Figure 20A:
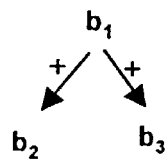
Figure 20B:
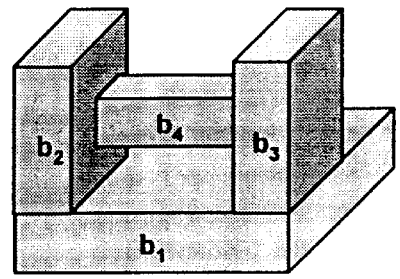
Figure 20B:
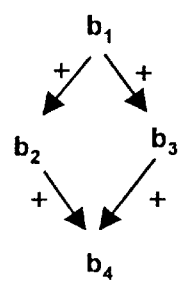
Figure 21A:
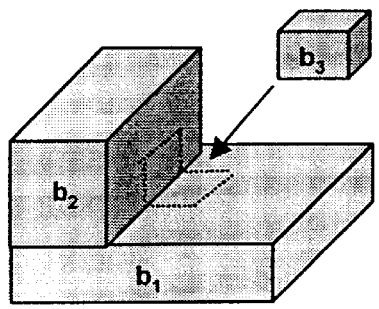
FIGS. 21A and 21B illustrate addition of a wedge element (an element spanning at least two other elements and being attached to a face common with these elements), resulting in the Design Intent Graph D being a Directed Acyclic Graph (DAG) rather than a tree.
Figure 21A:
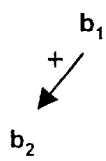
Figure 21B:
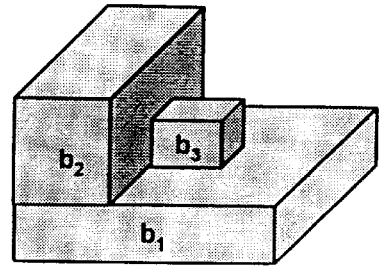
Figure 21B:
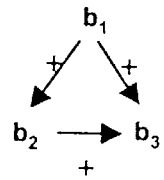

D for the above examples is a tree structure. This is because each $F_i$ is added to a single existing $F_j$, and therefore each $F_i$ has a single parent (which is necessarily true for a tree). While this construction is useful for most designs, in some cases it may be necessary to add a child element $F_i$ to more than one parent element ($F_j$ and $F_k$) simultaneously. Examples include designs with elements that serve as bridge elements between two other elements, as shown in FIGS. 20A and 20B, or wedge-type elements that can be added to pre-existing geometry, as shown in FIGS. 21A and 21B. For the former, FIGS. 20A and 20B show block $b_4$ added to both blocks $b_2$ and $b_3$. For the latter, FIGS. 21A and 21B show block $b_3$ added to both $b_1$ and $b_2$. In such cases, D is no longer a tree but a true DAG. In a DAG, it is not possible to make a cycle in the graph when following the directional links; further, it is possible to have more than one path from node $F_1$ to $F_j$ ($i \neq j$). While the former characteristic is true for a tree, the latter is not, and hence a DAG is more efficient than a generalized graph, though less efficient than a tree (see, e.g., A. V. Aho, J. E. Hopcroft and J. D. Ullman, *Data Structures and Algorithms*, Addison Wesley Publishing Company, 1983).

Figure 22A:
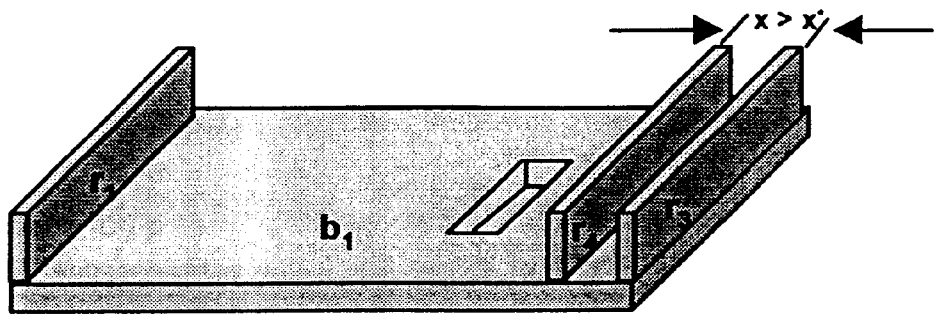
FIGS. 22A and 22B illustrate the user's definition of an explicit constraint (design rule) wherein the distance between two elements is not to fall below a predefined value, and the representation of this constraint as a link on the Design Intent Graph D.
Figure 22B:
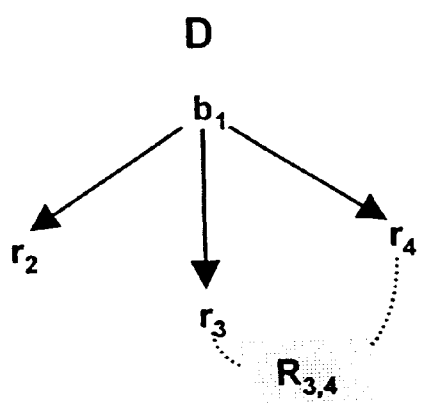

The VDSF Virtual Modeler Layer: Design Rules/ Constraints in the Design Intent Graph D Another role of D is to store the design rules/constraints specified by the designer while creating the design for which the rules apply (examples of such constraints being noted earlier in the discussion of the Design Editing Layer). When a constraint is specified, an instance of it is created and stored as a part of D in the form of an explicit link between the set of shape elements to which it applies. For example, in FIG. 22A, the designer specifies a minimum distance $x^*$ between any two ribs $r_i$ and $r_j$ ($i \neq j$). This constraint is stored in the form of a special link (shown dotted in FIG. 22B for only ribs $r_3$ and $r_4$) and becomes part of the Design Intent Graph information. As with the other portions of D, this link is translated into an appropriate link in S for use in rendering the graphical display. It has been observed that most common design rules/constraints are based on only two shape elements, and VDSF applies this as an assumption. However, VDSF could be modified to allow constraints which extend to three or more shape elements.

The VDSF Virtual Modeler Layer: Nodes in the Design Intent Graph D

Figure 23:
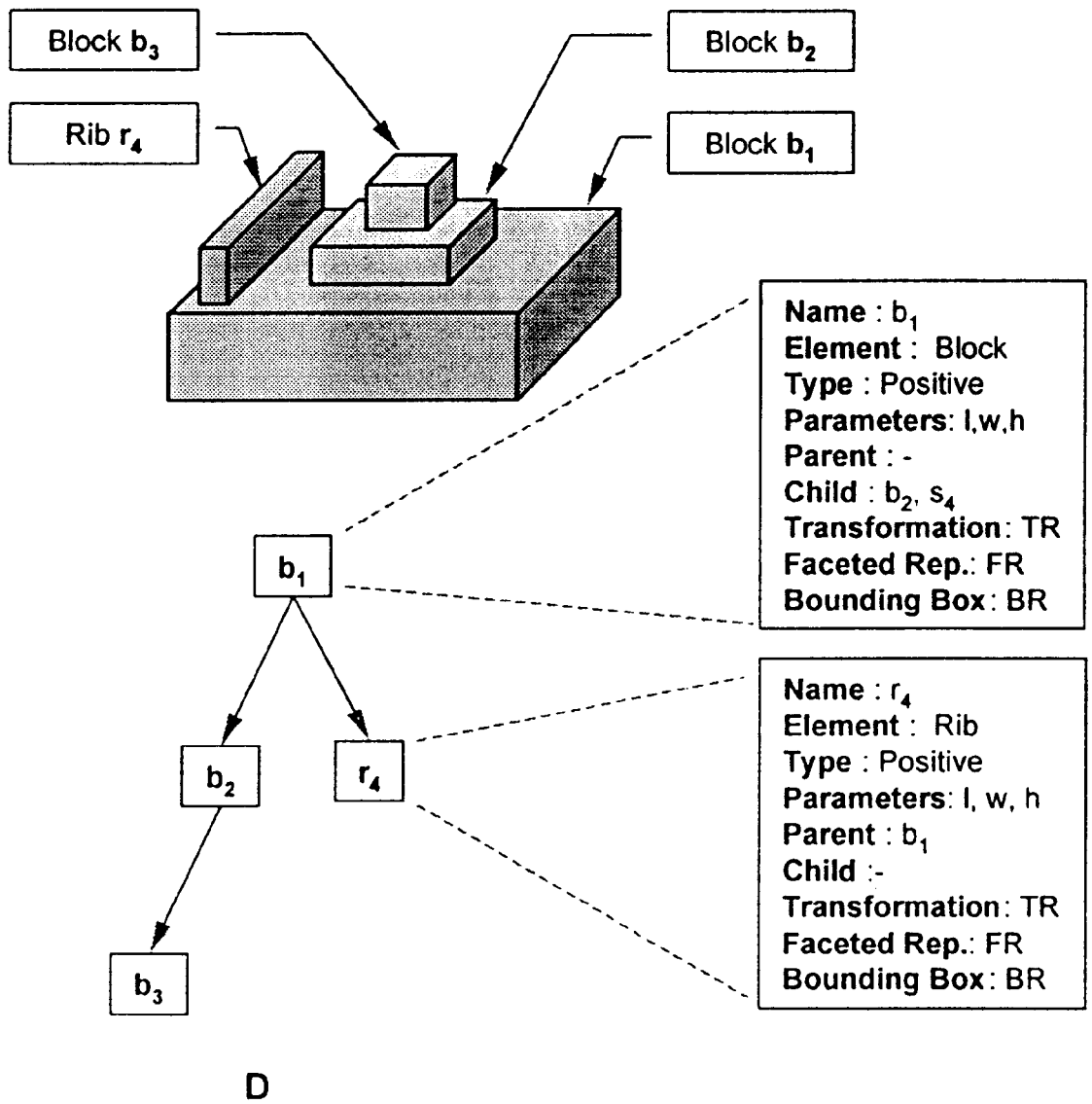
FIG. 23 illustrates a Design Intent Graph D for the illustrated design, along with the node information contained within certain nodes of D.

While the links in D capture the parent/child hierarchy of shape elements and any design constraints concerning the elements, the nodes contain additional geometric information, as illustrated in FIG. 23. The node information includes the name of the element, the type of element, a transformation locating the element with respect to the parent(s), the parameters for the element, a triangular faceted representation of the shape element, and a bounding box aligned with the parent's coordinate system and surrounding the element. While the name, type, and location of the element are generated from user input, the faceted representation is obtained via S (which itself receives the representation from the shape modeler). Once computed, the faceted representation does not require updates unless the dimensions of the element are changed during subsequent interactive editing.

The VDSF Virtual Modeler Layer: Constrained Location, Alignment, and Intersection Detection Operations in the Design Intent Graph D D is capable of fully representing designs in which simple editing has occurred; in other words, the D domain only reflects editing operations which require minimal updates to the detailed geometry of the shape element stored in S. As will be discussed below, simple editing commands fully supported by D include positioning commands such as constrained location, alignment and bounding box-based intersection checks during geometry editing. While the constrained location and alignment commands provide a quick way to position shape elements, the bounding box-based intersection checks provide the ability to detect potential collisions between elements.

The Constrained Location operation is illustrated in FIGS. 24A–24D. Here the constraints are the constraints on the transformations imposed by the parent-child relationship between two elements. For example, in FIG. 24A, $b_2$ is interactively moved to a new location and child $b_3$ stays attached to it. Conversely, the motion of child $b_3$ is independent of its parent $b_2$, as shown in FIG. 24B. FIG. 24C shows that the hierarchy is preserved even if $b_2$ is moved off the face of $b_1$ to which it was originally added. The ability to relocate $b_3$ independently of $b_2$ still remains, as shown in FIG. 24D. In each of these examples, the transformation applied to an element is propagated to all its children, but not to its parent. The constrained motion operation can be achieved by requiring that a selected element follow the intersection point of the Virtual Locator with the faces of the design.

Figure 25A:
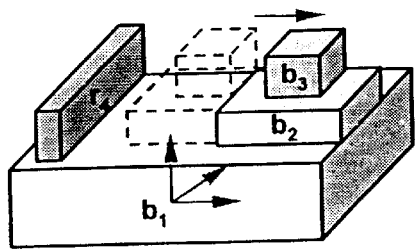
FIGS. 25A–25D illustrate examples of alignment operations enabled by the Design Intent Graph D.
Figure 25B:
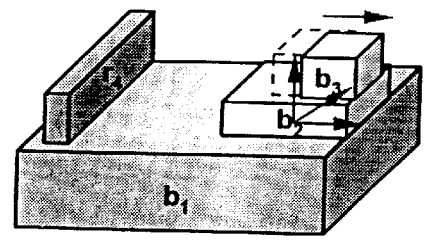
Figure 25C:
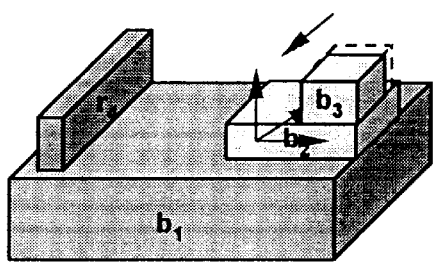
Figure 25D:
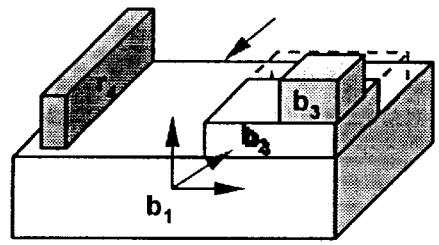

The Alignment Operation provides another means to rapidly relocate elements apart from manually relocating them, with FIGS. 25A–25D illustrating element positioning via alignment operations. FIG. 25A illustrates alignment of $b_2$, a child of $b_1$, in a +X axis fixed on $b_1$. The child $b_3$ of $b_2$ is carried with $b_2$. Similarly, FIG. 25B illustrates alignment of $b_3$ in the +X axis fixed on its parent $b_2$. FIG. 25C illustrates alignment of $b_3$ with its parent $b_2$ in the −Y axis direction, and FIG. 25C illustrates alignment of $b_2$ with its parent $b_2$ in the −Y axis direction. Note that since it is generally difficult for a user to quickly ascertain the coordinate system on an element (e.g., which direction on an element is defined as the +X direction, which is defined as the −X direction, etc.), VDSF uses a coordinate-system independent, user-viewpoint-dependent method of alignment whereby the user issues intuitive commands such as "Align with left edge of [parent element]," "Align with right edge of [parent element]," etc. This utilizes the viewer's current viewing orientation and the orientation of the specified parent's coordinate system to determine the directions corresponding to right, left, front, rear, top, bottom, etc. In other words, the VDSF display viewed by the user is considered as having a right-left/top-bottom/front-rear coordinate system, and when a viewpoint-dependent alignment command is issued (e.g., "Align with right edge of [parent element]"), VDSF determines which of the XYZ coordinate axes fixed on the parent most closely corresponds to the right-left axis of the display. The child element is then moved on the parent along that axis of the parent.

The Intersection Operation performs computationally inexpensive bounding box-based intersection checks between siblings of a single parent. As previously noted, when an element is added to D (when a node is formed in D), a bounding orthogonal box is defined about the element and stored in the node. The distances between spaced bounding boxes of different elements are quickly and easily calculated because all walls are orthogonally oriented. FIG. 26A and 26B illustrate the case where a positive element is rotated, causing it to interfere with another element; this intersection is readily detected with a bounding box-based intersection, check. Since both positive and negative entities are represented in essentially the same manner in D, bounding box-based intersection checks can also be used to detect whether the slot $s_5$ of FIG. 26C, once rotated, is obstructed by element $b_2$ or $r_4$ in FIG. 26D. This would be indicated if the distances between two or more orthogonal planes on the elements' bounding boxes were zero or less: for example, the orthogonal distance between the top face of $s_5$ is zero with respect to the bottom face of $r_4$, and if the orthogonal distance of another face of $s_5$ was zero or less with respect to another face of $r_4$—say, if the orthogonal distance of the left face of $s_5$ was zero or less with respect to the right face of $r_4$—slot $s_5$ would be obstructed. Naturally, a bounding box intersection check is not always exact since bounding boxes may intersect where actual element boundaries do not, but it generally has the benefit of being "conservative" insofar as it will report false intersections more often than false non-intersections. As will be discussed later, more detailed intersection checks can be performed by the S representation; if desired, these can be triggered by a boundary box intersection in D.

The VDSF Virtual Modeler Layer: Complexity of Operations in the Design Intent Graph D An analysis of the operations possible in the D representation show that excluding operations wherein D needs to call to S and the solid modeler (such as for the faceting of the elements in D), all operations are essentially constant time operations (see TABLE 1). Intersection detection could be a potentially expensive operation if utilized continuously during interactive editing.

TABLE 1

SUMMARY OF COMPLEXITY OF OPERATIONS IN D
(N-number of elements, M-number of faces/element)

| Operations in D | Computational Complexity | |
|---|---|---|
| | Best | Worst |
| Locate intersection point | O(M) | O(NM) |
| Bounding box intersection check | O(1) | O(N) |
| Add Element | | |
| Positive | O(1) | O(1) |
| Negative | O(1) | O(1) |
| Edit Element | | |
| Position | | |
| *Location | | |
| Geometry based | O(1) | O(1) |
| View based | O(1) | O(1) |
| *Alignment | O(1) | O(1) |
| Geometry based | O(1) | O(1) |
| View based | O(1) | O(1) |
| Delete Element | O(1) | O(1) |

The VDSF Virtual Modeler Layer: The Shape Modeling Graph S

As noted above, D, typically a tree/DAG structure containing symbolically represented shape elements, has the principal purpose of representing the sequence of design intent steps. While it may also be used for display of relatively simple design steps, its lack of detailed topological relationships between elements and its inability to adequately represent negative entities limits its use for display of many complex design steps of practical interest. Thus, the VDSF also uses the Shape Modeling Graph S, which is significantly more detailed than D and which supports the geometric representation and graphical display of more complex design steps. While being more detailed that D, S is less detailed than the mathematically complete representation provided by a solid modeler, and is more suitable for high-speed interactive editing than the representation contained within a typical solid modeler. To accomplish this, S preserves the parent-child hierarchy of shape elements in D by utilizing nodes representing shape elements, but it provides solid modeler capabilities by storing a boundary representation for each shape element at each node. Maintaining a boundary representation of each element at the local (element) level, rather than at a global (design) level, results in localization of the operations for which S must call to the solid modeler, with accelerated performance in S as a result. S additionally stores (precomputes) auxiliary information between pairs of shape elements $s_i$ and $s_j$ (i≠j) for later use to further speed up interactive design. When shape elements in D are manipulated, explicit pointers map from each $F_i$ in D to the corresponding $s_i$ in S, and the graphics display is updated appropriately.

As its name implies, the Shape Modeling Graph S models a shape as a graph in which the nodes $s_i$ (i=1 ... N) represent the shape elements of the design and the links $I_{j,k}$ (j=1 ... N, k=1 ... N) represent the topological relationships between them. The links/topological relationships between a pair of elements $s_i$ and $s_j$ (i≠j) are of three types: attachment (A), proximity (P), and geometry (G). Of these, the attachment link $A_{j,k}$ (j=1 ... N, k=1 ... N, j≠k) between $s_j$ and $s_k$ typically arises from the "Add On" operation specified by the designer when adding $s_j$ to $s_k$ (or vice-versa). While the attachment link A is typically based on the designer's input (though examples to the contrary will be given later), the proximity link P and geometry link G are "derived" links that are not based on D, but are instead based on the specific geometric characteristics of the design being created. Proximity links $P_{j,k}$ (j=1 ... N, k=1 ... N, j≠k) join pairs of shape elements $s_j$ and $s_k$ and are used to detect intersections between $s_j$ and $s_k$ during interactive editing. Geometry links $G_{j,k}$ (j=1 ... N, k=1 ... N, j=k is valid) contain pre-computed geometric information that enables design modeling without requiring extensive computations during interactive editing.

An important goal of the dual graph representation in the Virtual Modeler Layer is to minimize the complexity and number of computations that are needed during interactive editing so that a higher degree of interactivity can be attained. The lesser the number of geometric computations that need to be performed during any given time-step, the greater the degree of interactivity. The Virtual Modeler Layer reduces the computations required by pre-computing geometric information that is anticipated to be required during interactive editing. Also, the geometric information available in a given time-step is used to simplify computations in the next time-step, the assumption being that there is an incremental change in the model from one time-step to the next. The Virtual Modeler achieves these functions by use of the A (Attachment), P Proximity) and G (Geometry) links, which are explained in the following sections.

Figure 27:
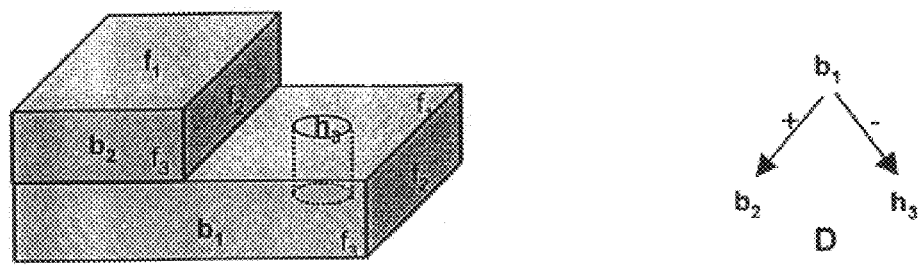
FIG. 27 illustrates an exemplary design and its corresponding Design Intent Graph D.
Figure 28:
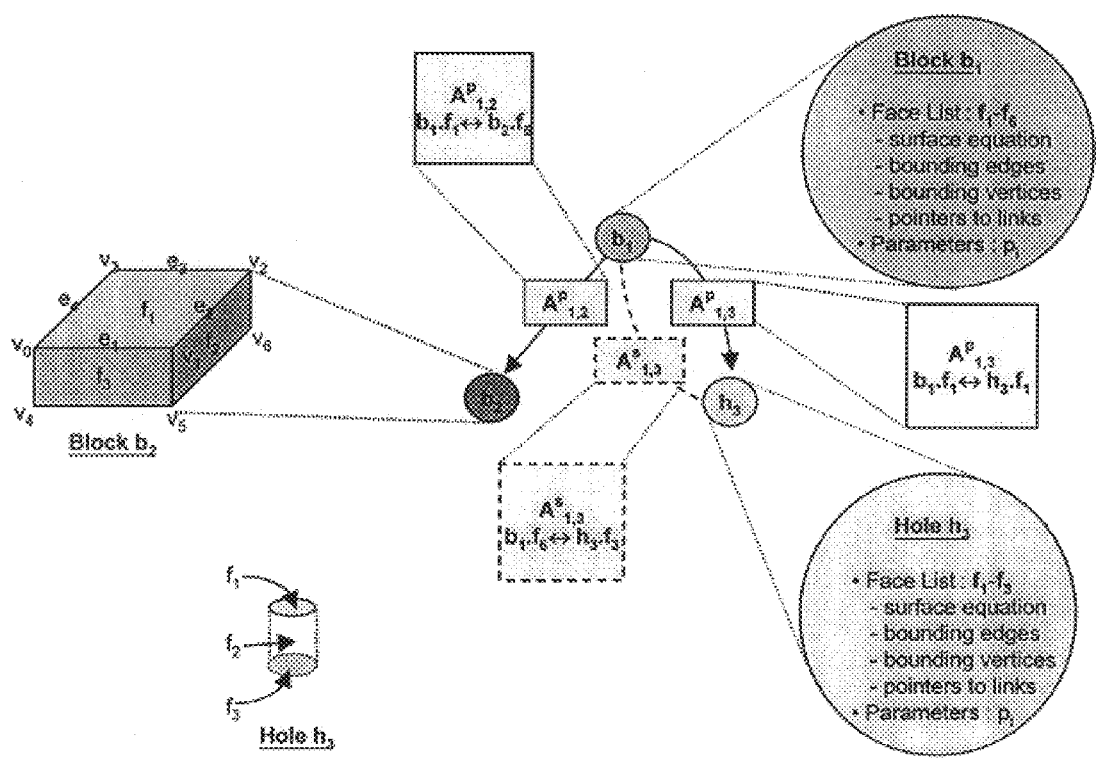
FIG. 28 illustrates a partial Shape Modeling Graph S (only attachment links A being shown) for the design shown in FIG. 27.

The VDSF Virtual Modeler Layer: Nodes and Links in the Shape Modeling Graph S The geometric information in S is composed of boundary representations of the individual nodes $s_i$, i.e., the various entities making up the overall design. The topological structure of S preserves the hierarchy of shape elements in D and includes additional information which takes the form of Attachment A, Proximity P, and Geometry G links between nodes $s_i$ and $s_j$. To initially illustrate the nodes and links in S, the D and S graphs for an exemplary design are shown in FIGS. 27 and 28. As shown in FIG. 27, the design includes two stacked positive block elements $b_1$ and $b_2$, and a negative cylinder element $h_3$ forming a hole in block $b_1$. The Design Intent Graph D is also shown for this arrangement. FIG. 28 then shows the corresponding Shape Modeling Graph S. In reality, only a partial graph S is shown; for clarity, some element/node information and links are omitted, as will be evident from the following discussion. Within S, each element/node $s_i$ (block elements $b_1$ and $b_2$, and cylinder element $h_3$) is represented by a list of the faces $f_k$ (k=1 ... F), edges $e_k$ (k=1 ... E), and vertices $v_k$ (k=1 ... V) that bound the element, their topological interrelationships, and a list of parameters appropriate for that type of element (exemplary parameters being illustrated in FIG. 7 in conjunction with the elements they characterize). (Note that only the node structure for elements $b_1$ and $h_3$ is illustrated for sake of clarity.) Each face $f_k$ (of each element $s_i$) is cross-referenced to its relevant A, P, and G links $I_{i,j}$ (and vice-versa) by pointers. Thus, the positive block $b_1$ is represented by its boundary representation, parameters, and pointers to links that originate or terminate at it (only certain attachment links $A^P_{1,2}$, $A^P_{1,3}$ and $A^s_{1,3}$ are shown; P and G links, as well as the meaning of the attachment link terminology $A^P$ and $A_s$, will be discussed later). The hole is formed in block $b_1$ by adding the negative cylinder $h_3$, which has a top face $f_1$, a bottom face $f_2$, and a cylindrical side face $f_3$. While $f_2$ and $f_3$ form part of the hole representation, they are not displayed in the design since they are part of a negative entity; however, $f_1$ is displayed since this face of the hole is visible. The fact that $h_3$ is a negative entity is stored in the $A^P_{1,3}$ link and this information is used when the top face of $b_1$ is displayed (i.e. it is used to denote that $f_1$ of $b_1$ has a circular hole in it). Similarly, the $A^s_{1,3}$ link enables the correct display of the bottom face $f_6$ of $b_1$.

The hierarchy in S, which is derived from D, enables interactive positioning of shape elements in space as well as localization of editing operations (i.e., computations can be performed on specific portions of the design, rather than on the entire design globally). This hierarchy simplifies the task of interactive repositioning of elements, particularly when coupled with constraints provided in the Design Editing Layer. Of these, two constraints are particularly helpful:

Constraint 1: Requiring that a child node stays attached to the parent node, i.e., changing the position of a parent node causes all child nodes to move along with the parent. (However, the reverse is not true, i.e., child elements can be positioned independently of parent elements.)

Constraint 2: The motion of a child element is restricted such that the child element lies on the face of the parent element. This face is typically the one to which the child element is attached.

Figure 29A:
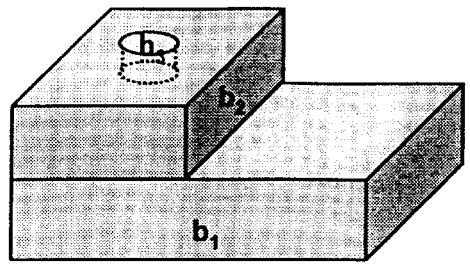
FIGS. 29A and 29B illustrate an exemplary design wherein elements are being edited (moved) therein, and the corresponding Design Intent Graph D and Shape Modeling Graph S (the appearance of the graphs being the same for the model both prior to and after editing, though information stored in the graph links may be changed).
Figure 29A:
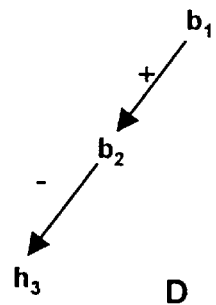
Figure 29B:
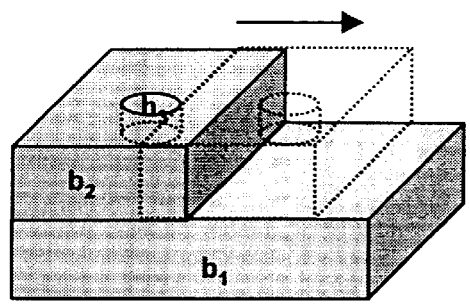
Figure 29B:
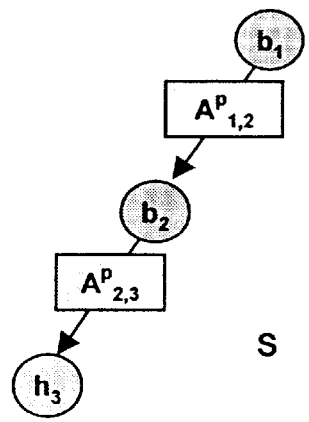

These constraints are illustrated in FIGS. 29A and 29B. In FIG. 29A, block $b_2$ (a child of $b_1$) is interactively repositioned (as shown by the arrow in FIG. 29B). Block $b_2$ is constrained to stay in contact with $b_1$ at all times, and its child (blind hole $h_3$) moves with it. However, its parent $b_1$ is not affected.

The VDSF Virtual Modeler Layer: Attachment Links A in the Shape Modeling Graph S The attachment link A is the fundamental link in S that is used to represent the addition of an element $s_i$ to an existing element $s_j$ in S. The function of A in S is to enable geometric representation of the design, as well as its graphical rendering, without explicitly performing extensive boundary evaluations at every time step (as is done in conventional solid modelers). The attachment links therefore assist in enabling rapid graphical updates and interactive editing of designs.

An attachment link A between elements/nodes $s_i$ and $s_j$ contains the following information about $s_i$ and $s_j$:

(1) The specific mating/attachment faces of $s_i$ and $s_j$ ($f_{si}$ and $f_{sj}$ respectively, $f_{si}$ being the face of $s_i$ on which $s_j$ was added, $f_{sj}$ being the corresponding mating face of $s_j$);

(2) A transformation that locates $s_i$ on face $f_{sj}$, used to position $s_i$ on $f_{sj}$.

(3) The type of A link, a primary attachment link $A^P$ or a secondary attachment link $A^s$.

The mating faces $f_{si}$ and $f_{sj}$ are implicitly defined by the addition of $s_i$ to $s_j$, since this is typically specified by the designer when adding $s_i$ to $s_j$. The transformation locating $s_i$ on face $f_{sj}$ is based on the position of $s_i$ indicated by the designer's input. The type of link between $s_i$ and $s_j$ in S is determined by the existence of a corresponding directed link between $F_i$ and $F_j$ in D (assuming that s, maps to $F_i$ and $s_j$ maps to $F_j$). Typically, when one feature $F_i$ is added to another feature $F_j$, there exists only one such directed link between $F_i$ and $F_j$ in D which forms the basis of the primary attachment link $A^P$ between $s_i$ and $s_j$ in S. This link $A^P$ in S is called a primary attachment link since this is the "primary" link by which $s_i$ is attached to $s_j$, as specified by the designer (and as reflected in D). Note that for designs containing certain types of elements, such as bridge and wedge type elements (examples of which were given earlier), more than one $A^P$ exists.

Figure 30:
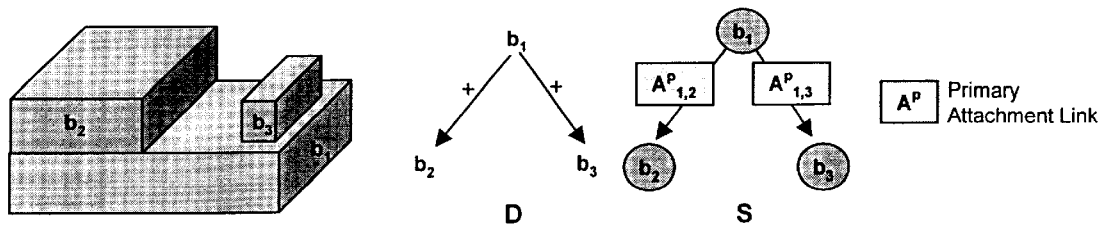
FIG. 30 illustrates an exemplary design along with its D and S graphs, showing the use of primary attachment links $A^p$ in S.

Some examples of primary attachment links $A^P$ for a sample design are shown in FIG. 30. In this example, the designer adds $b_2$ to $b_1$, and this is reflected in D. The link $A^P_{1,2}$ between $b_1$ and $b_2$ in S captures this relationship between the mating faces of $b_1$ and $b_2$, and is a primary link since the addition of $b_2$ on $b_1$ is specified explicitly by the designer. A similar link $A^P_{1,3}$ for $b_3$ on bi is also shown. Based on these examples, it is seen that in general there exists one $A^P_{i,j}$ per pair of mating faces of two shape elements $s_i$ and $s_j$.

As opposed to the primary attachment link $A^P$, which is directly derived from D, the secondary attachment link $A^s$ is system-generated by the Virtual Modeler Layer. Such system-generated links are needed to accurately model the piercing of positive shape elements by negative entities such as holes. These links are called "secondary" since they are typically not specified by the designer (and hence have no analog in D), and are derived based on the geometric properties of the elements in S. $A^s$ must be computed in order to display certain types of negative entities, such as the through-hole $h_3$ in $b_1$ shown in FIG. 31. The advantage of $A^s$ is essentially the same as $A^P$, i.e., it allows local computation (it avoids recomputing the boundary of the entire model during each time-step), while ensuring the accurate graphical rendering of models with negative entities.

Figure 31:
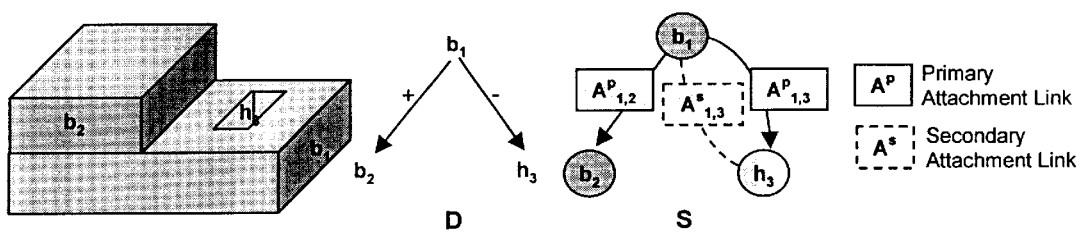
FIG. 31 illustrates an exemplary design having a hole included therein (i.e., having an element subtracted/a negative entity added), along with its D and S graphs, showing the use of secondary attachment links $A^s$ (as well as primary attachment links $A^p$) in S.

In FIG. 31, primary attachment link $A^P_{1,3}$ reflects the intent in D (hole $h_3$ added to $b_1$). $A^s_{1,3}$, a secondary attachment link, is a system-generated to capture the piercing of the through-hole on the bottom face of $b_1$. The presence of $A^s_{1,3}$ allows the bottom face of $b_1$ to be correctly graphically rendered (i.e., with a rectangular hole). This is achieved by local computation, i.e., without having to globally recompute the boundary of the entire solid model of the design. (Other links which reduce computational burden and which are relevant to the modeling of through-holes, such as the geometry links G, are explained later.)

Figure 32:
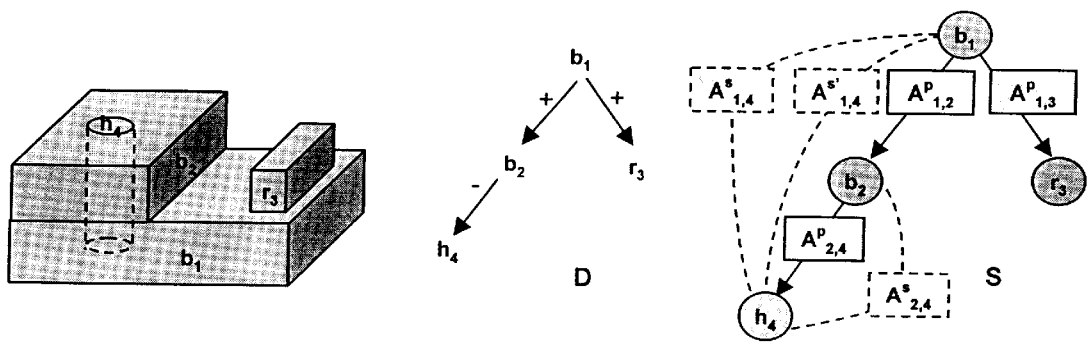
FIG. 32 illustrates an exemplary design having a hole through two entities, along with its D and S graphs, further showing the use of primary attachment links $A^p$ and secondary attachment links $A^s$ in S.

While the previous example illustrated the construction of the secondary link for a through-hole passing through one element, the example of FIG. 32 illustrates the addition of a through-hole $h_4$ that pierces two elements $b_1$ and $b_2$. The piercing of the two faces of $b_1$ (the top and bottom faces) is represented by the two secondary links between $h_4$ and $b_1$ ($A^s_{1,4}$ and $A^s_{1,4}$ respectively). Since the hole $h_4$ visibly pierces the top face of $b_2$, primary link $A^P_{2,4}$ is included, and since $h_4$ also pierces the bottom face of $b_2$, an additional secondary link $A^s_{2,4}$ is formed in S.

The VDSF Virtual Modeler Layer: Proximity Links P in the Shape Modeling Graph S Proximity links are primarily used to enable the detection of intersections between $s_i$ and other element(s) $s_j$ ($i \neq j$, $i=1 \ldots N$, $j=1 \ldots N$) during interactive editing of $s_i$. In the VDSF, intersections between elements, once detected, may be allowed or disallowed by the designer. The rationale for doing this is that when a geometric element (e.g., a rib) is added to a prior element (e.g., a block), it is added to serve a specific function. More often than not, the designer will not want the rib to intersect any other feature on the block; the designer may want it to attach to another element (have the surfaces of the elements mate), but he/she will generally not want one to "pierce" the other. This implies that if $s_i$ and $s_j$ are created, and if interactive relocation of $s_i$ or $s_j$ results in a potential intersection between them, such intersections should be detected. Once an intersection is detected in VDSF, the designer may choose to allow or disallow the intersection, and D and S are appropriately updated.

Ideally, such intersections should be detected in real-time so that graphical computation of the edited geometry and visual feedback to the designer can be (practically) instantaneously provided, thereby advancing the goal of increased interactivity. In S, this high-speed intersection detection is done via proximity links $P_{i,j}$, which are formed between all pairs of elements $s_i$ and $s_j$ wherein $i \neq j$, $s_i$ is not a parent of $s_j$, and $s_j$ is not a parent of $s_i$ (i.e., between all element pairs wherein the elements are not in a parent-child relationship). $P_{i,j}$ stores the minimum distance $d_{i,j}$ between the convex hulls $h_i$ and $h_j$ of $s_i$ and $s_j$ for the purpose of high-speed distance checking. As will be discussed later, determining the minimum distance between the convex hulls of objects involves significantly less computational burden than performing an actual intersection determination between the objects themselves. The preferred method of intersection detection is as follows:

(1) Convex hull distance calculation: At any given time-step, all $d_{i,j}$'s (the minimum distances between convex hulls) are computed between the element $s_i$ currently being edited and all other elements $s_j$ which are neither parents nor children of $s_i$. The $s_j$'s ($i \neq i$) are then ranked based on an increasing value of $d_{i,j}$. This ranking is stored in $s_i$ ($i \neq j$) so that if $s_i$ is further edited at the next time-step, only the most proximal $s_j$ candidates from this ranking (those with lowest $d_{i,j}$) are checked for intersection. The number of proximal $s_j$'s that are checked for intersection is a variable that can be initialized in the system.

(2) Convex hull intersection test: If $d_{i,j}$ becomes less than a predefined threshold value (e.g., the minimum dimension of $s_i$ or $s_j$), an intersection check between convex hulls $h_i$ and $h_j$ is performed as a second-level intersection check. If $h_i \cap h_j \neq$ NULL, there is a possible intersection between $s_i$ and $s_j$. (Note that if desired, to reduce later computational burden and increase speed, the convex hull of an element can be precomputed and stored as part of its node information.)

(3) Boundary intersection test: To confirm intersections between $s_i$ and $s_j$, an intersection test (test for $s_i \cap s_j$) between the boundary representations of $s_i$ and $s_j$ is required—a calculation which must be performed by the solid modeler. This is generally computationally expensive, having time $O(n^2)$ where n is the nominal number of entities (vertices, edges and faces) in $s_1$ (or in $s_j$).

Thus, distance checks based on $P_{i,j}$'s reduce the computationally expensive $s_i \cap s_j$ determination by performing it only when necessary. In effect, the ranking of $P_{i,j}$'s translates geometric proximity between elements to topological proximity in the Shape Modeling Graph S. This potentially reduces the number of entities to be traversed and/or searched, with the additional advantage of being faster than corresponding checks in geometric space.

The VDSF Virtual Modeler Layer: Categories of Proximity Links P

In addition to using the foregoing method of intersection detection to reduce computing time, an alternative or additional heuristic that may be utilized to reduce the search space for potential intersections is based on the observation that given three entities $s_i$, $s_j$ and $s_k$ ($s_i$ being the active entity which is being added/subtracted/edited), if $s_j$ is closer to $s_i$ than $s_k$ in the topological graph space (i.e., in S), it is in general also closer to $s_i$ in the geometric space. This means that an intersection is more likely to occur between entities that are closer in the topological space of S than between entities that are further apart in S. Therefore, if $s_j$ is closer to $s_i$ than $s_k$ in S, $s_j$ should be checked for intersection before $s_k$.

Based on this topological distance heuristic, the shape elements in S can be grouped into the following three categories:

Proximity Category 1: All $s_j$ ($j \neq i$, $j=1 \ldots N$) whose parent attachment face is the same as the parent attachment face of $s_i$ (i.e., same parent, same parent face);

Proximity Category 2: All $s_j$ ($j \neq i$, $j=1 \ldots N$) not in Proximity Category 1 whose parent is the same as the parent of $s_i$ (i.e., same parent, different parent face); and Proximity Category 3: All $s_j$ ($j \neq i$, $j=1 \ldots N$) that do not belong to Proximity Category 1 or Proximity Category 2 (i.e., different parent).

Figure 33:
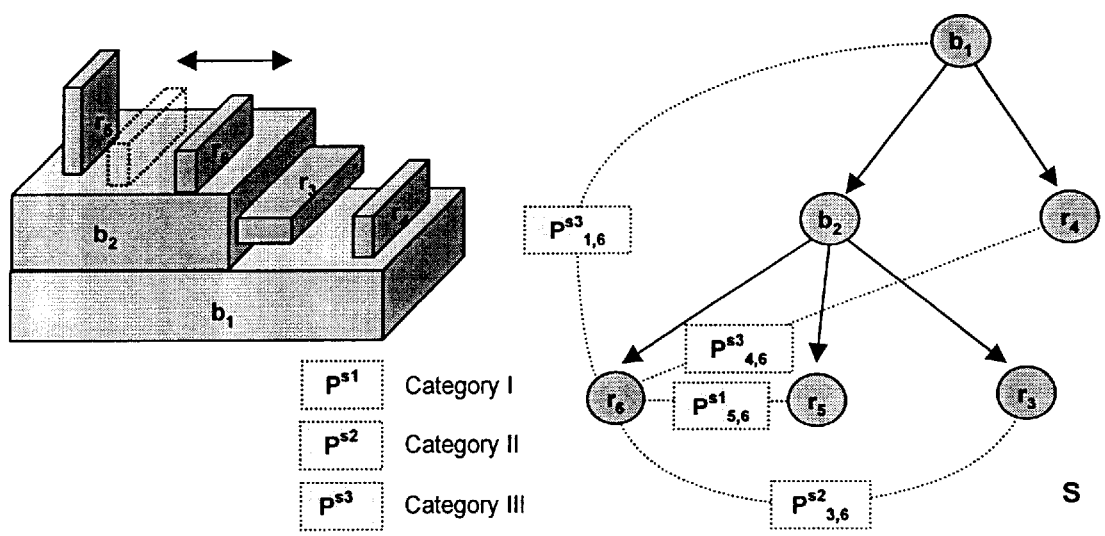
FIG. 33 illustrates an exemplary design with its Shape Modeling Graph S, showing the use of soft proximity links $P^s$ (for only element $r_6$) in S.

This results in every $P_{i,j}$ being placed in one of these three proximity categories, which are denoted $P^{s1}_{i,j}$, $P^{s2}_{i,j}$, and $P^{s3}_{i,j}$, with the numbers in the superscripts referring to their respective proximity categories. (The "S" set forth in each superscript refers to the proximity links being soft, the meaning of which will be discussed later.) An illustration is shown in FIG. 33, wherein $r_6$ ($i=6$, $s_{i=r6}$) is being edited and the various $P_{j,6}$'s ($j \neq 6$) for $r_6$ are shown. Since the distance between $r_6$ and $b_2$ is zero, $P_{2,6}$ contains a distance of zero (and hence is not shown). FIG. 33 shows a Category 1 proximity link ($P^{s1}_{5,6}$) between $r_5$ and $r_6$, since $r_5$ and $r_6$ share the same parent face; a Category 2 proximity link ($P^{s2}_{3,6}$) between $r_3$ and $r_6$, since $r_3$ and $r_6$ share the same parent (but not the same parent face); and two Category 3 links, the first between $r_4$ and $r_6$ ($P^{s3}_{4,6}$) and the second between bi and $r_6$ ($P^{s3}_{1,6}$).

As illustrated by this example, the following heuristic can be inferred: when $s_i$ is edited, Proximity Category 1 intersections are most likely followed by those in Proximity Category 2, and subsequently by Proximity Category 3 intersections. To explain another way, elements that share a parent face are more likely to intersect each other than elements on other faces, and elements lying on a single element are more likely to intersect than elements that do not.

Figure 34A:
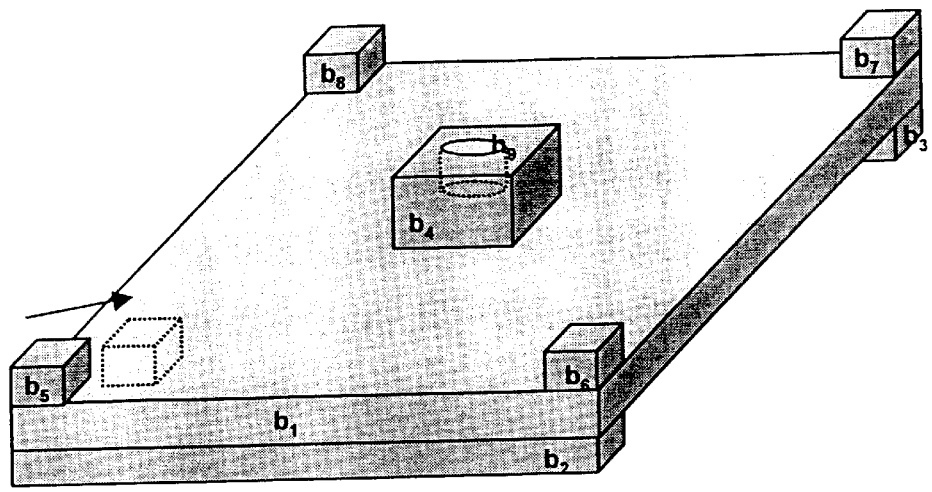
FIGS. 34A and 34B illustrate an exemplary design with its Shape Modeling Graph S, showing the use of soft proximity links $P^s$ (for only element $b_5$) in S.
Figure 34B:
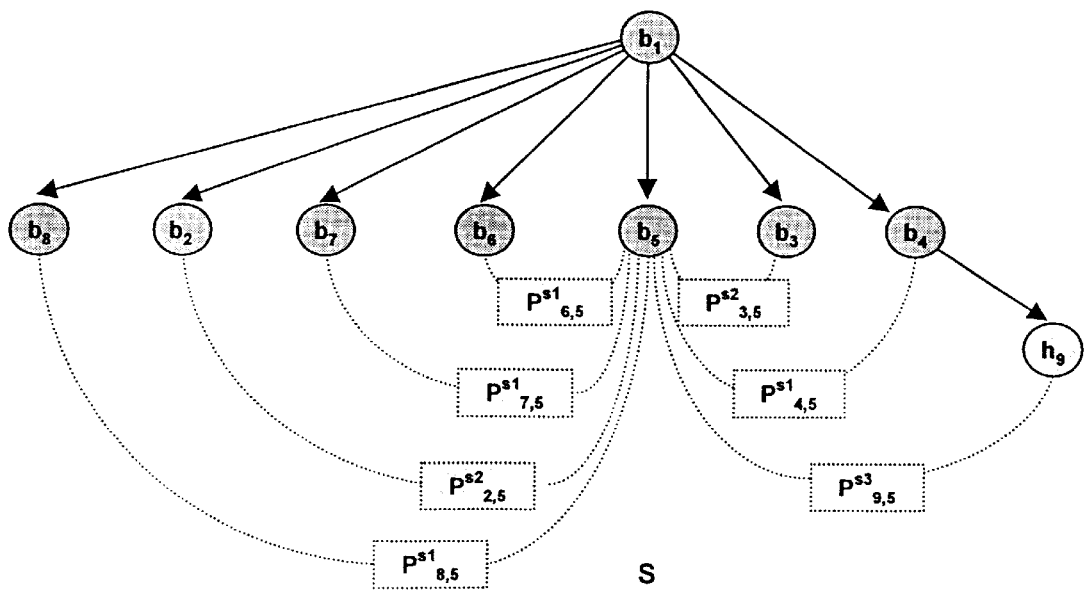

Another illustration of this heuristic is shown in FIG. 34A, where element $b_5$ is being edited. FIG. 34B shows the P links for $b_5$ in S at this time step. When $b_5$ is interactively relocated, it is necessary to determine if it intersects any other elements in the model at any time step. To do this, Proximity Category 1 $P_{j,5}$'s ($j=4, 6, 7, 8$) from the previous time-step (in this case, $P_{4,5}$, $P_{6,5}$, $P_{7,5}$, $P_{8,5}$) are first checked for intersection. This is followed by checking Proximity Category 2 links ($P_{2,5}$, $P_{3,5}$) for intersection, and then Proximity Category 3 links ($P_{9,5}$) for intersection (assuming that time is available). The intersection tests are preferably done in the manner previously noted, i.e., within each Proximity Category, convex hull distance checks are done for the Category's elements in ranked order, etc. It is possible that in some cases, some intersections may not be detected because insufficient time is available; however, by performing the distance checks in the aforementioned manner, the probability of missed intersections is greatly decreased.

The VDSF Virtual Modeler Layer: Soft Proximity Links $P^s$ and Hard Proximity Links $P^h$ As previously noted, the purpose of the proximity links is to store the minimum distance between $s_i$ and all $s_j$ ($j=1 \ldots$ N, j≠i). This distance is used to create a sequence of $s_j$ in increasing order of $d_{i,j}$ (j=1 . . . N, j≠i) within each Proximity Category, this sequence being stored in $s_i$. These proximity links may be referred to as soft proximity links ($P^s_{i,j}$) because they enforce system-generated constraints (such as $s_i$ and $s_j$ not to intersect, i≠j) which can be over-ridden by the designer during interactive editing. The modifier soft is used because the constraints can be overridden.

Figure 35:
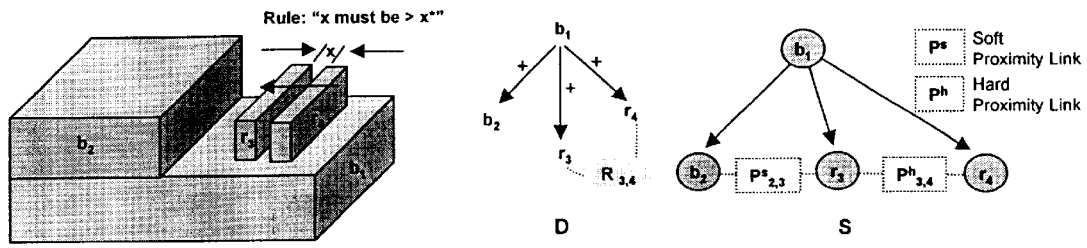
FIG. 35 illustrates an exemplary design wherein an explicit design constraint applies (distance between two elements is to exceed a predefined value), along with its D and S graphs, showing the constraint reflected in a hard proximity link $P^h$.

Another type of proximity link is the hard proximity link, $P^h_{i,j}$. This is a special type of soft proximity link $P^s_{i,j}$ that incorporates a distance-based constraint that must always be satisfied (hence the modifier hard). This distance-based constraint (which could be a minimum distance constraint or a maximum distance constraint) is typically specified by the designer in D in the form of an explicit design rule (as previously discussed in relation to the Design Editing Layer). This rule applies a constraint to the distance between $s_i$ and $s_j$ (i≠j) and is stored in the $P^h_{i,j}$ link. To illustrate, in FIG. 35, the hard proximity link $P^{h1}_{3,4}$ stores the constraint that ribs $r_3$ and $r_4$ are to be kept at a minimum distance $x^*$ from each other. This constraint is specified via a design rule in D (shown as $R_{3,4}$). During interactive editing, if the distance between the ribs (x) becomes less than $x^*$ (i.e., if $x<x^*$), this violation of the rule is detected by $P^{h1}_{3,4}$ and the designer is warned about an impending design violation. Finally, for completeness, the corresponding soft link ($P^{s1}_{2,3}$) between $b_2$ and $r_3$ is also shown.

The VDSF Virtual Modeler Layer: Proximity Links and Intersections

While $P^s_{i,j}$ enables detection of intersection between $s_i$ and $s_j$, once an intersection is determined to have occurred, appropriate action needs to be taken, i.e., D and S must be updated to reflect the modified geometry. Depending upon the Proximity Category of $P_{i,j}$ between $s_i$ and $s_j$, the intersection can be of two types:

(1) $I^a$, an intra-face intersection between $s_i$ and $s_j$ (i.e., $s_i$ and $s_j$ are linked by a $P^{s1}$), or (2) $I^r$, an inter-face intersection between $s_i$ and $s_j$ (i.e., $s_i$ and $s_j$ are linked by a $P^{s2}$ or $P^{s3}$).

As stated earlier, once an intersection (of type $I^a$ or $I^r$) is detected, the designer is warned before being allowed to proceed because there exists a potential violation of the design intent. If the designer decides to proceed with editing the shape, the D and S are appropriately modified as follows.

Figure 36A:
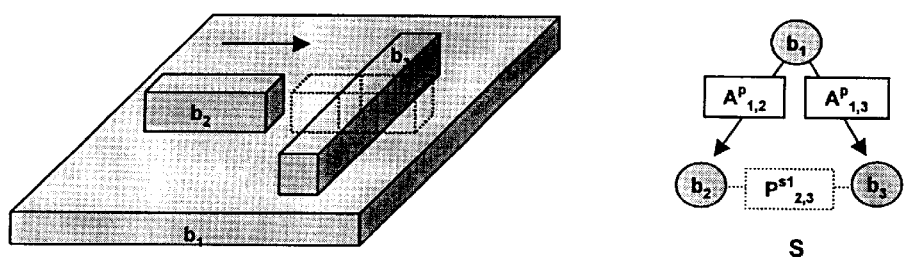
FIGS. 36A and 36B illustrate S graphs resulting from an intra-face element intersection (i.e., both elements intersect on the same parent) before and after splitting is applied (i.e., before and after the elements are decomposed into new disjoint elements).
Figure 36B:
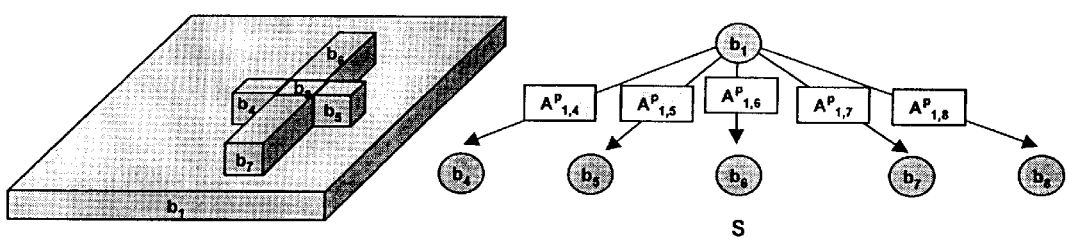

The VDSF Virtual Modeler Layer: Proximity Links and Intra-face Intersections $I^a$ For an $I^a$ intersection between $s_i$ and $s_j$, the modification of S is based on a procedure called splitting, which decomposes $s_i$ and $s_j$ into disjoint sub-elements. This is illustrated in FIG. 36A, where $b_2$ is interactively relocated so as to intersect $b_3$. Once the intersection is detected, $b_2$ and $b_3$ are decomposed into five smaller block elements ($b_4$ through $b_8$) as shown in FIG. 36B (the corresponding S is also shown). The resulting five disjoint elements in S are treated as new block elements, and the original $b_2$ and $b_3$ (in S) are discarded. This is because the intersection of $b_2$ and $b_3$ requires that S be recomputed for accurate graphical display, and since the original $b_2$ and $b_3$ are insufficient for this purpose, the model itself is updated.

The result of splitting changes the nature of the originally added geometry, which therefore requires that D be modified. The designer must select from one of the following choices as being the resultant D (depending on the desired intent):

(1) Five separate elements (i.e., the result of splitting—$b_4$ through $b_8$);

(2) The original elements—$b_2$ and $b_3$; and (3) A single "new" element containing all the elements $b_4$ through $b_8$.

Figure 37:
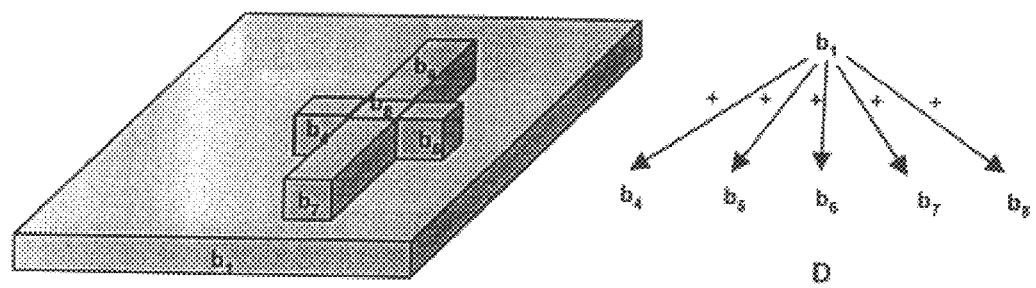
FIG. 37 illustrates the Design Intent Graph D resulting from the use of splitting in the model of FIGS. 36A and 36B.
Figure 38:
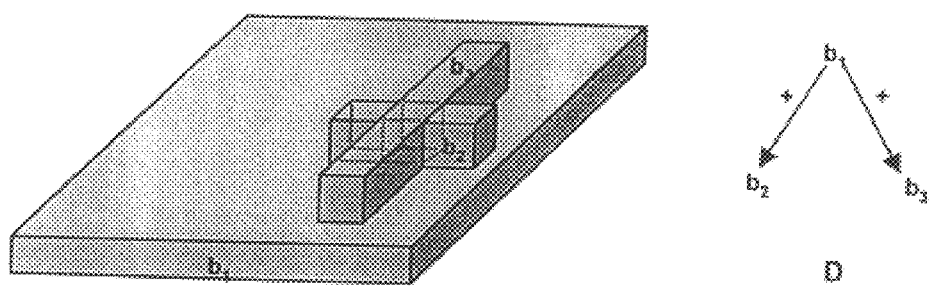
FIG. 38 illustrates the Design Intent Graph D where splitting is not applied in the model of FIGS. 36A and 36B.
Figure 39:
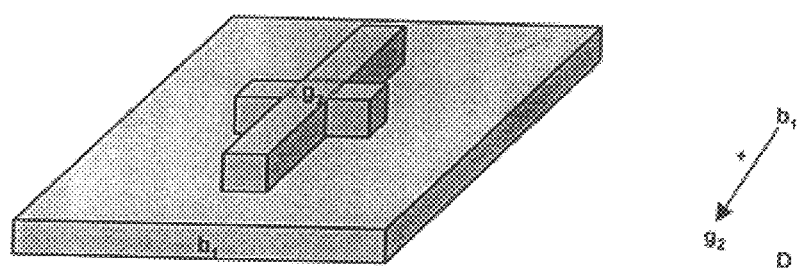
FIG. 39 illustrates the Design Intent Graph D where grouping is applied in the model of FIGS. 36A and 36B.

These interpretations and the corresponding D's are shown in FIGS. 37 through 39 respectively. While the first interpretation is similar to the representation of S, i.e. five separate sub-elements, the second and third interpretations are quite different. The second interpretation, which utilizes the two original entities, treats the two elements independently of their intersection. The third interpretation requires a procedure called grouping which allows the designer to treat the resultant entity as a single entity but only in D, i.e., S remains unchanged from the results of the splitting procedure described earlier. This illustrates the fact that regardless of the interpretation by the designer, S is always the same. The mapping that exists between each $F_i$ in D to one or more $s_j$'s in S allows corresponding modification of the nodes in S depending on the interpretation chosen:

Interpretation 1: $D.b_4$ maps to $S.b_4$; $D.b_5$ maps to $S.b_5$; and soon.

Interpretation 2: $D.b_3$ maps to $S.b_6+S.b_8+S.b_7$; $D.b_4$ maps to $S.b_4+S.b_8+S.b_5$.

Interpretation 3: $D.g_1$ maps to $S.b_4+S.b_5+S.b_6+S.b_7+S.b_8$.

The VDSF Virtual Modeler Layer: Proximity Links and Inter-face Intersections $I^r$ As opposed to the $I_a$ intersection, which results in new geometric entities being created, $I_r$ intersections typically result in the formation of new A links from P links. This is illustrated in FIG. 40A, which shows two examples of interactive editing of a shape resulting in the same local topology for $c_7$. The basic topology of the shape (prior to editing, and showing only $A^p_{5,7}$) is illustrated in FIG. 40B.

Figure 40E:
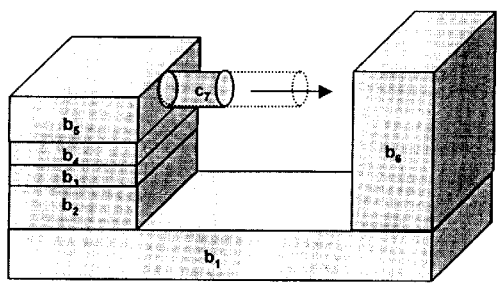
Figure 40E:
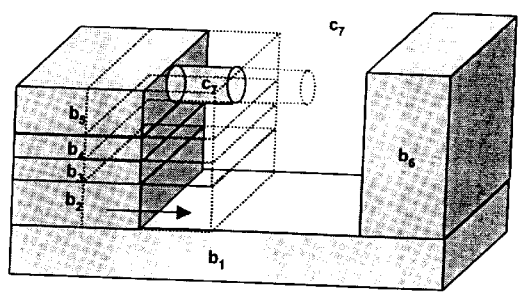
Figure 40E:
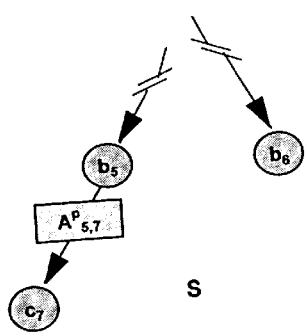
Figure 40E:
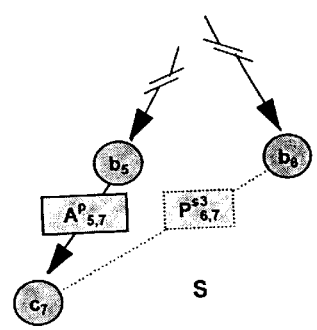
Figure 40E:
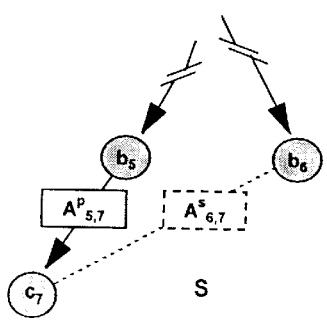

In Case I of FIG. 40A, the length of cylinder $c_7$ is modified so that it finally intersects $b_6$. In Case II of FIG. 40A, the same resultant topology for $c_7$ is obtained by moving block $b_2$ as illustrated until cylinder $c_7$ finally intersects $b_6$. In either case, when $c_7$ is edited so that $c_7$ approaches $b_6$, $P^{s3}_{6,7}$ is updated and moved up in ranking based on $d_{6,7}$(S being shown in FIG. 40C). If the distance between $c_7$ and $b_6$ becomes zero ($P_{6,7}$ contains $d_{6,7}=0$), a warning message is provided to the designer about the intersection of $c_7$ and $b_6$. If the designer allows the intersection to occur, $P^{s3}_{6,7}$ (shown in FIG. 40D) is updated to become a secondary attachment link $A^s_{6,7}$ (as in FIG. 40E) since now there exists contact between $b_6$ and $c_7$. This link is secondary because the original intent of the designer was to add $c_7$ to $b_5$ only, and not to $b_6$.

The VDSF Virtual Modeler Layer: Geometry Links G

A geometry link G stores pre-computed geometric information required for interactive modeling. Such information is computed for each $s_i$, or between $s_i$ and $s_j$ (i≠j). Pre-computation of geometry allows high-speed interactive editing by virtue of avoiding the need to perform computationally expensive calculations at the time of editing. Examples of such computations include opposite face determination (e.g., for addition of through-holes), or parallel face determination (e.g., for the addition of bridge elements between two elements). Examples of opposite and parallel face geometry links follow; however, it should be understood that other types of geometry links (e.g., between other types of surfaces) can also be defined based on the need of the application.

Figure 41:
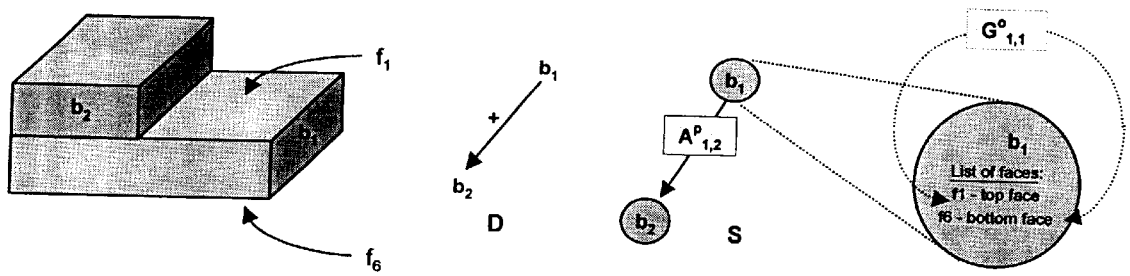
FIG. 41 illustrates an example of an opposite face geometry link $G^o$ listing the opposing faces in element $b_1$ (only a partial list being illustrated).

FIG. 41 shows an "opposite face" geometry link $G^o$ (the superscript "o" indicating that the link is for an opposite face relationship) for node $b_1$ of S. The link $G°_{1,1}$ relates $b_1.f_1$ and $b_1.f_6$ as opposite faces. Similar links are constructed for all pairs of faces in $b_1$ (though these are not illustrated in FIG. 41 for sake of clarity). Thus, all $G°$ links start and end on a single node. Pre-computation of opposite faces is useful because in general, when a through-hole is added to an entity, its most common orientation is perpendicular to the face (and thus intersects the opposite face). Pre-computing the opposite face relation and storing it, rather than performing the opposite face determination during editing, enables a higher degree of interactivity (particularly in a time-critical VE environment).

Figure 42:
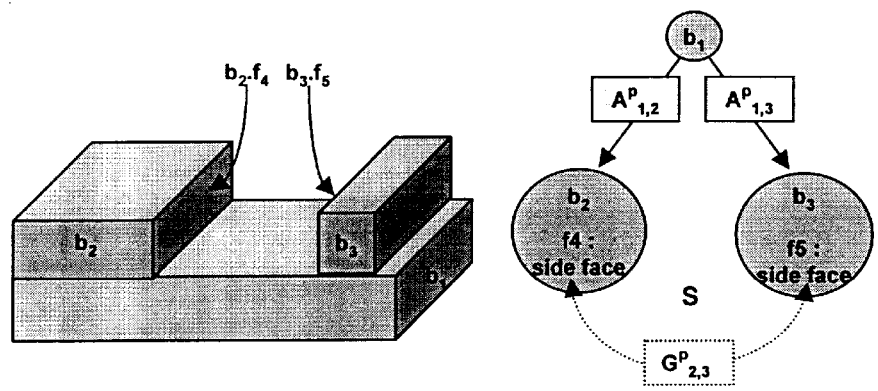
FIG. 42 illustrates an example of parallel face geometry link $G^p$ listing parallel opposing faces between elements $b_2$ and $b_3$.
Figure 43:
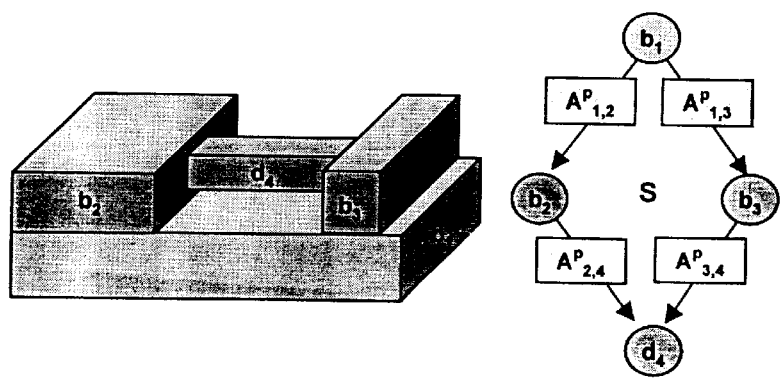
FIG. 43 illustrates the resulting change in the Shape Modeling Graph S of FIG. 42 when a bridge element $d_4$ is added between elements $b_1$ and $b_3$.

FIG. 42 then illustrates a "parallel face" geometry link $G^P$ (the superscript "p" indicating that the link is for a parallel relationship between the faces of two distinct elements), more particularly, $G^P_{2,3}$ illustrates that $b_2.f_4$ is parallel to $b_3.f_5$. This information is precomputed and the geometry link $G_{p2,3}$ is stored between $b_2.f4$ and $b_3.f_5$ for use during subsequent editing. An example of such an edit is shown in FIG. 43, wherein $d_4$ is added to $b_2.f_4$ and is then extended until it touches $b_3.f_5$ to form a bridge element. Comparing FIGS. 42 and 43 for such a construction, the geometry link with the parallel face allows determination of the affected face of $b_3$ (i.e., the face of $b_3$ to be intersected by $d_4$) in a single topological step.

Figure 44A:
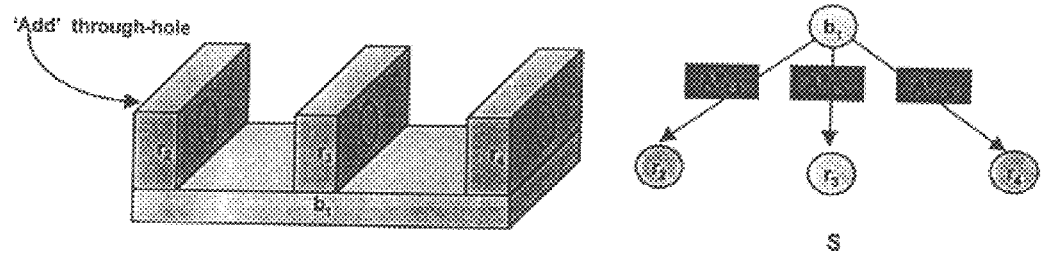
FIGS. 44A and 44B illustrates a design and its Shape Modeling Graph S, illustrated both with and without relevant geometry links $G^o$ and $G^p$, to illustrate the usefulness of the geometry links in the event a through-hole is extended through all of elements $r_1$, $r_2$ and $r_3$.
Figure 44B:
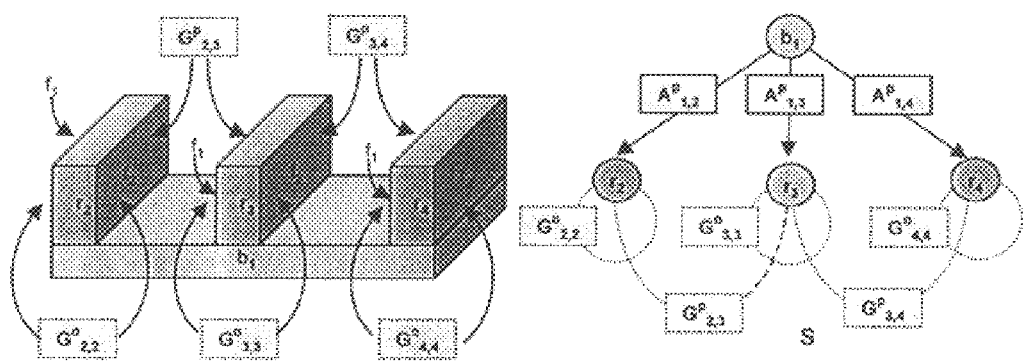

To summarize, the G link is a specific type of geometric construct that focuses on identifying a specific relationship between $s_i.f_p$ and $s_i.f_q$ ($p \neq q$) (i.e., between different faces on the same element) or between $s_i.f_p$ and $s_j.f_q$ ($i \neq j$) (i.e., between different faces on different elements). The G link is provided because it is found that relevant relationships, e.g., opposing faces on the same element or parallel faces on different elements, often have practical significance in real-world designs. As another example, consider the design shown in FIG. 44A, wherein it is desired that a cylindrical through-hole pass through $r_2$, $r_3$ and $r_4$ at the location shown. Upon addition of the through-hole to $r_2.f_1$, $G°_{2,2}$ can be used to determine the next face ($r_2.f_2$) that the hole intersects. Next, the geometry link $G^P_{2,3}$ may be used to determine the face of $r_3$ ($r_3$. $f_1$) on which the hole continues, and so on. Thus, the presence of G links allows the rapid computation of necessary intersections for the addition of a through-hole by restricting the faces for which intersection calculations must be performed.

Implementation of VDSF

As previously noted, VDSF is presently implemented in a three-dimensional VE (i.e., it is a VR-CAD system), though it could be implemented in a 2D system as well. Hand motion input is implemented through the Fifth Glove™ glove and the Ascension Technology Corporation Flock of Birds™ six degrees of freedom tracking devices with the Xtensory Xvs-SyncLink™ library. However, VDSF may use a wide variety of alternative or additional motion input systems. Six degree of freedom (6DOF) motion input devices may be generally categorized as tracking devices, point input devices, and glove-type devices. Tracking devices, which may operate based on mechanical, ultrasonic and magnetic optical principles, are used in tracking the user's hand and or head motion and orientation. Point input devices include the 6DOF mouse and the force ball. A 6DOF mouse, e.g., the Flying Mouse™ from Logitech, functions like a normal mouse on the desktop, but as a six-degree-of-freedom device, it allows the user to provide height input once the mouse is lifted from the desktop. A force ball, e.g., the Spaceball™ from Spaceball. Technology, Inc., uses mechanical strain experienced by a gripped ball to measure the forces and torques that the user applies in each of the possible directions. Glove-type devices, e.g., the Cyber-Glove™ from Virtual Technologies, Inc., consist of a wired cloth that is worn over the hand like a normal glove. Fiber-optical, electrical, or resistive sensors are used to measure the positions of the joints in the finger so that gesture input may be obtained.

Voice command input has been implemented using the Command Corp, Inc. In-Cubed™ voice recognition system. Other systems having suitable voice recognition capabilities, e.g., Voice Assist from Soundblaster and Dragon Dictate from Dragon Systems, Inc., could also be useful in the present invention.

Three-dimensional visual design output is provided to each user via a pair of Stereographics Crystal Eyes™ LCD shutter glasses. The rendered design is shown on a 60-inch inclined screen (intended to emulate a drafting table) upon which stereoscopic images are projected via a stereo-capable video projector. Rather than using this mode of display, VDSF could instead use a head-mounted display (HMD) wherein two display screens show independent views for each eye, thereby creating a stereoscopic image. Examples of HMDs are Virtual-I/O I-Glasses™ and MRG2™ from Liquid Image Corporation, VR4™ from Virtual Research Systems, and General Realities Cyber Eyes™. However, the use of shutter glasses and screen-displayed stereo images is preferred because this more conveniently accommodates simultaneous use by multiple users.

Auditory output (when used) is provided by the Soundblaster™ AWE-32 sound card. It is possible to provide more complex auditory output wherein sounds appear to come from different locations in the VE; such a system is provided by Alphatron™ from Crystal River Engineering.

Tactile output can be accommodated by VDSF, but has not been found to be particularly useful when provided by the common tactile output devices found on the market in 1999. Tactile feedback allows a user to touch and feel the resistance of objects in the VE by applying electrical signals or vibrations to different points on the user's hand, by inflating bladders installed within a glove or similar device, or by using mechanical devices to exert force on the user. Examples of these systems are the Cybertouch™ tactile feedback system from Virtual Technologies, Inc., and the Sensible Devices, Inc. Phantom™ and Exos, Inc. Safire™ force-reflecting interfaces.

Visual output is implemented through the Open-GL™ library on the Silicon Graphics™ Indigo (SGI) workstation, which is networked to a Pentium Pro™ 200MHz personal computer. For graphics/display, VDSF uses WorldToofKit™ (WTK), which is a library of "C" or "C++" functions that allows interfacing with a wide range of input and output. The geometric modeling and interaction functions have been implemented utilizing WTK. The entire system is interfaced to the ProEngineer™ CAD system to allow further modification of VDSF designs, although other CAD systems could be used instead.

Figure 45:
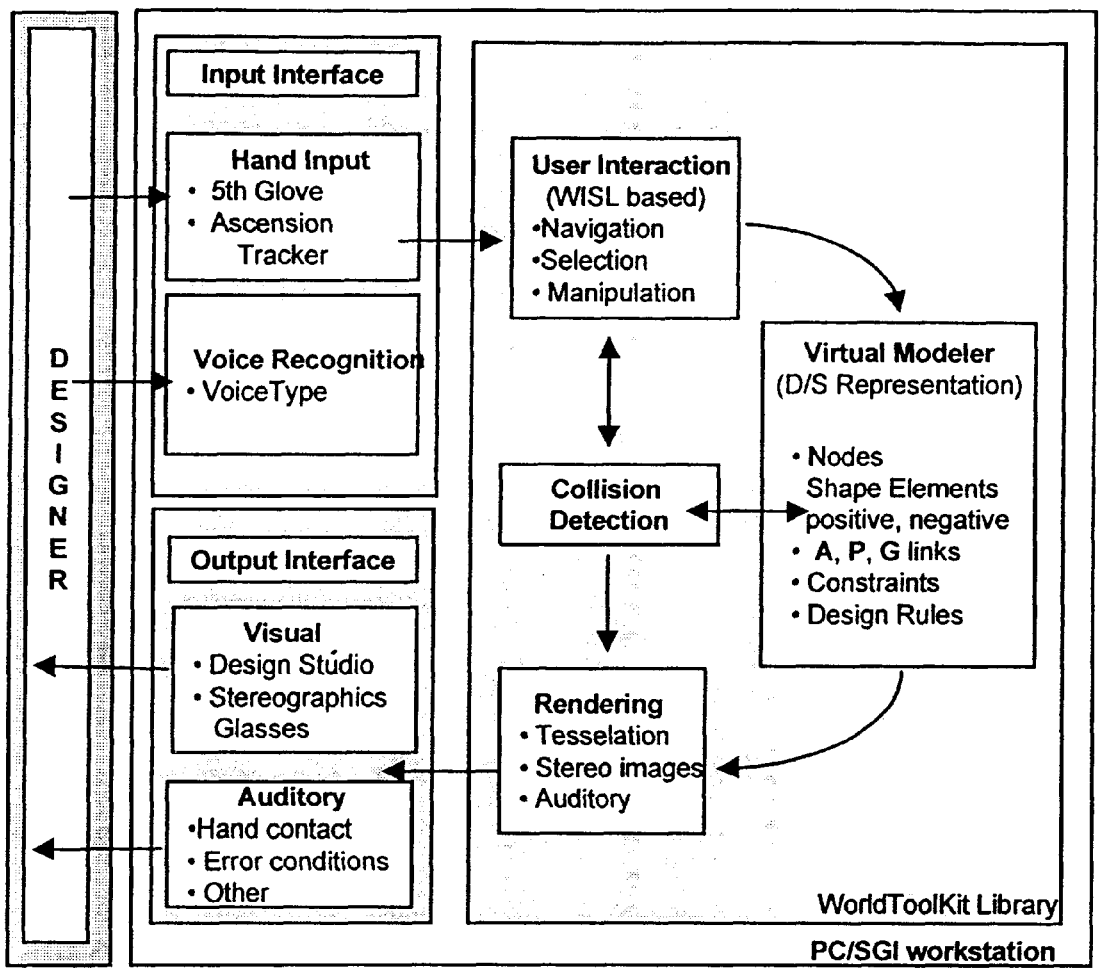
FIG. 45 illustrates the current architecture of VDSF.

Further VDSF hardware and software details are provided in TABLE 2. The architecture of the prototypical system and its hardware and software components are shown in FIG. 45.

TABLE 2

VDSF HARDWARE AND SOFTWARE

| Hardware | Software |
| --- | --- |
| Design Studio: | Modules: |
| Electrohome Protector | Modeling |
| Custom Frame (with mirror, screen, etc.) | Interaction |
| Pentium ™ Pro PC: | Libraries: |
| Ascension ™ trackers and emitter | WorldToolKit ™ (Sense8 Corp.) |
| Pair of 5th ™ Gloves | Microsoft Visual C++ ™ |
| Crystal Eyes ™ LCD glasses and emitter | IBM Voice Type ™ |

The current functionality of VDSF is summarized in TABLE 3.

TABLE 3

SUMMARY OF VDSF FUNCTIONALITY

| Operation | Commands (via WISL interface) |
| --- | --- |
| Interaction | Functions for any activity that excludes shape editing |
| Navigation | Allows viewing the desired location on the design. Three modes:<br>(i) Flying: follow 3D locator.<br>(ii) Zoom In/Out: zoom in or out in current viewing direction<br>(iii) Rotate viewpoint: rotate the viewpoint continuously |
| Selection | Selection allows entities in the model to be selected. Two modes:-<br>(i) Use 3D locator and issue spoken "Select" command<br>(ii) Use spoken command to step through all entities until the desired entity is highlighted |
| Manipulation | Allows grasping and manipulation of design to get the desired view<br>(i) Designer uses hand input and tracker to grab and rotate design |
| Modeling | Functions for shape editing |
| Create | Pre-defined entities: block, rib, cylinder, cone, wedge, etc. (Positive or negative entities) |
| Add feature | Hand input to indicate location, and spoken commands (e.g., "Block") to instance the shape to be added to that location |
| Remove Feature | Select entity and issue "remove" spoken command |
| Delete Feature | Select entity and issue "delete" spoken command (different from "remove," which detaches a feature but does not delete it from the model) |
| Edit Shape | Change parameters |
| | Scale (rubber-band-ing) — Via spoken commands such as "Increase *" (where * is a parameter for the element in question, such as "length", "width", "height" for block element) |
| Edit Location | Trans-late — Interactive sizing using 3D hand input or spoken command (e.g., "Scale") until desired size is reached |
| | Rotate — (i) Change x, y, z location via spoken command<br>(ii) Constrained translation (via hand input) |
| | Align — Grab and rotate entity |

EXAMPLES OF DESIGNS CREATED USING VDSF

Some examples of shapes modeled by VDSF are shown in FIGS. 32 through 53 to illustrate the effects of VDSF's dual graph representation:

Example 1

Figure 46:
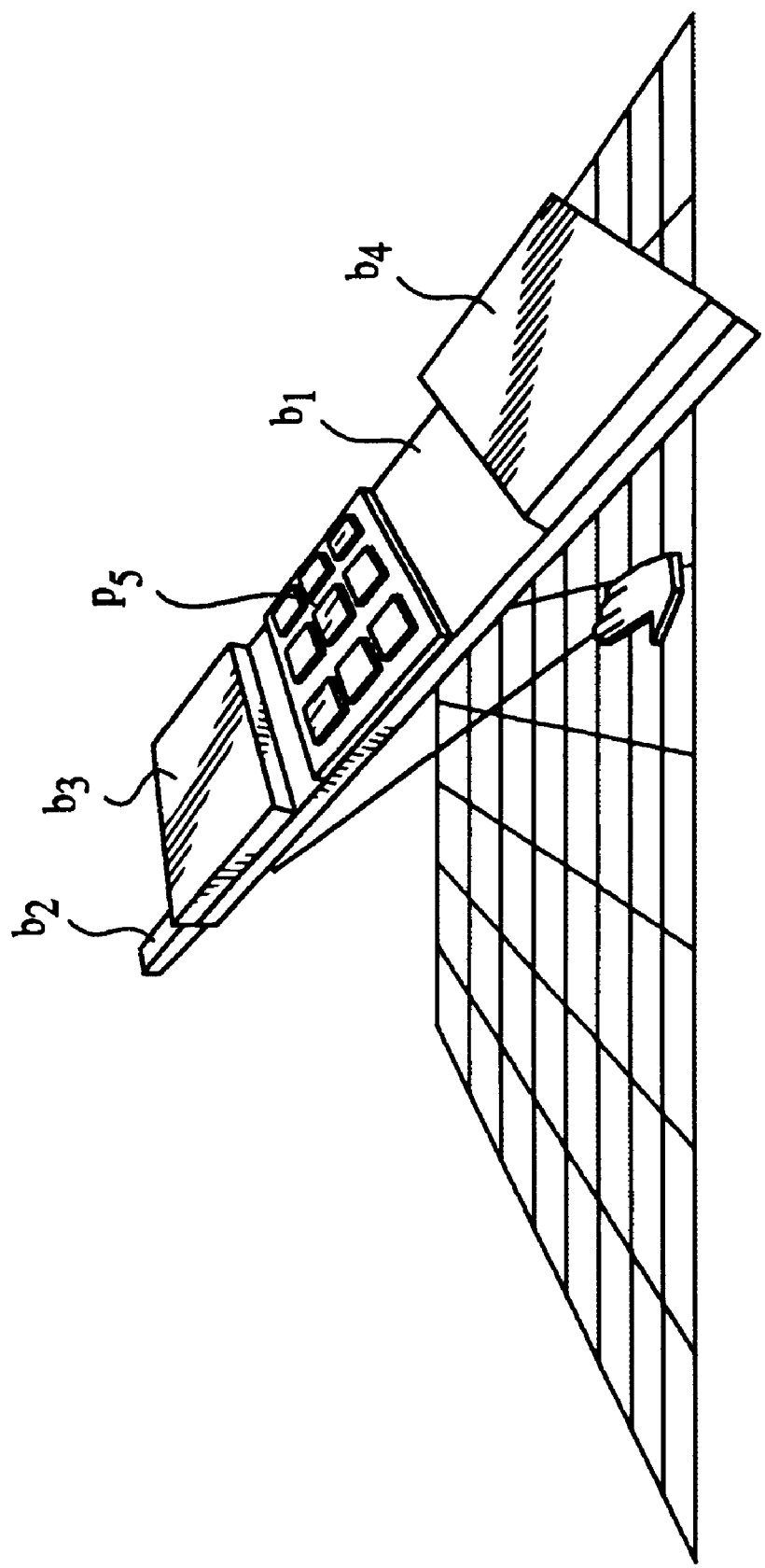
FIG. 46 illustrates a design of a telephone created in VDSF.
Figure 47:
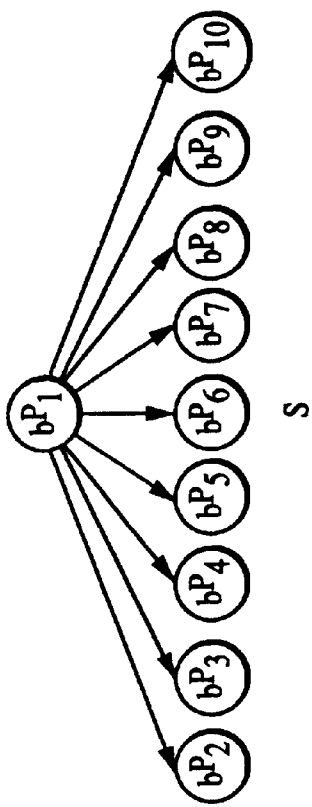
FIG. 47 illustrates the Design Intent Graph D and Shape Modeling Graph S for the button pad $p_5$ (and its nine connected buttons) in the telephone design of FIG. 46.
Figure 47:
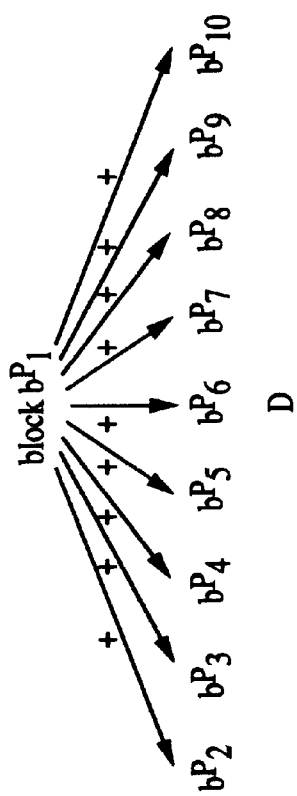
Figure 48:
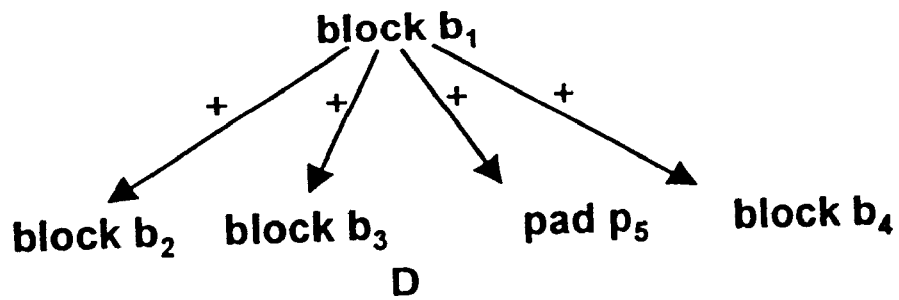
FIG. 48 illustrates the Design Intent Graph D for the telephone design of FIG. 46 (the buttons of pad $p_5$ not being explicitly shown).
Figure 49:
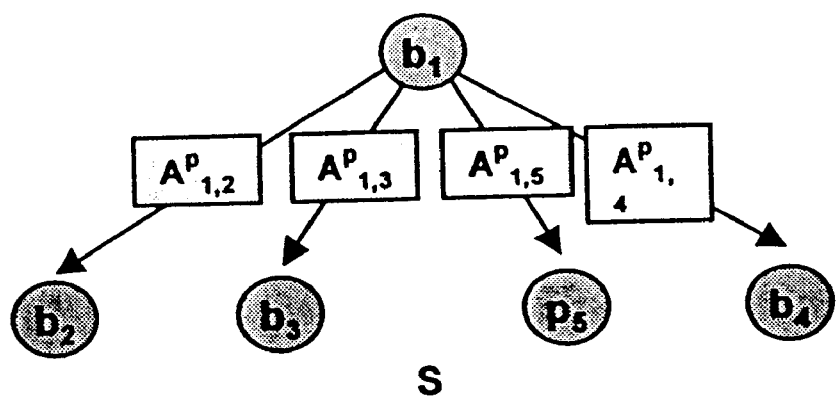
FIG. 49 illustrates the Shape Modeling Graph S for the telephone design of FIG. 46 (the buttons of pad $p_5$ not being explicitly shown), with only attachment links A being shown.
Figure 50:
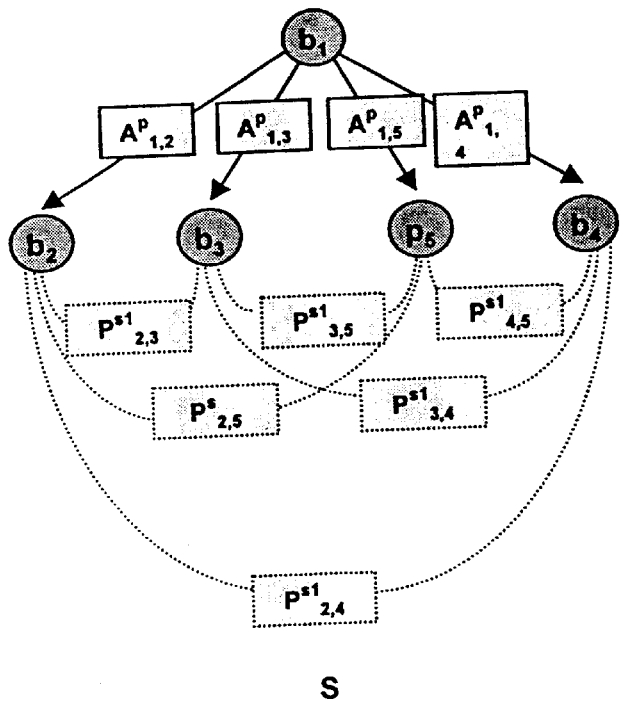
FIG. 50 illustrates the Shape Modeling Graph S for the telephone design of FIG. 46 (the buttons of pad $p_5$ not being explicitly shown), with attachment links A and proximity links P being shown.
Figure 51:
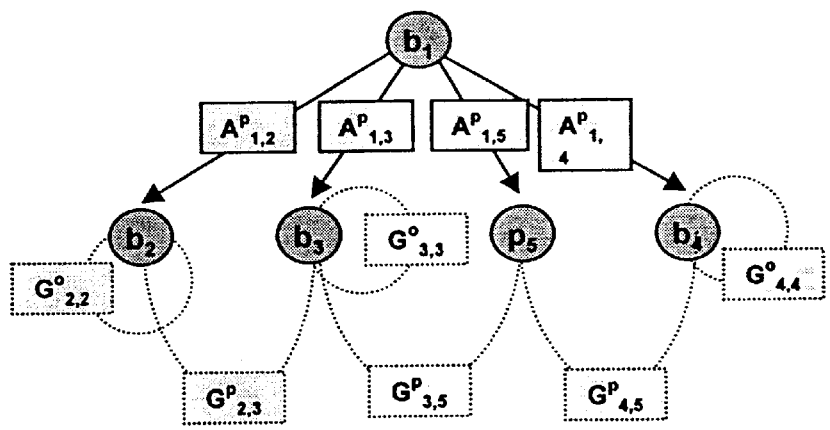
FIG. 51 illustrates the Shape Modeling Graph S for the telephone design of FIG. 46 (the buttons of pad $p_5$ not being explicitly shown), with attachment links A and geometry links G being shown.

The object in FIG. 46 shows a simplified shape of a telephone component designed in VDSF. It consists of four block elements ($b_1$, $b_2$, $b_3$, and $b_4$) and an element $p_5$ that represents the numeric pad (composed of a base and several blocks representing buttons, these elements being denoted with a superscript "p"). The D and S for the pad $p_5$ are shown in FIG. 47, and the D and S for the overall phone model (wherein $p_5$ is considered as a single component) are shown in FIG. 48. Block $b_1$ is the base (parent) to which the other components—antenna ($b_2$), earpiece ($b_3$), mouthpiece ($b_4$) and buttons ($p_5$)—are attached. FIG. 48 shows D for the model in FIG. 46; FIG. 49 shows S (with only the A links illustrated); and FIGS. 50 and 51 respectively show the P and G links in S.

Example 2

Figure 52A:
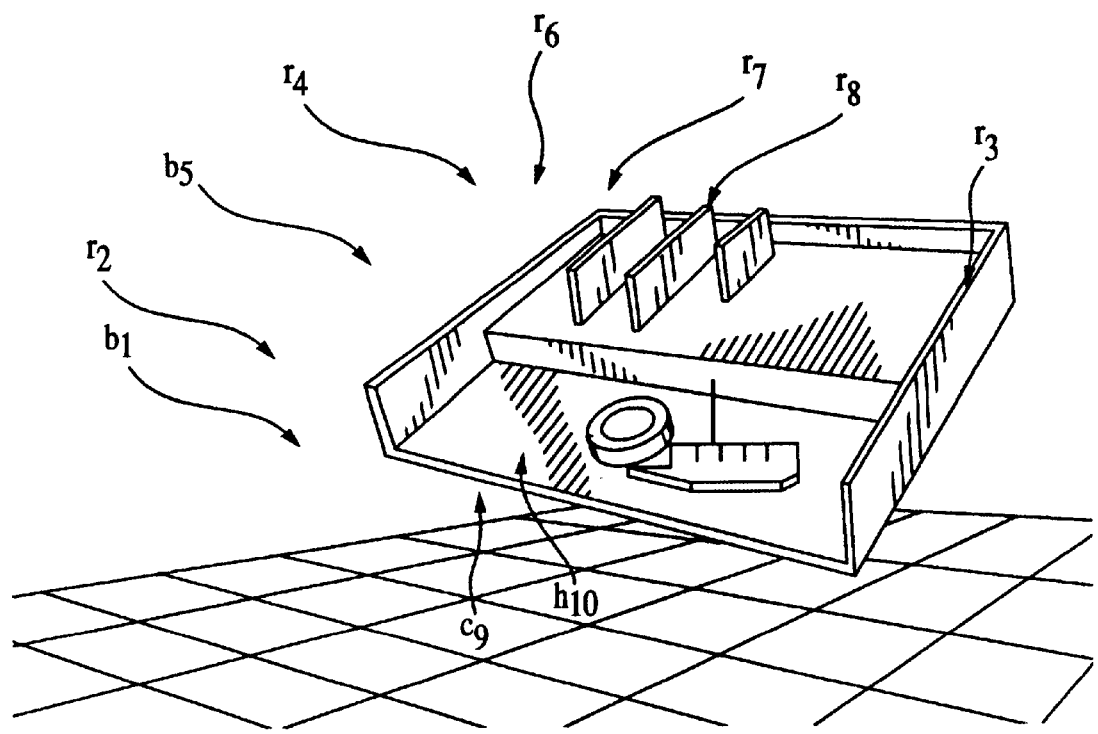
FIGS. 52A–52C illustrate an exemplary design created in VDSF in conjunction with its Design Intent and Shape Modeling Graphs D and S (only attachment links A being shown in the S graph).
Figure 52B:
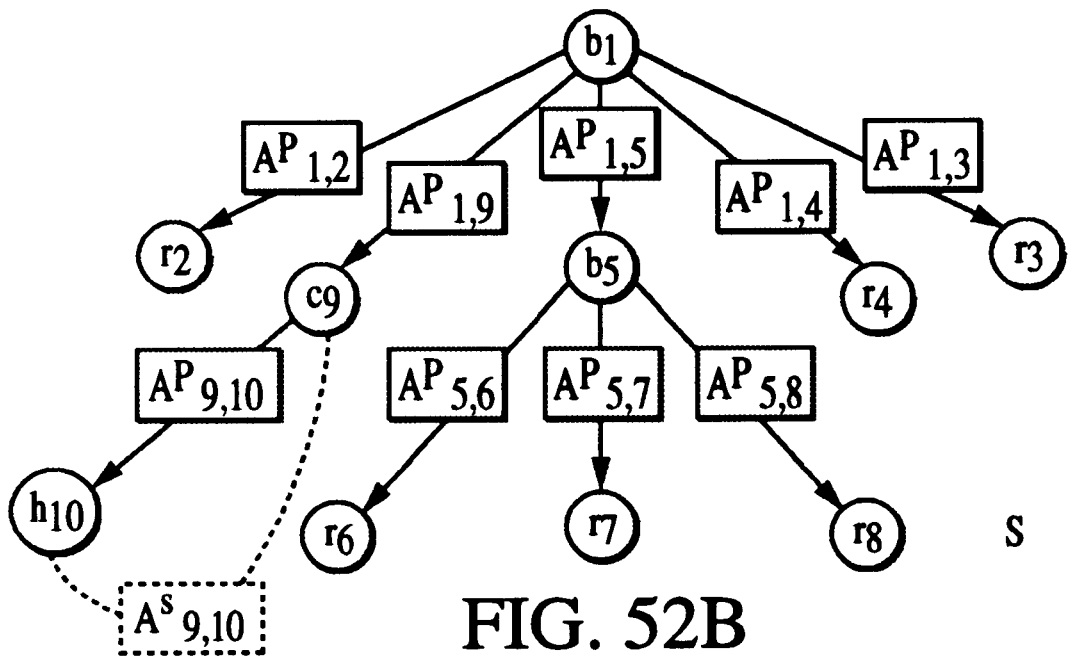
Figure 52C:
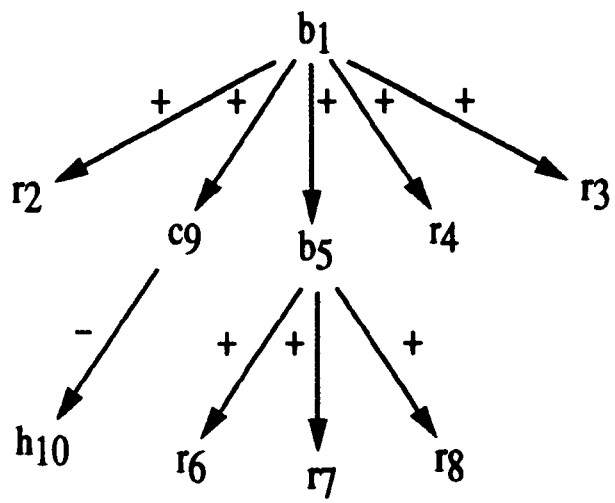

FIG. 52A illustrates an injection-molded part (Part I) designed in VDSF. The corresponding D and S are shown in FIGS. 52B and C respectively (note that P and G links are not shown for sake of clarity).

Example 3

Figure 53A:
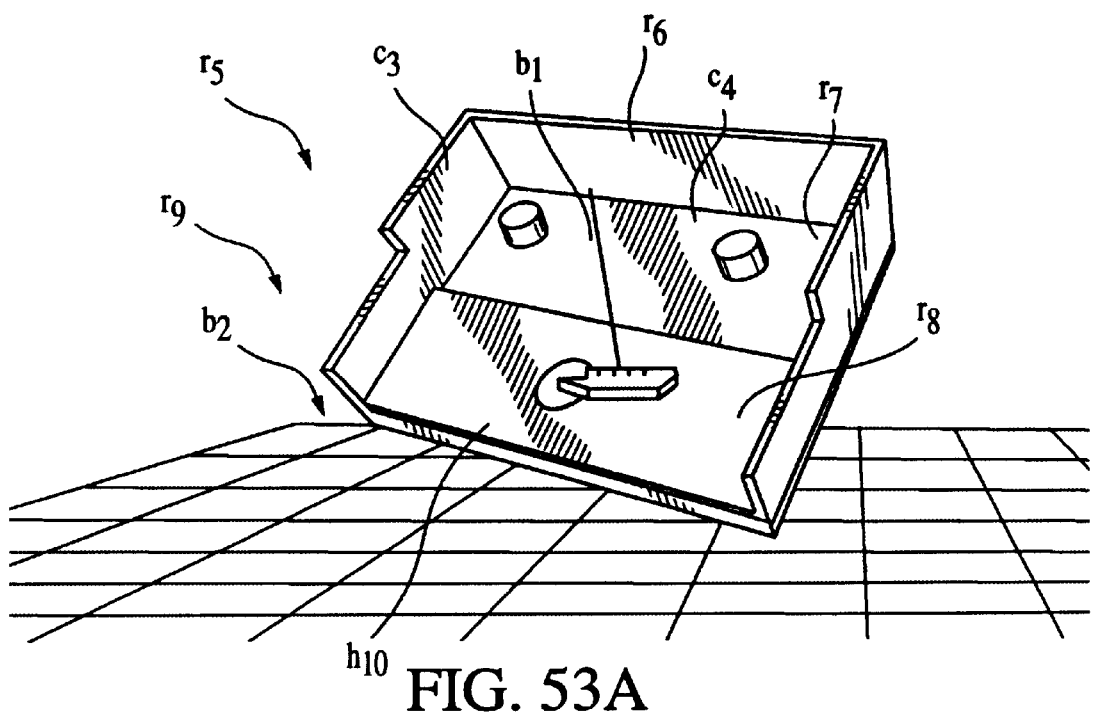
FIGS. 53A–53C illustrate another exemplary design created in VDSF in conjunction with its Design Intent and Shape Modeling Graphs D and S (only attachment links A being shown in the S graph).
Figure 53B:
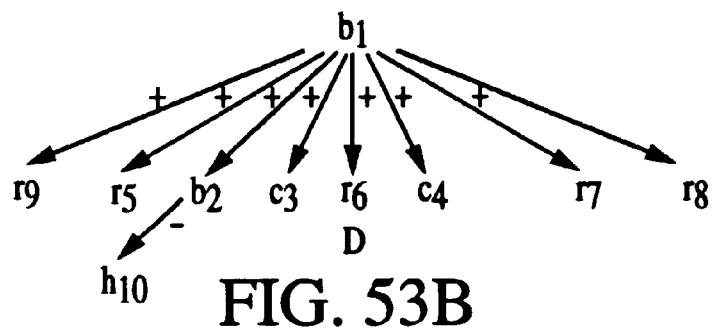
Figure 53C:
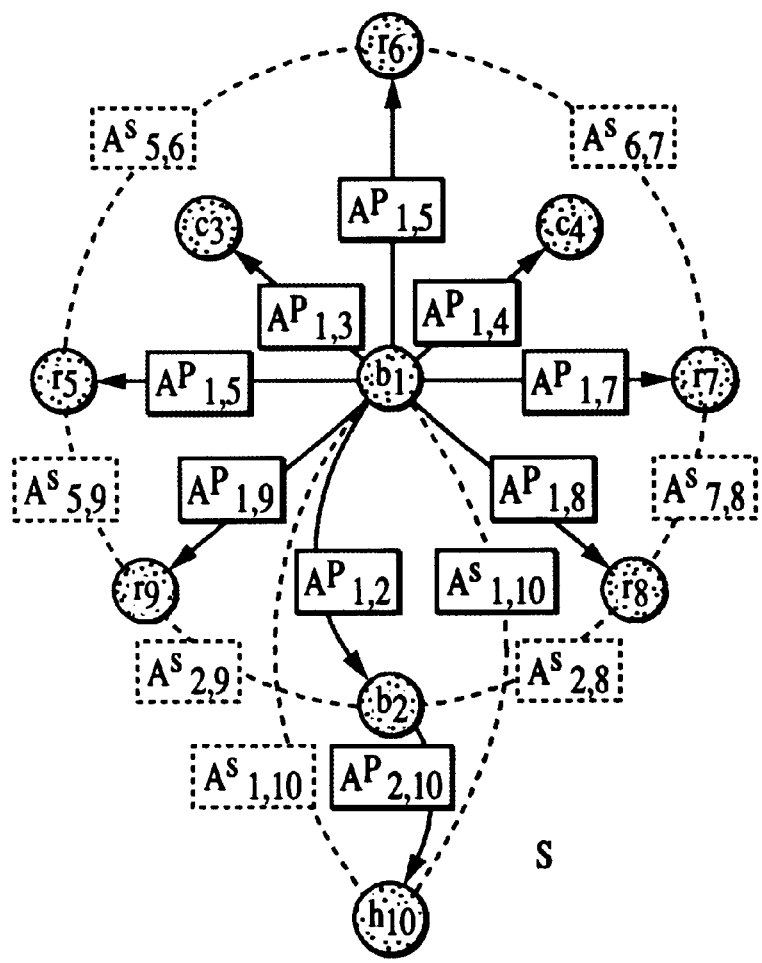

FIG. 53A illustrates another injection-molded part (Part II) designed in VDSF. The corresponding D and S are shown in FIGS. 53B and C respectively (again note that P and G links are not shown for sake of clarity).

Example 4

Figure 54A:
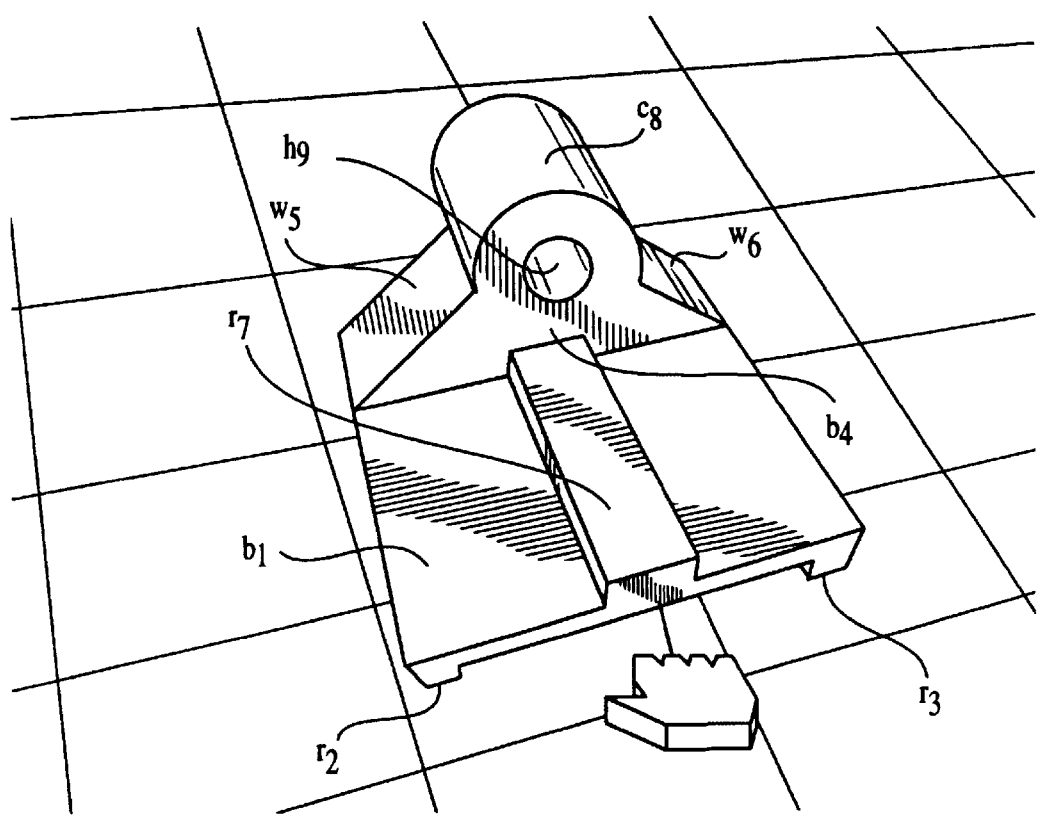
FIGS. 54A–54C illustrate another exemplary design created in VDSF in conjunction with its Design Intent and Shape Modeling Graphs D and S (only attachment links A being shown in the S graph).
Figure 54B:
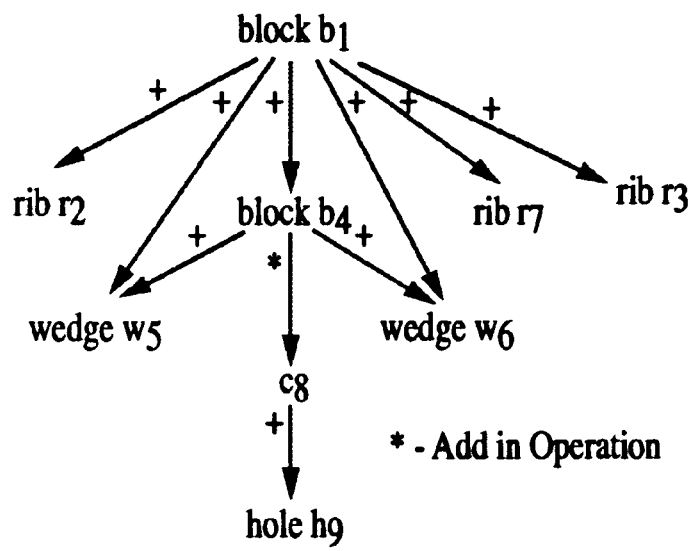
Figure 54C:
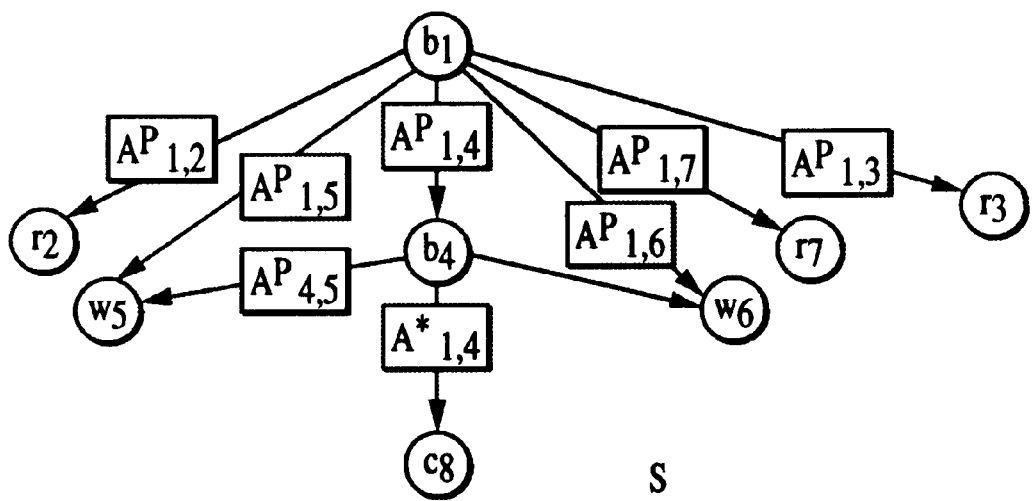

FIGS. 54A–54C illustrates a machined part constructed in VDSF and its corresponding D and S (with only the relevant links in S being shown). FIGS. 54A–54C illustrates the use of a special function added to VDSF which might be called the "Add In" operation (as opposed to the "Add On" operation) in that it allows insertion of one element into another (in this case $c_8$ into $b_4$).

Example 5

Figure 55A:
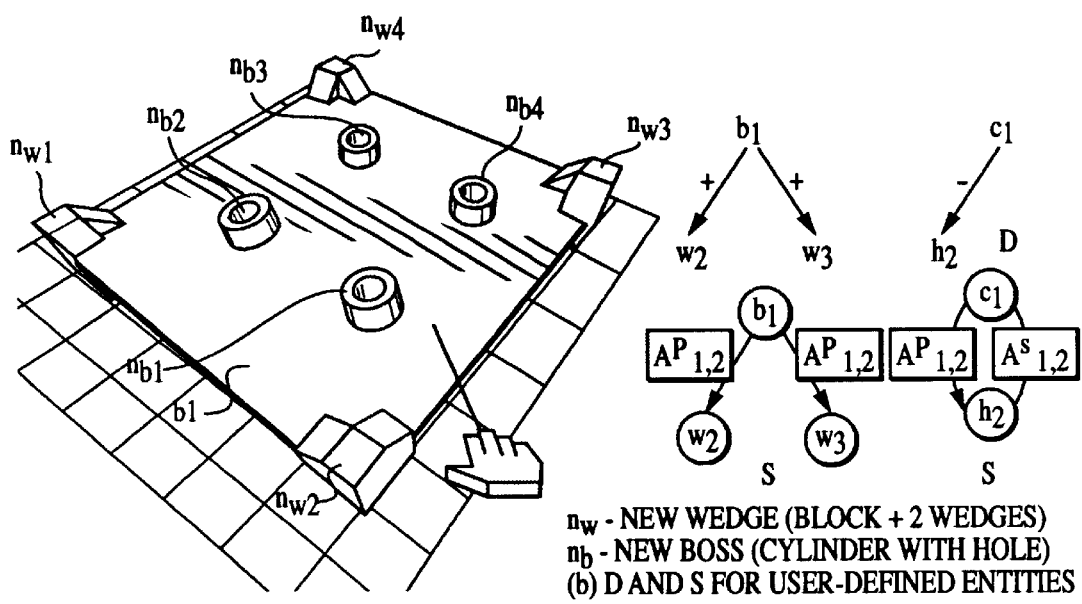
FIGS. 55A–55C illustrate another exemplary design created in VDSF in conjunction with Design Intent and Shape Modeling Graphs D and S for certain of its subcomponents (only attachment links A being shown in the S graph).
Figure 55B:
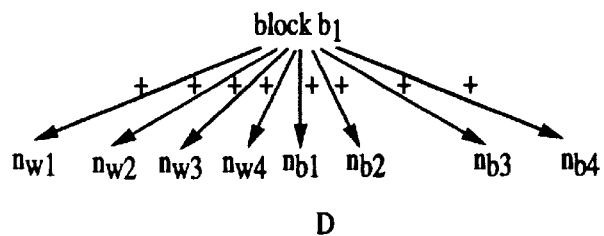
Figure 55C:
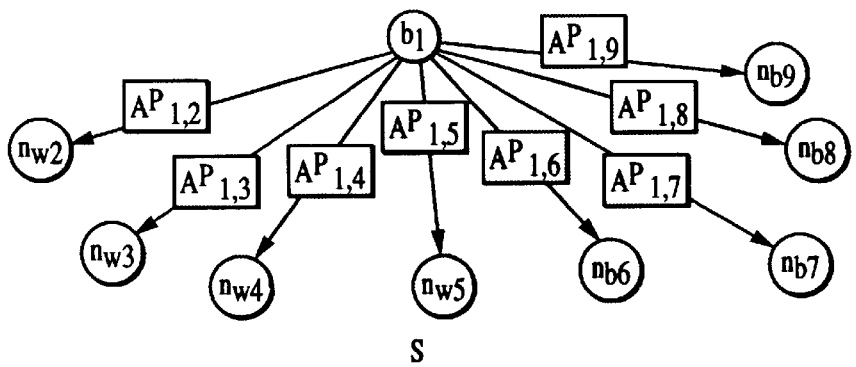

FIGS. 55A–55C illustrate another machined part constructed in VDSF and its corresponding D and S. Again, only the relevant links in S are shown.

Example 6

Figure 56A:
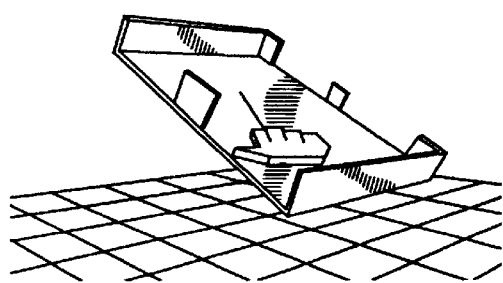
FIGS. 56A–56B illustrate construction of another exemplary design created in VDSF.
Figure 56B:
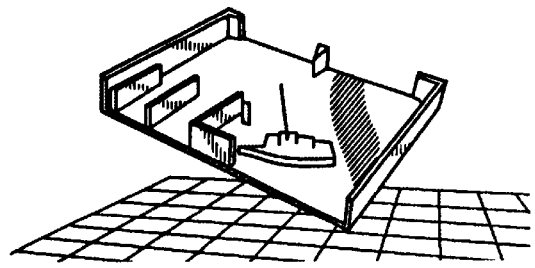
Figure 57:
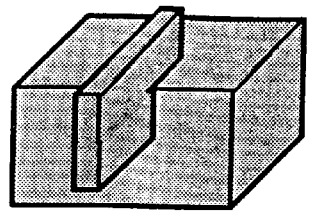
FIG. 57 illustrates a hypothetical design that a user wishes to create.

FIGS. 56A and 56B illustrate the successive stages of construction of an injection-molded part (Part V) in VDSF; D and S are not shown.

Operating Characteristics of VDSF

To review, the notion behind use of the dual D- and abased representation is to maintain a clear separation between design intent and geometry for fast display. D provides a higher-level hierarchical representation suitable for storing design intent, whereas S is a more detailed representation which preserves this hierarchy and in addition uses a variety of links (i.e., attachment A, proximity P and geometry G) to enable high-speed interactive editing. A representation scheme such as the one used by VDSF can be evaluated for several characteristics (see, e.g., M. Mantyla, "An Introduction to Solid Modeling," Computer Science Press):

1. Expressive power: The types of shapes that can be modeled with S include most manufacturable mechanical shapes, e.g., those that are commonly found in injection molding, casting, forging, and machining.

2. Validity: The designer creates a shape by adding elements (positive or negative) via the "Add On" operation. The constraints on this operation prevent the generation of an invalid model, and the resultant S must always represent a valid model.

3. Unambiguity and uniqueness: S is not unique since more than one S can represent a given geometrical shape (examples of which were given earlier).

TABLE 4

COMPARISON OF CHARACTERISTICS OF D AND S GRAPHS

| Graph | Nodes | Links | Purpose |
|---|---|---|---|
| D Design Intent Graph | Shape Elements Contain: Element shape, parameters, etc. Element Type (+/−) Transformations Faceted rep. Bounding boxes | Hierarchical (parent-child hierarchy) Design rules | Capture design intent/history Allow rapid display and interaction with design (restricted to positive shapes) Support limited non-geometric operations |
| S Shape Modeling Graph | Shape Elements Contain: Element faces, edges, etc. Transformations Boundary representation Convex hulls | Hierarchical (based on D) Types of links: Attachment (Primary & Secondary) Proximity (Soft & Hard) Geometry (Various types) | Localize boundary representations Represent holes and negative entities Enable dimension changes, restricted Boolean type modeling operations Faster, more accurate intersection checks |

Complexity of Operations in S

For complexity analysis, the following quantities are assumed:

| | |
|---|---|
| N = | Number of shape elements in S. |
| M = | Average number of faces in each element $s_i$. |
| E = | Average number of edges in each element $s_i$, assumed = O(M). |
| V = | Average number of faces in each element $s_i$, assumed = O(M). |
| O(1) = | Constant time operation. |

It is known from previous work that an intersection determination between the convex hulls $h_i$ and $h_j$ of $s_i$ and $s_j$ can be performed in $O(n^i + n_j) = O(M)$ (where $n_i$ and $n_j$ are the number of vertices in the linearized model of $s_i$ and $s_j$ respectively). (See, e.g., D. Dobbin and D. G. Kirpatrick, "A Linear Algorithm for Determining the Separation of Convex Hull Polyhedra," *Journal of Algorithms*, vol. 6, pp.381–392.) Such convex hull intersection checks are used in the P link computation previously discussed.

The fundamental operations in D and S are Add Entity, Edit Entity and Delete Entity, which have the following complexity (the results for the following complexity analysis being summarized in TABLE 5, it being noted that some results for D were already reported in TABLE 1):

Add Entity

Update D

| | |
|---|---|
| 1) Add a link (or links) with negative/positive: | [O(1)] |
| 2) Add links for design rules: | [O(N)] |

Update S

| | |
|---|---|
| 1) Add link (or links) that map D to S | |
| $A^P$ link | [O(1)] |
| $A^S$ link (if negative entity) | [O(N)] |
| 2) Compute auxiliary links | |
| $P^S$ links (with convex hull) | [O(NM)] |

Add Entity -continued

| | |
|---|---|
| $P^6$ links (if exact) | [O(NM²)] |
| $P^h$ links | [O(N)] |
| Sort P links | [O(NlogN)] |
| Categorize P links (into Category 1, 2, 3) | [N] |
| $G^o$ links | [O(1)] |
| $G^P$ links | [O(NM²)] |
| 2) Triangulation | |
| Faces with hole | [O(M²logM)] |
| Faces without hole | [O(1)] |

Thus, for element addition, the best case performance is O(NM) and worst case O(NM²). It is noted that a typical solid modeler is O(NM²)). However, from the above description, it is seen that the principal reason for the O(NM²) term comes from the $G^P$ links and $P^s$ (with exact computation). This computation can potentially be reduced by using heuristics based on the knowledge of the entity type.

Edit Entity

An editing operation could be of two types: edit location and edit size. In both cases, the computational requirements are similar and are discussed below.

Update D

| | |
|---|---|
| 1) Update parameter values | [O(1)) |

Update S

| | |
|---|---|
| 1) Check Proximity Category 1 distance | [O(N)] |
| If intersection occurs: | |
| Best case (two entities intersect) | [O(M²)] |
| Worst case (all entities intersect) | [O(NM²)] |
| 2) Repeat 1) for Category 2 and 3 if time is available | [Same as above] |
| 3) Update P's | |
| Calculate minimum distances | |
| with convex hull based | [O(NM)] |
| with exact | [O(NM²)] |
| Categorize and sort P | [O(NlogN)] |
| 4) Triangulation | |
| no holes | [O(1)] |
| with holes | [O(M²logM)] |

Thus, while editing, best case performance is O(1) (if no intersection), and worst case is O(NM²) (similar to a solid modeler). On average, computations will lie in between these two extreme cases.

Note that in general, addition of an entity is more computationally expensive than editing an entity. This is in consonance with the philosophy of pre-calculating several properties to allow faster editing later.

Delete Entity

Update D

| | |
|---|---|
| 1) Delete entity from D | [O(1)] |

Update S

| | |
|---|---|
| 1) Remove $A^P$ and $A^s$ | [O(N)] |
| 2) Remove P links | [O(N)] |
| 3) Update resultant P links | [O(NlogN)] |
| 4) Remove G links | [O(N)] |
| 5) Delete children recursively | [O(NlogN)] |

TABLE 5

RESULTS OF COMPLEXITY ANALYSIS

| Function | Update D | | Update S | |
| --- | --- | --- | --- | --- |
| Operation | Best | Worst | Best | Worst |
| Add | O(1) | O(N) | O(NM) | O(NM$^2$) |
| Edit | O(1) | O(1) | O(1) | O(NM$^2$) |
| Delete | O(1) | O(N) | O(NlogN) | O(NlogN) |

Cross-compatibility With Other CAD Systems

VDSF was designed as a stand-alone system whereby prototype models could be rapidly designed in a VR-CAD environment, with the intent that the designed models could then be easily transferred to any number of conventional CAD systems for detailed design (i.e., finalization). One approach used by VDSF is to use the ProDevelop™ API (Application Programming Interface) in the ProEngineer CAD environment to asynchronously create a parallel representation of VDSF's VR-CAD model in the conventional CAD environment. Once the design is completed in VDSF, the parallel CAD model can be used for further detailed design in a conventional CAD system. A second approach is to have VDSF output a data file in a format suitable for reading by the desired commercial CAD system. The designs created by use of VDSF are therefore usable in all major and well-known commercial CAD systems.

Other Options/Modifications

Within the preferred version of the invention described above (VDSF), the Virtual Modeler Layer implements the dual graph representation, and the user creates designs in a VE environment by use of voice and motion input via the Interaction Mechanisms Layer. However, it is noted that the advantages of the dual graph representation may be realized in conventional 2D-CAD systems as well as in VR-CAD systems utilizing a VE. The interactivity advantages of the dual graph representation will probably find their greatest value in VE applications owing to the time-sensitive nature of these systems, but these advantages are nevertheless still useful in 2D applications.

Figure 58A:
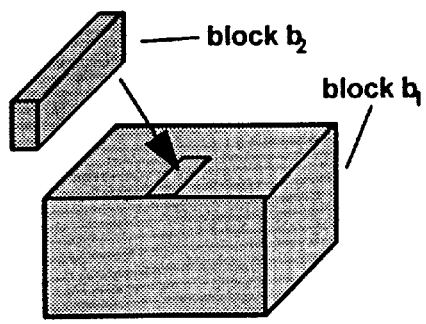
FIGS. 58A and 58B illustrate creation of the design of FIG. 40A by use of solely "Add On" operations, whereby surface attachment of elements is used to attain the final model.
Figure 58B:
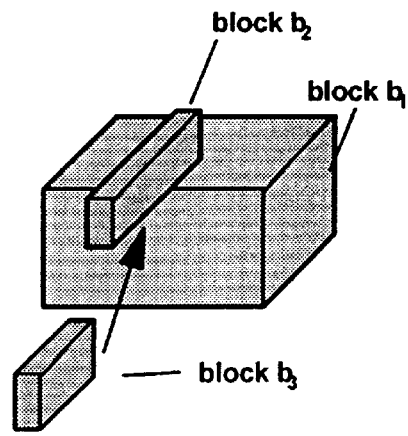
Figures 59A, 59B, 59C:
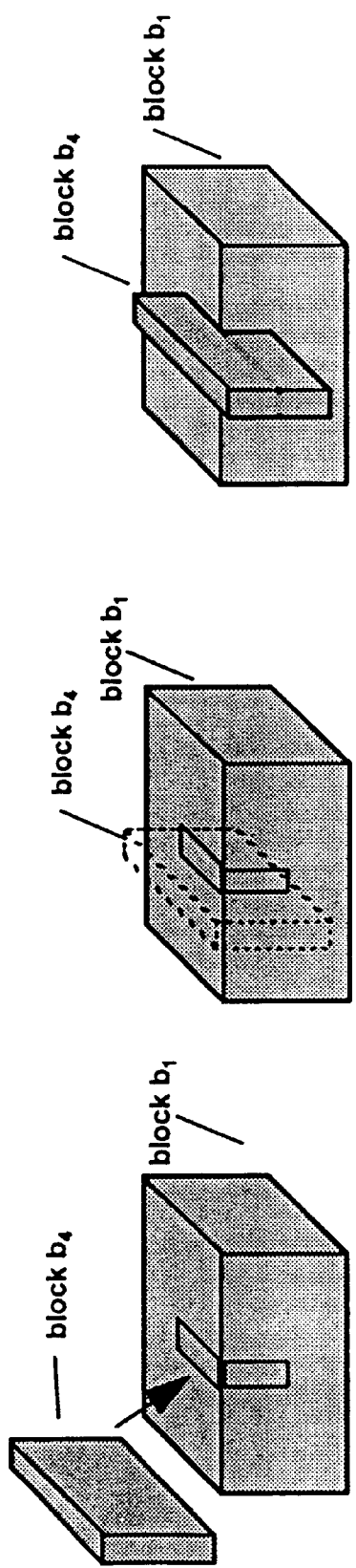
FIGS. 59A–59C illustrate creation of the design of FIG. 40A by use of an "Add In" operation provided in alternative embodiments of the invention, whereby direct insertion of one element into another is used to attain the final model.

While it was previously noted that certain constraints are provided to allow faster design—e.g., the constraint that addition of elements will situate them in face-to-face abutment—it should be understood that these constraints are not strictly necessary, and other (or no) constraints might be used. For example, consider the shape in FIG. 40A. Creating this shape via the "Add On" method would require the designer to create two block elements $b_2$ and $b_3$ and then "add" them to $b_1$ (FIGS. 58A and B). An easier way to create this shape is to add a block $b_4$ directly to $b_1$ as shown in FIGS. 59A, 59B and 59C via the "Add In" operation (i.e., the aforementioned constraint could be relaxed to allow intersection/insertion of elements rather than only abutment of elements). Depending on the specific geometry to be created, the "Add In" mode might allow faster creation as compared to the "Add On" mode. In other words, depending on the context of the design effort, different constraints may be appropriate.

Figure 9C:
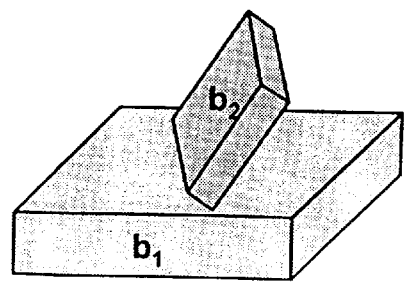

As another example of effects that can be attained when constraints are relaxed or eliminated, consider that VDSF could eliminate the requirement for face-to-face element attachment (i.e., face-to-edge contact as in FIG. 9C, or face-to-vertex contact, could be allowed). If this was done, the complexity of the dual graph representation would likely need to increase in order for it to support the newly-available design possibilities; for example, attachment links would need to be added for element edges and/or vertices as well as for element faces. Additionally, some operations currently supported by D and S may grow in complexity to such an extent that they may no longer be feasible; for example, the calculation of orthogonal bounding boxes may be too burdensome to support the desired degree of interactivity. The implicit design constraints noted earlier in this document are highly advantageous in that they support efficient use of the dual graph representation, but they are not necessarily required for its use.

What is claimed is:

1. A method of constructing a geometric model in a CAD system wherein time is measured in serial time steps, the geometric model being formed from two or more geometric elements in attached relationship, the method comprising:
 a. in a first time step,
  1. attaching a subject geometric element to one or more prior geometric elements already within the geometric model, the subject geometric element and the prior geometric elements to which it is attached thereby being in a parent-child relationship wherein
   (1) the subject geometric element constitutes a child element, and
   (2) the prior geometric elements to which it is attached constitute parent elements;
  2. outputting the geometric model after the subject geometric element is attached;
 b. in a later time step,
  (1) modifying the subject geometric element by moving or resizing it within the geometric model;
  (2) computing the boundary of the modified subject geometric element and any geometric elements constituting child elements with respect to the subject geometric element, without computing the boundary of any geometric elements constituting parent elements with respect to the subject geometric element; and
  (3) outputting the geometric model after the subject geometric element is modified.

2. The method of claim 1 wherein:
 a. the first time step includes:
  (1) storing the shape of the subject geometric element;
  (2) storing the location of the subject geometric element with respect to its parent elements, and
 b. wherein the later time step includes:
  (1) updating the stored shape of the subject geometric element;
  (2) updating the stored location of the subject geometric element with respect to its parent elements;
  (3) where the subject geometric element is resized, updating the location of any geometric elements constituting child elements with respect to the subject geometric element;
  (4) without altering the locations of the parent elements of the subject geometric element.

3. The method of claim 2 wherein the first time step includes identifying all parallel faces within the subject geometric element.

4. The method of claim 2 wherein the first time step includes identifying all parallel faces between the subject geometric element and each prior geometric element already within the geometric model.

5. The method of claim 1 further comprising the steps of:
 a. determining the distances between the subject geometric element and all elements of the geometric model which are neither parents nor children of the subject geometric element;

b. if any determined distance is less than a predefined amount, checking for intersection between the subject geometric element and the element of the geometric model which corresponds to the distance.

6. The method of claim 5 wherein the distances between the elements are determined between their convex hulls.

7. The method of claim 5 wherein the intersection check includes the step of determining whether there is intersection between the convex hulls of the subject geometric element and the element of the geometric model which corresponds to the determined distance.

8. The method of claim 5 wherein the intersection check includes the step of determining whether there is intersection between the boundary representations of the subject geometric element and the element of the geometric model which corresponds to the determined distance.

9. The method of claim 5 wherein the intersection check includes the steps of:

a. determining whether there is intersection between the convex hulls of the subject geometric element and the element of the geometric model which corresponds to the determined distance; and b. if intersection between the convex hulls is found, determining whether there is intersection between the boundary representations of the subject geometric element and the element of the geometric model which corresponds to the determined distance.

10. The method of claim 1 further comprising the steps of:

a. prior to modifying the subject geometric element, determining the distances between the subject geometric element and all elements of the geometric model which are neither parents nor children of the subject geometric element;

b. after modifying the subject geometric element, checking for intersection between the subject geometric element and some subset of the elements of the geometric model which are neither parents nor children of the subject geometric element.

11. The method of claim 10 further comprising the step of ranking all elements of the geometric model which are neither parents nor children of the subject geometric element by their proximity to the subject geometric element.

12. The method of claim 11 wherein the elements of the geometric model which are neither parents nor children of the subject geometric element are checked for intersection with the subject geometric element in the order of their proximity rank.

13. The method of claim 10 wherein the distances between the elements are determined between their convex hulls.

14. The method of claim 10 wherein the intersection check between the subject geometric element and the subset of the elements of the geometric model is performed by checking for intersection between the convex hulls of these elements.

15. The method of claim 14 wherein if intersection is detected between the subject geometric element and any other element, a. the boundaries of all geometric elements within the geometric model are computed, and b. at least some of the computed boundaries are checked for intersection between elements.

* * * * *